(12) United States Patent (10) Patent No.: US 7,554,587 B2
Shizukuishi (45) Date of Patent: Jun. 30, 2009

(54) COLOR SOLID-STATE IMAGE PICKUP DEVICE

(75) Inventor: Makoto Shizukuishi, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 943 days.

(21) Appl. No.: 10/796,148

(22) Filed: Mar. 10, 2004

(65) Prior Publication Data

US 2004/0178478 A1 Sep. 16, 2004

(30) Foreign Application Priority Data

Mar. 11, 2003 (JP) ............................. 2003-065617
Mar. 17, 2003 (JP) ............................. 2003-072102

(51) Int. Cl.
*H04N 3/14* (2006.01)
(52) U.S. Cl. ...................... 348/272; 348/273
(58) Field of Classification Search ......... 348/272–275, 348/278–280
See application file for complete search history.

(56) References Cited

U.S. PATENT DOCUMENTS

| | | | |
|---|---|---|---|
| 3,971,065 A | 7/1976 | Bayer | |
| 4,438,455 A | 3/1984 | Tabei | |
| 4,514,755 A * | 4/1985 | Tabei | ........................ 348/280 |
| 5,877,040 A * | 3/1999 | Park et al. | ..................... 438/70 |
| 5,965,875 A | 10/1999 | Merrill | |
| 6,236,434 B1 | 5/2001 | Yamada | |
| 6,535,249 B1 * | 3/2003 | Stavely | ....................... 348/340 |
| 6,924,167 B1 * | 8/2005 | Hopper et al. | ................. 438/57 |
| 7,129,466 B2 | 10/2006 | Iwasaki | |
| 7,132,724 B1 * | 11/2006 | Merrill | ....................... 257/440 |

(Continued)

FOREIGN PATENT DOCUMENTS

JP 1-134966 A 5/1989

(Continued)

OTHER PUBLICATIONS

"A Planar Silicon Photosensor with an Optimal Spectral Response for Detecting Printed Material" by Paul A. Gary and John G. Linvill; IEEE Transactions on Electron Devices; vol. ED-15, No. 1; pp. 30-39, Jan. 1968.

(Continued)

*Primary Examiner*—David L Ometz
*Assistant Examiner*—Luong T Nguyen
(74) *Attorney, Agent, or Firm*—Birch, Stewart, Kolasch & Birch, LLP

(57) ABSTRACT

A color solid-state image pickup device comprises a plurality of light-receiving sections being arranged on the surface of a semiconductor substrate; complementary color filters which are stacked on all or portions of the plurality of light-receiving sections, each complementary color filter blocking incident light of one color of the three primary colors, to thereby permit transmission of incident light of remaining two colors; at least first and second color signal detecting layers which have the complementary color filters stacked thereon and are formed so as to be separated in a depthwise direction of the light-receiving section, the first and second signal detecting layers detecting a respective color signal of the light of two colors having passed through the complementary color filters; and a signal reading unit for reading the respective color signals in a distinguished manner, the signal reading unit being connected to the respective color signal detecting layers.

28 Claims, 46 Drawing Sheets

U.S. PATENT DOCUMENTS 7,218,347 B2   5/2007   Shinohara

FOREIGN PATENT DOCUMENTS

| JP | 4-063473 A | 2/1992 |
|----|------------|--------|
| JP | 7-74340 A | 3/1995 |
| JP | 10-136391 A | 5/1998 |
| JP | 2003-298038 A | 10/2003 |
| JP | 2004-165242 A | 6/2004 |

OTHER PUBLICATIONS

"An 800K-Pixel Color CMOS Sensor for Consumer Still Cameras" by J.E.D. Hurwitz, et al.; SPIE vol. 3019; pp. 115-124.

"A Progressive Scan CCD Image Sensor for DSC Applications" by Tetsuo Yamada et al.; IEEE Journal of Solid-State Circuits; vol. 35, No. 12; Dec. 2000; pp. 2044-2054.

* cited by examiner

FIRST READING

SECOND READING

PRIMARY COLOR SIGNALS
READ BY FIRST READING
OPERATION

PRIMARY COLOR SIGNALS
READ BY SECOND READING
OPERATION

COLOR SOLID-STATE IMAGE PICKUP DEVICE

This Nonprovisional application claims priority under 35 U.S.C. § 119(a) on Patent Application No(s). 2003-065617 and 2003-072102 both filed in JAPAN on Mar. 11, 2003 and Mar. 17, 2003, the entire contents of which are hereby incorporated by reference.

BACKGROUND OF THE INVENTION

1. Field of the Invention

The present invention relates to a color solid-state image pickup device.

2. Description of the Related Art

In relation to a CCD (charge-coupled device) semiconductor solid-state image pickup element and a CMOS semiconductor solid-state image pickup element, as described in, e.g., U.S. Pat. No. 3,971,065, which will be described below, color filters having different spectral transmission factors are stacked on a plurality of photodiodes arranged in a two-dimensional array, thereby enabling pickup of a color image.

Two types of color filters are available: namely, red (R), green (G), and blue (B) color filters of a primary color system; and color filters of a complementary color system which permit passage of light of colors complementary to R, G, and B.

In the color filters of primary color system, for instance, a B filter primarily permits passage of only light having a short wavelength of 470 nm or less. Hence, a photodiode of a light-receiving section with the B filter stacked thereon has sensitivity to B incident light. However, the B filter blocks light having other wavelength components (e.g., G and R), and hence G and R wavelength components that have entered the B filter are not subjected to photoelectric conversion. Thus, color filters of this type suffer a problem of waste of G and R incident light rays and a failure in effective utilization thereof.

In contrast, in the case of the color filters of the complementary color system—spectral filters for permitting passage of light of wavelengths complementary to the primary color components R, G, and B—the color filters are constituted of a yellow (Ye) filter for permitting passage of G and R components complementary to B, a magenta (Mg) filter for permitting passage of B and R components complementary to G, and a cyan (Cy) filter for permitting passage of B and G color components complementary to R. Of the incident light, light wasted by the color filters of complementary color system becomes smaller in quantity than that wasted as a result of use of the color filters of the primary color system. Specifically, the solid-state image pickup device using the complementary color filters can utilize wavelengths of incident light over a wide range and hence has a characteristic of an increase in sensitivity. For this reason, a video movie camera (for photographing a moving image) which encounters difficulty in utilizing an auxiliary light source, such as a flash, frequently adopts a solid-state image pickup device using complementary color filters.

Meanwhile, in a solid-state image pickup device using color filters of a complementary color system, a signal output from a pixel with a Ye filter stacked thereon becomes a G+R signal; a signal output from a pixel with a Cy filter stacked thereon becomes a G+B signal; and a signal output from a pixel with a Mg filter stacked thereon becomes an R+B signal. Hence, after the G+R, G+B, and R+B signals have been read from the solid-state image pickup device, the signals must be subjected to a color signal separation computation processing performed by an external circuit, thereby extracting R, G, and B signal components.

Specifically, the solid-state image pickup device using the filters of a complementary color system require color signal, separation computation processing. Hence, when compared with a solid-state image pickup device using color filters of a primary color system capable of directly obtaining signals of R, G, and B color components, the solid-state image pickup device using the filters of complementary color system suffers a problem of deterioration of image quality in terms of color reproducibility and noise. Therefore, a still camera placing an emphasis on image quality (i.e., a camera for photographing a still image) frequently adopts a solid-state image pickup device using color filters of a primary color system. Sensitivity is compensated for by means of an auxiliary light source.

"A Planar Silicon Photosensor with an Optimal Spectral Response for Detecting Printed Material" by Paul A. Gary and John G. Linvill, IEEE TRANSACTIONS ON ELECTRON DEVICES, Vol. ED-15, No. 1, Jan., 1968. (hereinafter referred to as "Publication 1") describes dependence of a photoelectric conversion characteristic of a photodiode on the depthwise position of a silicon substrate as well as on the wavelength of incident light.

An example of solid-state color imager comprised of three photo-sensitive layers, to which this idea has been applied is described in U.S. Pat. No. 4,438,455, which will be provided below.

The solid-state color imager with three photo-sensitive layers of U.S. Pat. No. 4,438,455 configured on the principle described in Publication 1 has a structure for extracting signals of three colors; i.e., R, G, and B. Without using color filters over-laid on the photo-sensitive elements, no light absorption of color filter material has arisen, and hence, incident light can be effectively converted into an electric signal.

As shown in FIG. 55 (corresponding to FIG. 3 of U.S. Pat. No. 4,438,455), U.S. Pat. No. 4,438,455 describes a structure 101 embodied by means of superimposing three photo-sensitive layers 102, 103, 104 and changing the depth of each photo-conductive layer against the incident light to apply the principle described in Publication 1 to the above structure.

The other example of CCD and MOS type solid-state color imager to which this idea has been applied is described in JP-A-1-134966, which will be provided below.

The solid-state color imager of JP-A-1-134966 configured on the principle described in Publication 1 has a structure of three story $N^+P$ photo-diode with different depth for extracting signals of three colors; i.e., R, G, and B, from one pixel. Without using color filters over-laid on the photo-diode elements, no light absorption of color filter material has arisen, and hence, incident light can be effectively converted into electric signal. Further, false signals or false colors, such as moiré, can be improved.

As shown in FIGS. 56A to 56C (corresponding to FIGS. 1(*a*) to 1(*c*) of JP-A-1-134966), JP-A-1-134966 describes a structure embodied by means of changing the depth of each $N^+P$ photo-diode to apply the principle described in Publication 1 to the above structure.

As shown in FIG. 56A, short wavelength light such as Blue is detected by the shallow $N^+P$ photo-diode 201. Long wavelength light such as Red is detected by the deep $N^+P$ photo-diode 203 as shown in FIG. 56C. The medium wavelength light such as Green is detected by the $N^+P$ photo-diode 202 locating in the depth of between the above two $N^+P$ photo-diodes as shown in FIG. 56B.

Since the solid-state image pickup does not employ color filters, spectra of color component output signals (R, G, B) mutually become larger, thereby causing overlaps. This also presents a problem of difficulty in faithful color reproduction and an attempt to enhance image quality.

In addition, an increase in the number of pixels of a solid-state image pickup device to be incorporated in a recent digital still camera, a video movie camera, or the like has recently been pursued in earnest. Conversely, the area of a light-receiving section accounting for each pixel of the solid-state image pickup device has become smaller. Hence, photographing an image with the same sensitivity as that ever achieved becomes more difficult. Development of a color solid-state image pickup device which can simultaneously achieve enhanced sensitivity, color reproducibility, and a low noise characteristic without involvement of color signal separation computation processing is desired.

SUMMARY OF THE INVENTION

The present invention aims at providing a color solid-state image pickup, especially an MOS color solid-state image pickup device, which is easy to manufacture, can ensure a wide area for light-receiving sections on the surface of a semiconductor substrates, obviates a necessity for color signal separation computation processing, and enables an easy attempt to enhance quality of a photographed image.

The present invention also aims at providing a color solid-state image pickup device, especially a CCD color solid-state image pickup device, which enables an attempt to enhance sensitivity and image quality.

The present invention provides a color solid-state image pickup device comprising: a plurality of light-receiving sections being arranged on the surface of a semiconductor substrate in a two-dimensional array; complementary color filters which are stacked on all or portions of the plurality of light-receiving sections, each complementary color filter blocking incident light of one color of the three primary colors, to thereby permit transmission of incident light of remaining two colors of the three primary colors; at least first and second color signal detecting layers which have the complementary color filters stacked thereon and are formed so as to be separated in a depthwise direction of the light-receiving section, the first signal detecting layer detecting a color signal of one color of the light of two colors having passed through the complementary color filters, and the second signal detecting layer detecting a color signal of remaining one color of the light of two colors having passed through the complementary color filters; and a signal reading unit for reading the respective color signals in a distinguished manner, the signal reading unit being connected to the respective color signal detecting layers.

By means of such a configuration, incident light components can be effectively utilized by use of complementary color filters, thereby enhancing sensitivity. Since primary color signals are obtained directly, a necessity for color signal separation computation processing is obviated. Further, use of a color filter results in a reduction in overlaps existing between spectral sensitivity spectra of respective color signals, thereby further enabling faithful reproduction of colors. Enhanced image quality can also be attained.

There is provided the color solid-state image pickup device, wherein a color signal of one color being different from two colors of the three primary colors, the two colors being detected by a first light-receiving section with the complementary color filter stacked thereon, is determined by subjecting, to interpolation processing, at least one detection signal detected by at least one second light-receiving section which is provided around the first light-receiving section and, at least, detects the color signal of the one color being different from the two colors detected by the first light-receiving section. By means of such a configuration, the three primary color signals are obtained at the respective light-receiving sections, thereby enabling reproduction of color information.

There is provided the color solid-state image pickup device, wherein three types of light-receiving sections are arranged on the surface of the semiconductor substrate, that is, the light-receiving section on which a yellow filter for blocking blue (B) light is stacked, the light-receiving section on which a cyan filter for blocking red (R) light is stacked, and the light-receiving section on which a magenta filter for blocking green (G) light is stacked.

By means of such a configuration, each light-receiving section can directly obtain signal components of two colors from among the three primary colors, R, G, and B. A signal component of one remaining color can be obtained by subjecting signal components of surrounding light-receiving sections to interpolation processing.

There is provided the color solid-state image pickup device, wherein two types of light-receiving sections are arranged on the surface of the semiconductor substrate, that is, the light-receiving section with a yellow filter stacked thereon, and the light-receiving section with a cyan filter stacked thereon.

Even such a configuration enables each light-receiving section to directly obtain signal components of two colors from among the three primary colors, R, G, and B, and a signal component of one remaining color can be obtained by subjecting signal components of surrounding light-receiving sections to interpolation processing. Since a green (G) signal components can be obtained from all the light-receiving sections, a high-resolution image can be obtained by means of effecting image processing while the green signal is taken as a luminance signal.

There is provided the color solid-state image pickup device, wherein two types of light-receiving sections are arranged on the surface of the semiconductor substrate, that is, the light-receiving section with a magenta filter stacked thereon, and the light-receiving section on which a green filter for permitting passage of green (G) light is stacked.

Even such a configuration enables obtaining of signal components of the three primary colors R, G, and B at positions of the respective light-receiving sections. A red (R) wavelength component and a blue (B) wavelength component, both passing through a magenta filter, are spaced away from each other. Hence, forming heavily-doped impurity layers for storing respective color signals so as to be separated from each other in a depthwise direction of the semiconductor substrate is facilitated. Further, an overlap existing between spectra of red and blue spectral sensitivities and the spectrum of a green spectral sensitivity obtained through the green filter can be diminished further. Therefore, an attempt to make more faithful color reproduction can be made.

There is provided the color solid-state image pickup device, wherein two types of light-receiving sections are arranged on the surface of the semiconductor substrate, that is, the light-receiving section with a magenta filter stacked thereon, and the light-receiving section on which a transparent planarized film is stacked in place of a color filter.

By means of such a configuration, a white signal, i.e., a luminance signal, is obtained from the light-receiving section on which a transparent planarized film is stacked in place of a color filter, thereby enabling an attempt to increase the sensitivity of a photographed image to a much greater extent.

There is provided the color solid-state image pickup device, wherein four types of light-receiving sections are arranged on the surface of the semiconductor substrate, that is, the light-receiving section with a green filter stacked thereon, the light-receiving section with a yellow filter stacked thereon, the light-receiving section with a magenta filter stacked thereon, and the light-receiving section with a cyan filter stacked thereon.

By means of such a configuration, signal electric charges can be read from respective light-receiving sections in sequence of color difference line, thereby enabling an attempt to speed up signal processing.

There is provided the color solid-state image pickup device, wherein an electric charge path formed from a heavily-doped impurity region, the region extending continuously up to the surface of the semiconductor substrate, is provided in a color signal detecting layer provided in the semiconductor substrate from among the color signal detecting layers.

By means of such a configuration, reading of color signals from a color signal detecting layer provided at a deep location of the semiconductor substrate becomes facilitated.

There is provided the color solid-state image pickup device, wherein a concentration gradient is set such that a doping level of the color signal detecting layer formed as a heavily-doped impurity region and a doping level of the electric charge path continually connected to the color signal detecting layer increase as the layer and the path approach the signal reading unit.

By means of such a configuration, reading of signal electric charges from the color signal detecting layer is further facilitated, thereby preventing a failure to read remaining signal electric charges.

There is provided the color solid-state image pickup device, wherein the depth of the first color signal detecting layer and the depth of the second color signal detecting layer are set in accordance with respective wavelengths of the light of two colors having passed through the complementary color filters.

By means of such a configuration, the spectral characteristics of the respective color signal detecting layers can be rendered as originally set.

There is provided the color solid-state image pickup device, wherein on-chip light gathering optical systems are provided on upper portions of the respective light-receiving sections, and one opening of each light-shielding film corresponds to each of the light-receiving sections. By means of such a configuration, a loss in incident light is further reduced, whereby the utilization efficiency of incident light is further improved.

There is provided the color solid-state image pickup, device, wherein the light-receiving sections are arranged in a square solid pattern or a honeycomb pattern on the surface of the semiconductor substrate. The present invention can be applied to any one of these pixel arrangements.

There is provided the color solid-state image pickup device, wherein the signal reading unit is a vertical transfer path; wherein the first color signal detecting layer is a first electric charge storage layer which reads, to the vertical transfer path, stored electric charges corresponding to the quantity of incident light from the light-receiving section, as the color signal; and wherein the second color signal detecting layer is a second electric charge storage layer which reads, to the vertical transfer path, stored electric charges corresponding to the quantity of incident light from the light-receiving section, as the color signal.

By means of such a configuration, in a CCD color solid-state image pickup device, incident light components can be effectively utilized by use of complementary color filters, thereby enhancing sensitivity. Since primary color signals are obtained directly, a necessity for color signal separation computation processing is obviated. Further, use of a color filter results in a reduction in overlaps existing between spectral sensitivity spectra of respective color signals, thereby further enabling faithful reproduction of colors. Enhanced image quality can also be attained.

There is provided the color solid-state image pickup device, wherein the depth of the first electric charge storage layer and the depth of the second electric charge storage layer are set in accordance with respective wavelengths of the light of two colors having passed through the complementary color filters; and wherein the depth of the electric charge storage layer for storing electric charges corresponding to the quantity of blue (B) incident light ranges from 0.2 to 0.4 µm; the depth of the electric charge storage layer for storing electric charges corresponding to the quantity of green (G) incident light ranges from 0.4 to 0.8 µm; and the depth of the electric charge storage layer for storing electric charges corresponding to the quantity of red (R) incident light ranges from 0.8 to 2.5 µm. By means of such a configuration, in a CCD color solid-state image pickup device, depths of the respective electric charge storage layers are made optimum for storing electric charges according to the quantity of R, G, and B incident light.

There is provided the color solid-state image pickup device, wherein the signal reading unit is a signal line.

By means of such a configuration, in an MOS color solid-state image pickup device, incident light components can be effectively utilized by use of complementary color filters, thereby enhancing sensitivity. Since primary color signals are obtained directly, a necessity for color signal separation computation processing is obviated. Furthers use of a color filter results in a reduction in overlaps existing between spectral sensitivity spectra of respective color signals, thereby further enabling faithful reproduction of colors. Enhanced image quality can also be attained.

There is provided the color solid-state image pickup device, wherein the light-receiving sections store electric charges in a PN junction section formed as a result of provision of heavily-doped impurity layers serving as the color signal detecting layers, in the semiconductor substrate; the electric charges are caused to discharge by means of photocarriers produced by incident light; and the quantity of change in electric charges, which varies by means of electric discharge, is read as the color signal. By means of even such a configuration, in an MOS color solid-state image pickup device, sensitivity is enhanced, and primary color signals are obtained directly. Hence a necessity for color signal separation computation processing is obviated. Further, use of a color filter results in a reduction in overlaps existing between spectral sensitivity spectra of respective color signals, thereby further enabling faithful reproduction of colors. Enhanced image quality can also be attained.

There is provided the color solid-state image pickup device, wherein the depth of the first heavily-doped impurity layer and the depth of the second heavily-doped impurity layer are set in accordance with respective wavelengths of the light of two colors having passed through the complementary color filters; and wherein the depth of the heavily-doped impurity layer for detecting the blue (B) color signal ranges from 0.1 to 0.3 µm; the depth of said heavily-doped impurity layer for detecting the green (G) color signal ranges from 0.3 to 0.8 μm; and the depth of said heavily-doped impurity layer for detecting the red (R) color signal ranges from 0.8 to 2.5 μm.

By means of such a configuration, in an MOS color solid-state image pickup device, depths of the respective heavily-doped impurity layers are made optimum for storing electric charges according to the quantity of R, G, and B incident light.

There is provided the color solid-state image pickup device, wherein an impurity region which is superimposed on the heavily-doped impurity layer for detecting a blue (B) color signal and establishes ohmic contact between the heavily-doped impurity layer and the signal line is formed deeper than the heavily-doped impurity layer.

By means of such a configuration, in an MOS color solid-state image pickup device, electrical connection established at ohmic contacts is effected well, thereby improving the reliability of the image pickup device.

DETAILED DESCRIPTION OF THE INVENTION

Embodiments of the invention will be described hereinbelow by reference to the drawings.

FIRST EMBODIMENT

Figure 1:
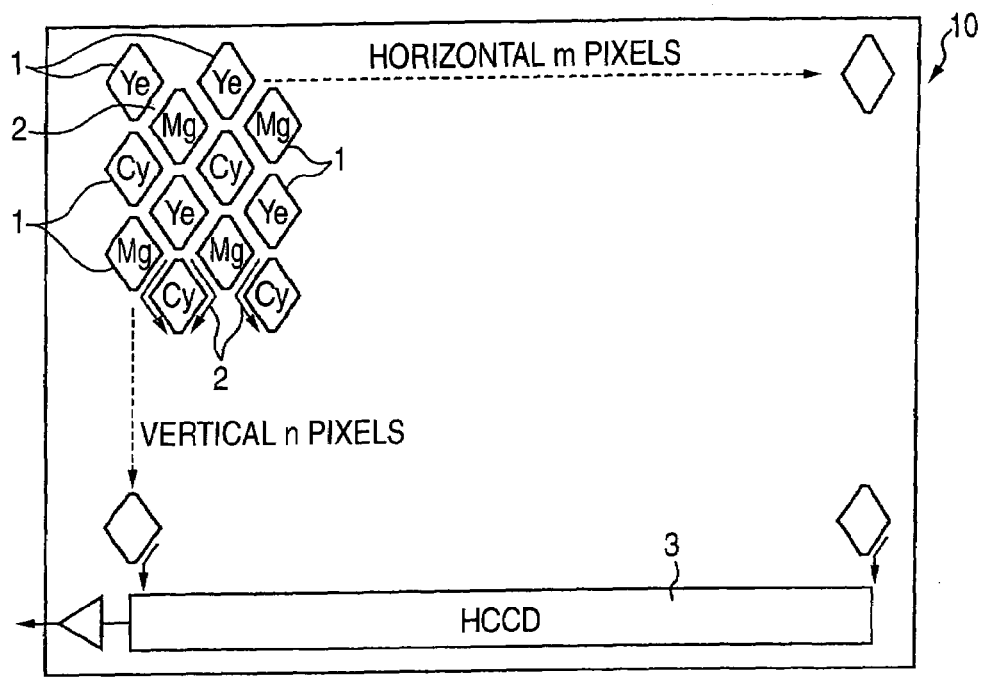
FIG. 1 is a schematic surface view of a CCD color solid-state image pickup device of single plate type according to a first embodiment of the invention.

FIG. 1 is a schematic surface view of a CCD color solid-state image pickup of single plate type according to a first embodiment of the invention. In the CCD color solid-state image pickup, a plurality of light-receiving sections 1, each having a cross-sectional structure to be described in detail later, are formed in an array on the surface of a semiconductor substrate 10. In an illustrated example, each light-receiving section 1 is depicted as a rhombus.

The arrangement of pixels employed in the present embodiment corresponds to the arrangement of pixels described in JP-A-10-136391; that is, a so-called honeycomb pixel arrangement in which the respective light-receiving sections 1 are offset at half a pitch in both the vertical and horizontal directions. A vertical transfer path [e.g., a vertical charge-coupled device (VCCD)] 2 (signal reading unit) is formed between adjacent light-receiving sections 1, and signal electric charges read to the vertical transfer path 2 from the respective light-receiving sections 1 are transferred, in a meandering manner, to a horizontal transfer path [e.g., a horizontal charge-coupled device (HCCD) ] 3 located at a lower position on the drawing.

Any of a yellow (Ye) filter, a cyan (Cy) filter, and a magenta (Mg) filter, all being filters of a complementary color system, are stacked on surfaces of the respective light-receiving sections 1. The Ye filter permits passage of light having green (G) and red (R) wavelength components; the Cy filter permits passage of light having blue (B) and the green (G) wavelength components; and the Mg filter permits passage of light having the red (R) and blue (B) wavelength components.

Each light-receiving section 1 of the embodiment has a cross-sectional structure which will be described in detail later. Therefore, the light-receiving section 1 can simultaneously store, from G+R light having passed through the Ye filter, a signal electric charge corresponding to the quantity of G and a signal electric charge corresponding to the quantity of R and separately read the thus-stored signal electric charges to the vertical transfer path 2. The light-receiving section 1 can simultaneously store, from B+G light having passed through the Cy filter, a signal electric charge corresponding to the quantity of B and a signal electric charge corresponding to the quantity of G and separately read the thus-stored signal electric charges to the vertical transfer path 2. Further, the light-receiving section 1 can simultaneously store, from R+B light having passed through the Mg filter, a signal electric charge corresponding to the quantity of R and a signal electric charge corresponding to the quantity of B and separately read the thus-stored signal electric charges to the vertical transfer path 2.

Figure 2A:
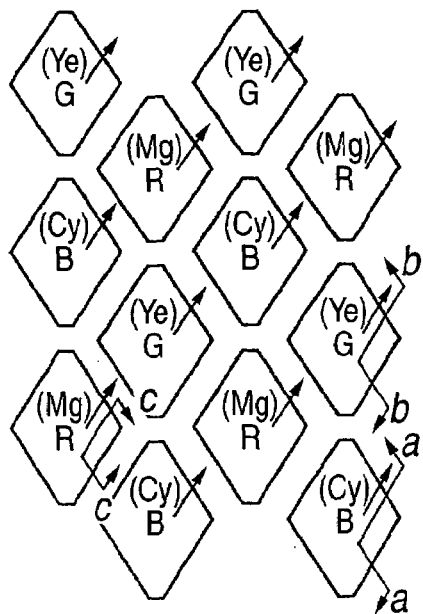
FIGS. 2A and 2B are descriptive views for reading signals from respective light-receiving sections of the CCD color solid-state image pickup device shown in FIG. 1.
Figure 2B:
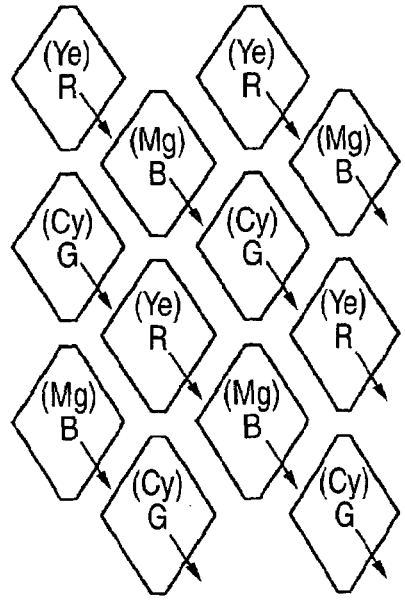

For instance, as shown in FIG. 2A, reading of a G signal from the light-receiving section 1 having the Ye filter, reading of a B signal from the light-receiving section having the Cy filter, and reading of an R signal from the light-receiving section having the Mg filter are performed by a first reading operation. As shown in FIG. 2B, reading of an R signal from the light-receiving section 1 having the Ye filter, reading of a G signal from the light-receiving section having the Cy filter, and reading of a B signal from the light-receiving section having the Mg filter are performed by a second reading operation.

Figure 3:
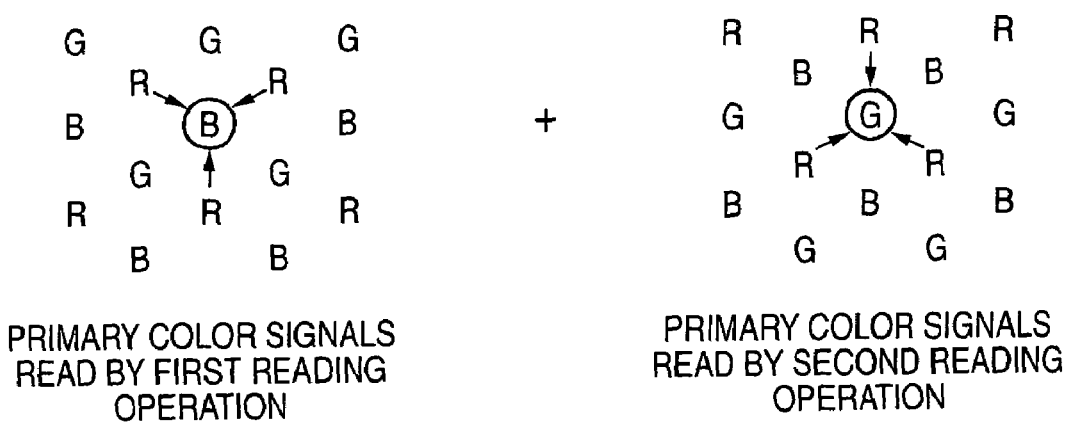
FIG. 3 is a descriptive view for reproducing colors from color signals read from the CCD color solid-state image pickup device shown in FIG. 1 by two reading operations.

Specifically, reading of signal electric charges from the light-receiving sections, transfer of the signal electric charges through the VCCD, and transfer of the signal electric charges through the HCCD are performed twice over the entire light-receiving area, whereby two primary-color signal components can be obtained from one light-receiving section. A deficient one-color signal in each light-receiving section is determined as a mean value of signals from surrounding pixels. Specifically, as shown in FIG. 3, the B signal read by the first reading operation and the G signal read by the second reading operation are used for reproducing a color of the location enclosed by a circle. For instance, a mean value of a total of six R signals (R signals from surrounding three pixels ×2) is used for determining a deficient R signal. A color of the position enclosed by the circle is reproduced by means of the thus-determined R, G, and B signals pertaining to the position enclosed by the circle.

Figure 4A:
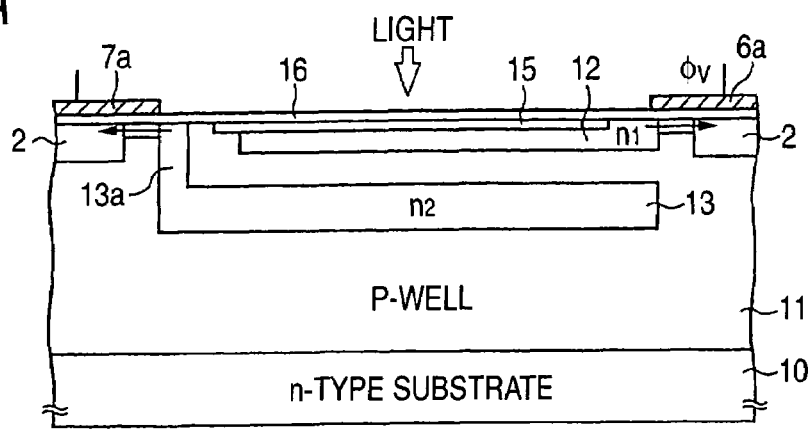
FIG. 4A is a cross-sectional view taken along line a-a shown in FIG. 2A.
Figure 4B:
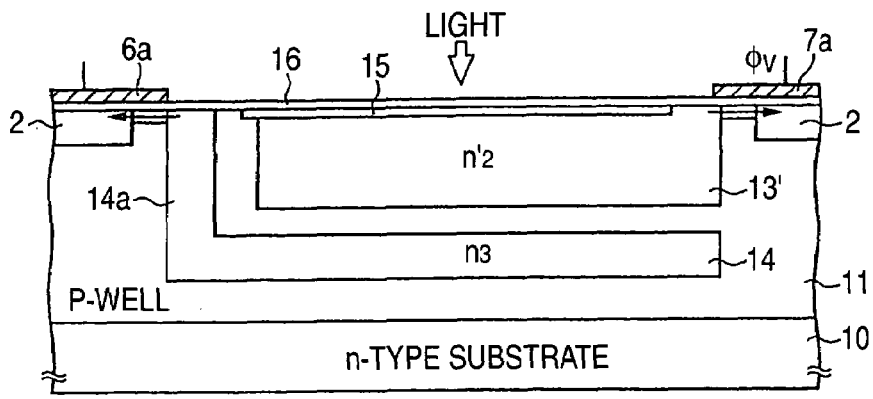
FIG. 4B is a cross-sectional view take along line b-b shown in FIG. 2A.
Figure 4C:
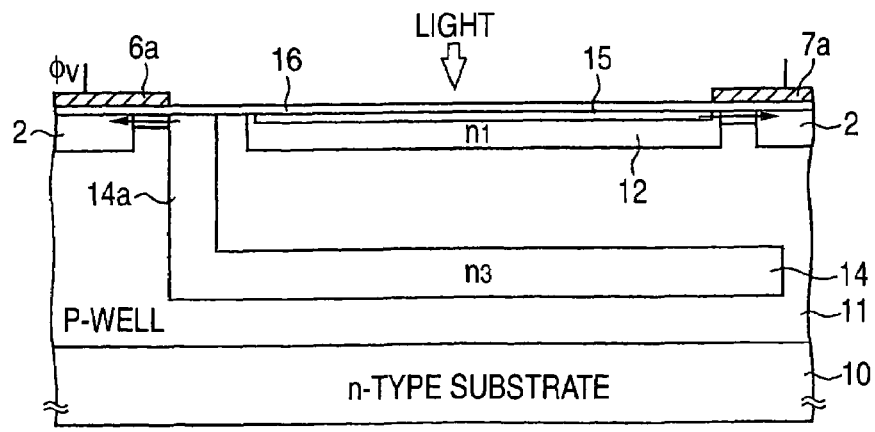
FIG. 4C is a cross-sectional view take along line c-c shown in FIG. 2A.

FIG. 4A is a cross-sectional view taken along line a-a shown in FIG. 2; FIG. 4B is a cross-sectional view taken along line b-b shown in FIG. 2; and FIG. 4C is a cross-sectional view taken along line c-c shown in FIG. 2. In these cross-sectional views, a complementary filter and a microlens provided thereon are omitted from the drawings.

The CCD color solid-state image pickup device of the present embodiment separates the R, G, and B color signal components by utilization of an optical characteristic of the silicon substrate. Specifically, the light absorption coefficient of a silicon substrate changes across a visible range from light of long wavelength (R) to light of short wavelength (B). Hence, light in a wavelength range having a large light absorption coefficient is absorbed by a shallow area of the silicon substrate, and hence the light hardly reaches a deep area of the silicon substrate. Conversely, light in a wavelength range having a small light absorption coefficient reaches a deep region of the silicon substrate. Therefore, the light can be subjected to photoelectric conversion even at the deep area of the silicon substrate.

In relation to the optical characteristic of the silicon substrate, the paper entitled "A Planar Silicon Photosensor with an Optimal Spectral Response for Detecting Printed Material" by Paul A. Gary and John G. Linvill, IEEE TRANSACTIONS ON ELECTRON DEVICES, Vol. ED-15, No. 1, January 1968 describes dependence of a photoelectric conversion characteristic of a photodiode on the depthwise position of a silicon substrate as well as on the wavelength of incident light. Further, a CMOS image sensor employing this principle is described in U.S. Pat. No. 5,965,875.

In FIG. 4A, a light-receiving section, on which the cyan (Cy) filter is stacked and which stores blue (B) and green (G) signal electric charges, is formed in an n-type semiconductor substrate 10. A P-well layer 11 is formed on the surface of the semiconductor substrate 10, and two $N^+$ layers 12, 13 (color signal detecting layers) are formed within the P well layer 11 so as to be separated from each other in the depthwise direction.

The signal electric charges primarily produced from an incident light component of short wavelength light (e.g., B) are stored in the $N^+$ layer 12 provided at the most shallow position with respect to the depthwise direction of the semiconductor substrate 10. The $N^+$ layer 12 constituting the signal electric charge storage section extends up to a position below a read gate electrode 6a {dopant [phosphorous or arsenic (P or As)] content is about $5 \times 10^{16-17}/cm^3$, and the depth of the $N^+$ layer is 0.2 to 0.4 µm, wherein the depth is dependent on the dopant content, and the same also applies to any counterparts in the following descriptions}. Therefore, only the electric charges derived primarily from the light of short wavelength pass through a gate section and are read to the vertical transfer path 2.

The $N^+$ layer (n2) 13 provided at a position slightly deeper than the $N^+$ layer 12 has, at an end section thereof, an $N^+$ region (i.e., a charge path) 13a which extends up to the surface of the semiconductor substrate 10. This charge path 13a extends up to a position below a read gate electrode 7a formed from a portion of the transfer electrode. The signal electric charges formed from light of intermediate wavelength (e.g., G) are stored in the $N^+$ layer 13. The $N^+$ layer 13 constituting the signal electric charge storage section (dopant content is about $5 \times 10^{16-17}/cm^3$ at a depth of 0.4 to 0.8 µm) extends up to a position below the read gate electrode 7a. As a result, the electric charges derived primarily from the light of intermediate wavelength (G) pass through a gate section and are read to the vertical transfer path 2.

In FIG. 4B, a light-receiving section, on which the yellow (Ye) filter is stacked and which stores green (G) and red (R) signal electric charges, is formed within the P well layer 11 as two N$^+$ layers 13', 14 (color signal detecting layers) which are separated from each other in a depthwise direction.

An end of the N$^+$ layer (n2') 13' extends to a position below the read gate electrode 7a constituting a portion of the transfer electrode. The signal electric charges formed from light of intermediate wavelength (e.g., G) are stored in the N$^+$ layer 13'. The N$^+$ layer 13' constituting the signal electric charge storage section (dopant content is about $5 \times 10^{16-17}/\text{cm}^3$ at a depth of 0.2 to 0.8 µm) extends up to a position below the read gate electrode 7a. As a result, the electric charges derived primarily from the light of intermediate wavelength (G) pass through a gate section and are read to the vertical transfer path 2.

The structure of the N$^+$ layer 13 shown in FIG. 4A may be adopted in lieu of the N$^+$ layer 13'. Even if the electric charge storage layer 13' is formed as an N$^+$ layer up to a depth of 0.8 µm or the like from the surface as in the case of the embodiment, the yellow (Ye) filter is stacked on the surface of the electric charge layer. Of the incident light, B light is blocked by the yellow filter, and hence B signal electric charges are not stored in the electric charge storage layer 13'.

The N$^+$ layer (n3) 14 formed at a deep position has, at an end section thereof, an N$^+$ region (i.e., a charge path) 14a which extends up to the surface of the semiconductor substrate 10. This N$^+$ region 14a extends up to a position below the read gate electrode 6a formed from a portion of the transfer electrode. The signal electric charges formed from light of long wavelength (e.g., R) are stored in the N$^+$ layer 14. The N$^+$ layer 14 constituting the signal electric charge storage section (dopant content is about $5 \times 10^{16-17}/\text{cm}^3$ at a depth of 0.8 to 2.5 µm) extends up to a position below the read gate electrode 6a. As a result, the electric charges derived primarily from the light of long wavelength (R) pass through the gate section and are read to the vertical transfer path 2.

In FIG. 4C, a light-receiving section, on which the magenta (Mg) filter is stacked and which stores blue (B) and red (R) signal electric charges, is formed within the P well layer 11 as two N$^+$ layers 12, 14 (color signal detecting layers) which are separated from each other in a depthwise direction.

Signal electric charges derived primarily from an incident light component of short wavelength light (B) are stored in the N$^+$ layer 12 located at the surface and read to the vertical transfer path 2 by way of the gate section. Signal electric charges derived from light of long wavelength (e.g., R) are stored in the N$^+$ layer (n3) 14 formed at a deep position and read to the vertical transfer path 2 by way of the gate section.

A shallow P$^+$ layer 15 is provided in a portion of the surface of the semiconductor substrate 10 equipped with three types of storage sections 12, 13 (13'), and 14 formed at different depths. Further, an SiO$_2$ film 16 is provided on the top surface of the semiconductor substrate 10. A dopant (boron) content of the P$^+$ layer 15 is about $1 \times 10^{18}/\text{cm}^3$, and the P$^+$ layer 15 has a depth of about 0.1 to 0.2 µm. The dopant content contributes to a reduction in a defect level of an oxide film-semiconductor boundary surface. Accordingly, the storage section 12 located at the most shallow position in the depthwise direction of the semiconductor substrate 10 assumes a P$^+$N$^+$P structure.

As mentioned above, the CCD color solid-state image pickup device of the embodiment as a whole assumes a P$^+$ (N$^+$P) (N$^+$P) structure. Two types of storage sections (N$^+$ layers) of different depths are formed so as to be separated from each other with a P region (which will become a potential barrier) being sandwiched therebetween in the depthwise direction of the substrate. The boron content of the P region located between the N$^+$ layers is set to $1 \times 10^{14-16}/\text{cm}^3$.

Preferably, the dopant content of the storage section formed from the N$^+$ layers and that of the electric charge path are preferably given a concentration gradient so as to become higher toward the read gate section than at the light incidence region close to the center of the storage-section. As a result, reading of the signal electric charges becomes easy, and retention of unread electric charges can be prevented.

In the embodiment, double-layer storage sections are formed in any of the light-receiving sections 1 in the depthwise direction of the substrate, and there is provided no N$^+$ layer assigned to light of wavelength which is beyond the range of wavelengths for which signal electric charges are stored. However, a complementary color filter is stacked on each light-receiving section 1, and hence one of the R, G, and B color signals is blocked by the complementary color filter, to thereby fail to reach the silicon substrate. Consequently, even when the N$^+$ layers 12, 13, and 14, each having a triple-layer structure, are provided in the respective light-receiving sections 1 with a view toward achievement of a commonality of mask patterns constituting the respective N$^+$ layers, signal electric charges are not stored in the N$^+$ layer assigned to light of a wavelength (i.e., color) which does not reach the silicon substrate. However, when each light-receiving section is given a triple structure, unwanted electric charges are considered to remain in the storage section (i.e., the N$^+$ layer) from which no electric charges are read. For this reason, a positive voltage pulse is preferably applied to the substrate before the next photographing operation in order to wipe away unwanted electric charges.

Figure 5:
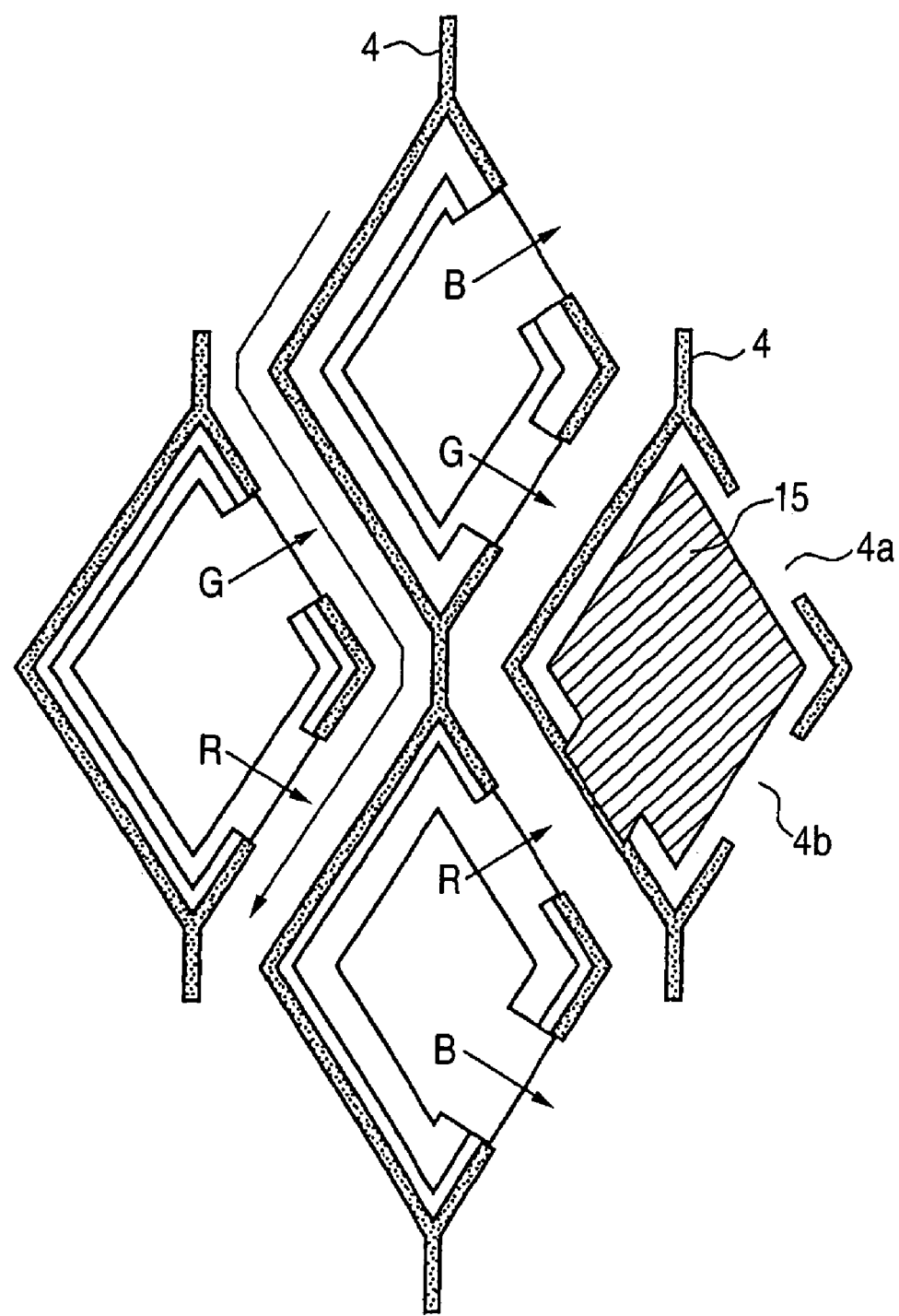
FIG. 5 is a plan view showing four light-receiving sections (four pixels) of the CCD color solid-state image pickup device shown in FIG. 1.

FIG. 5 is a plan view showing a pattern of four pixels of the light-receiving section 1 shown in FIG. 1 and a pattern of the vertical transfer path 2 laid between the light-receiving sections 1. The light-receiving sections 1 are partitioned from each other by means of rhombus element isolation regions 4. Of four sides of the rhombus, gate sections 4a, 4b are formed in two right sides where the element isolation region 4 is broken. Of the signal electric charges stored in the respective storage sections 12, 13, and 14, signal electric charges (see FIG. 2A) which are to be read by the first reading operation are read to the vertical transfer path 2 by way of the gate section 4a. The signal electric charges (see FIG. 2B) which are to be read by the second reading operation are read to the vertical transfer path 2 by way of the gate section 4b.

Figure 6:
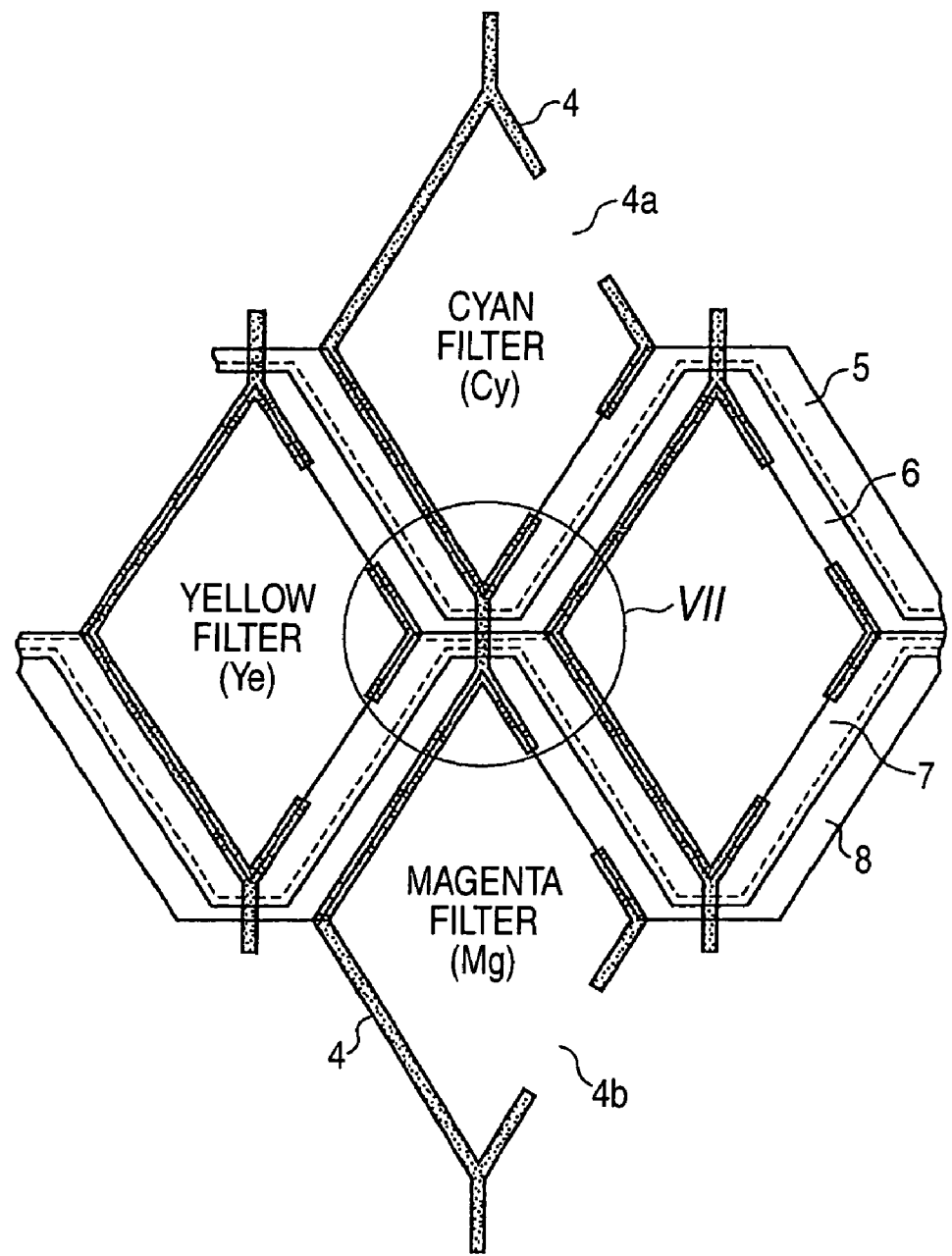
FIG. 6 is a view made by superimposing transfer electrodes on the pixels shown in FIG. 5.
Figure 7:
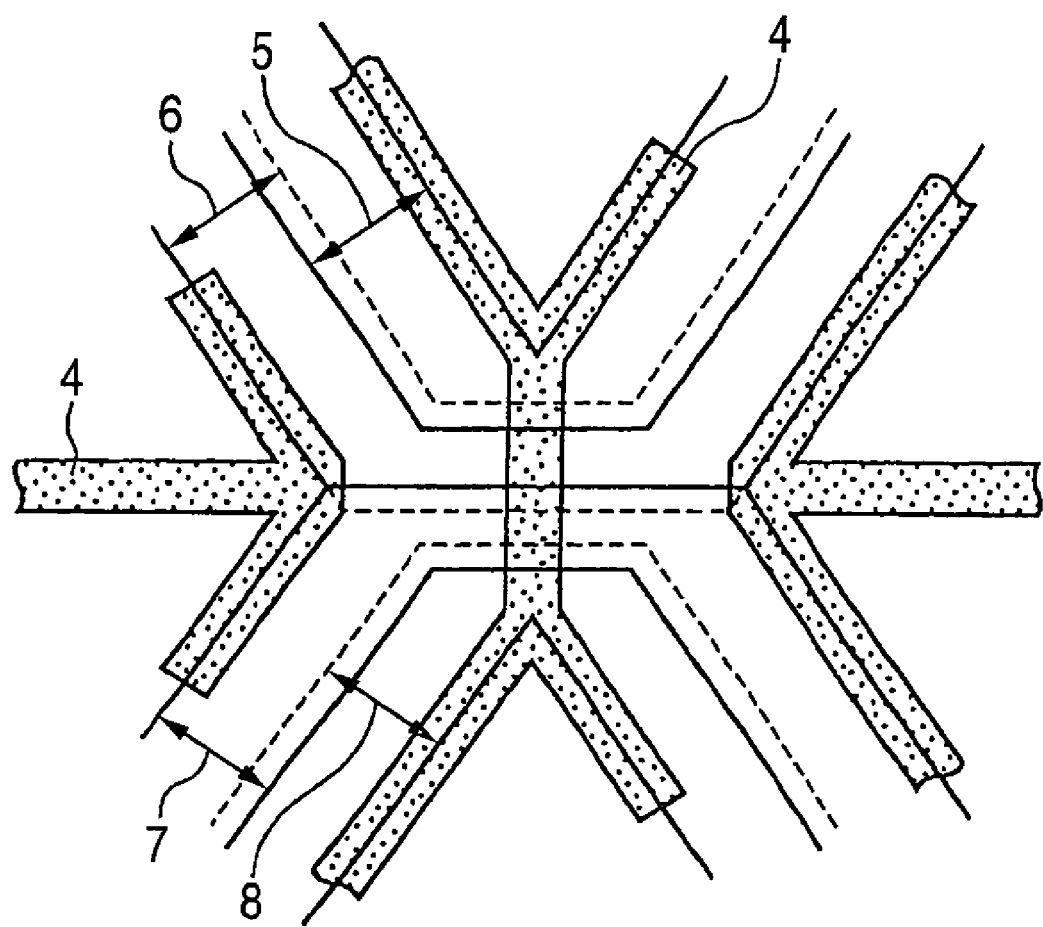
FIG. 7 is a detailed view of the inside of an area enclosed by a circle VII shown in FIG. 6.

FIG. 6 is a view made by superimposing transfer electrodes on the pixels shown in FIG. 5, and FIG. 7 is a detailed view of the inside of an area enclosed by a circle VII shown in FIG. 6. The transfer electrode formed from a two-layer polysilicon structure is provided so as to cover the vertical transfer path 2. Four transfer electrodes 5, 6, 7, and 8 are assigned to one light-receiving section 1. As a result, the electrodes constitute a so-called CCD which can read all pixels (i.e., a CCD capable of performing progressive operation).

Figure 8A:
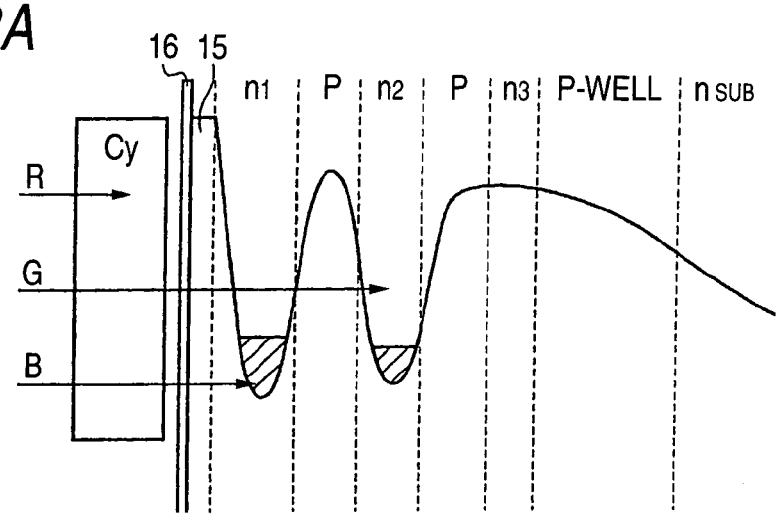
FIG. 8A is a view showing a relationship between a distance over which light has entered and traveled through a cyan filter Cy in a silicon substrate and a storage layer of the first embodiment.
Figure 8B:
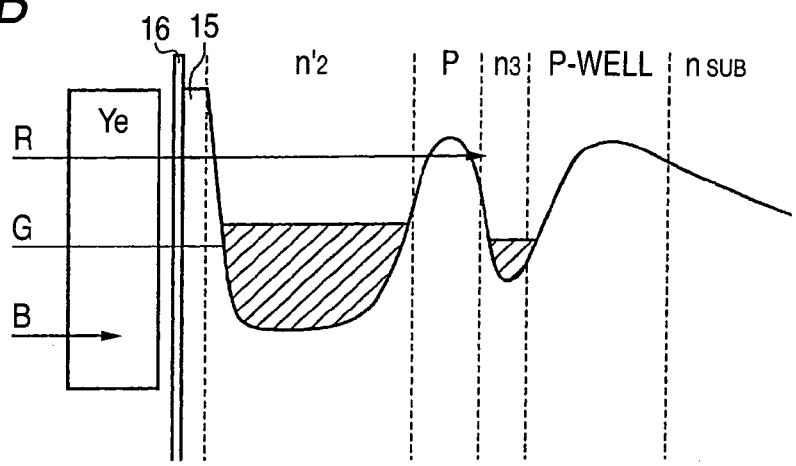
FIG. 8B is a view showing a relationship between a distance over which light has entered and traveled through a yellow filter Ye in a silicon substrate and a storage layer of the first embodiment.
Figure 8C:
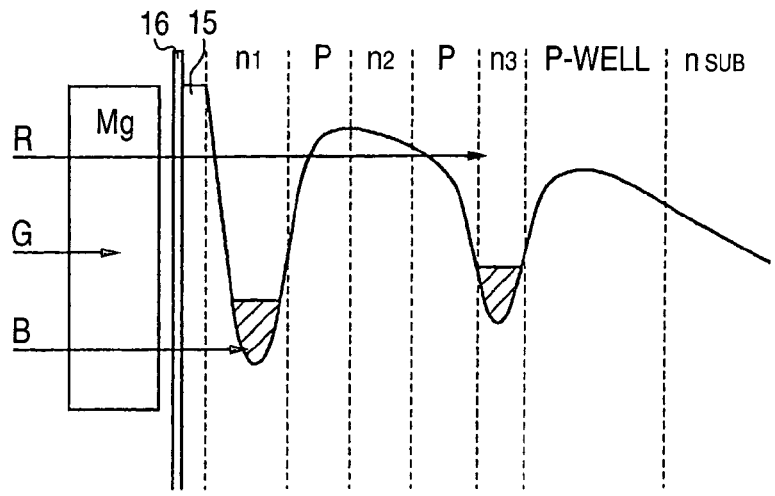
FIG. 8C is a view showing a relationship between a distance over which light has entered and traveled through a magenta filter Mg in a silicon substrate and a storage layer of the first embodiment.

FIGS. 8A, 8B, and 8C are conceptual renderings for describing the fact that depths of the silicon substrate to which the light signals having passed through the complementary color filters Cy, Ye, and Mg travel change according to wavelengths of the light signals. Specifically, the B light, having the shortest wavelength, is absorbed by the most shallow region of the silicon substrate, thereby generating photoelectric charges. The thus-generated photoelectric charges are stored in the first storage section n1. The G light, having an intermediate wavelength, reaches a position deeper than that to which the B light has arrived, and hence a large number of produced electric charges are stored in a storage section n2 (n2') located at the intermediate depth. Similarly, electric charges produced by the R light, having the longest wavelength, are stored in a storage region n3 located at the deepest location of the silicon substrate.

A P region, which is to act as a potential barrier, exists between the signal charge storage sections n1, n2 and between the signal charge storage sections n2 (n2'), n3. Signal charges (i.e., electrons) having developed in the P region are allocated to any of the adjacent charge storage sections [n1, n2 (n2'), n3] along a potential profile.

Figure 9A:
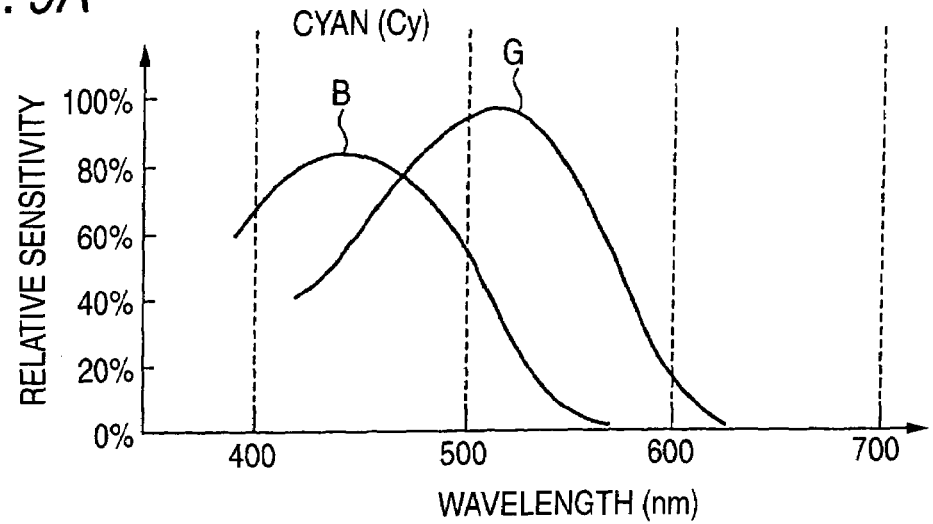
FIG. 9A is a view showing a spectral sensitivity spectrum of a B signal and that of a G signal, both signals being produced by a light-receiving section with the cyan filter Cy stacked thereon.
Figure 9B:
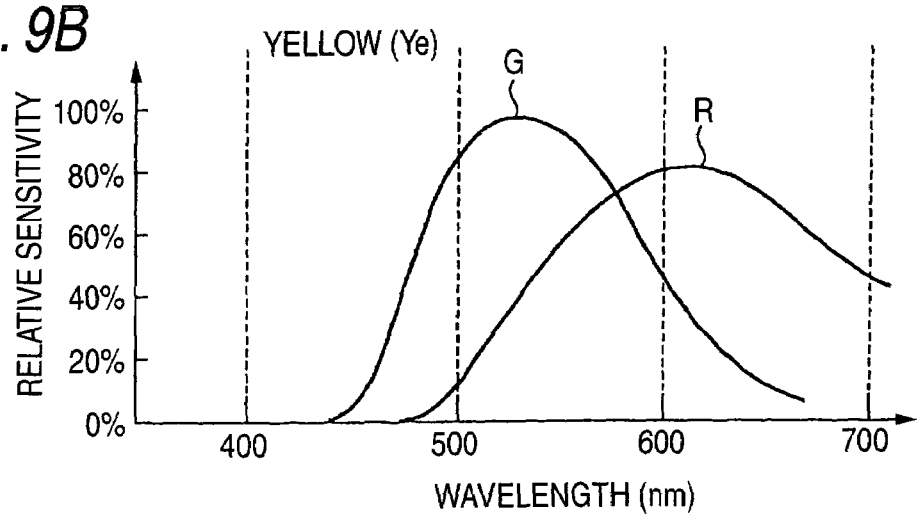
FIG. 9B is a view showing a spectral sensitivity spectrum of the G signal and that of an R signal, both signals being produced by a light-receiving section with the yellow filter Ye stacked thereon.
Figure 9C:
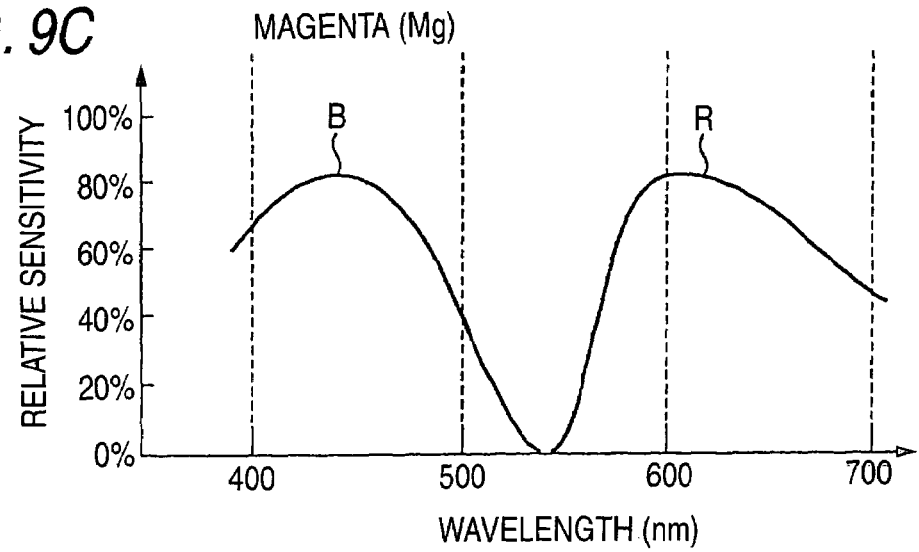
FIG. 9C is a view showing a spectral sensitivity spectrum of the B signal and that of the R signal, both signals being produced by a light-receiving section with the magenta filter Mg stacked thereon.

FIG. 9A is a view showing a spectral sensitivity spectrum of the B signal and that of the G signal, both signals being produced by the light-receiving section with the cyan (Cy) filter stacked thereon. FIG. 9B is a view showing a spectral sensitivity spectrum of the G signal and that of the R signal, both signals being produced by the light-receiving section with the yellow (Ye) filter stacked thereon. FIG. 9C is a view showing a spectral sensitivity spectrum of the B signal and that of the R signal, both signals being produced by the light-receiving section with the magenta (Mg) filter stacked thereon.

According to the configuration of the light-receiving section of the embodiment, an overlap existing between the spectral sensitivity spectra of the respective signal components B, G, and R becomes smaller. Hence, more faithful colors can be reproduced by subjecting the signal components produced by the light-receiving sections to image processing, thereby enabling an attempt to achieve higher image quality.

The CCD color solid-state image pickup device of the embodiment increases the utilization efficiency of incident light through use of complementary color filters, thereby enhancing sensitivity. Moreover, the respective light-receiving sections can distinguish color signals and directly read primary color signals, thereby obviating a necessity for color signal separation computation processing.

This embodiment has described the solid-state image pickup device in which the light-receiving sections 1 are arranged in a so-called honeycomb pattern. However, the embodiment can also be applied to a solid-state image pickup device in which the light-receiving sections 1 are arranged in a square grid pattern.

SECOND EMBODIMENT

Figure 10:
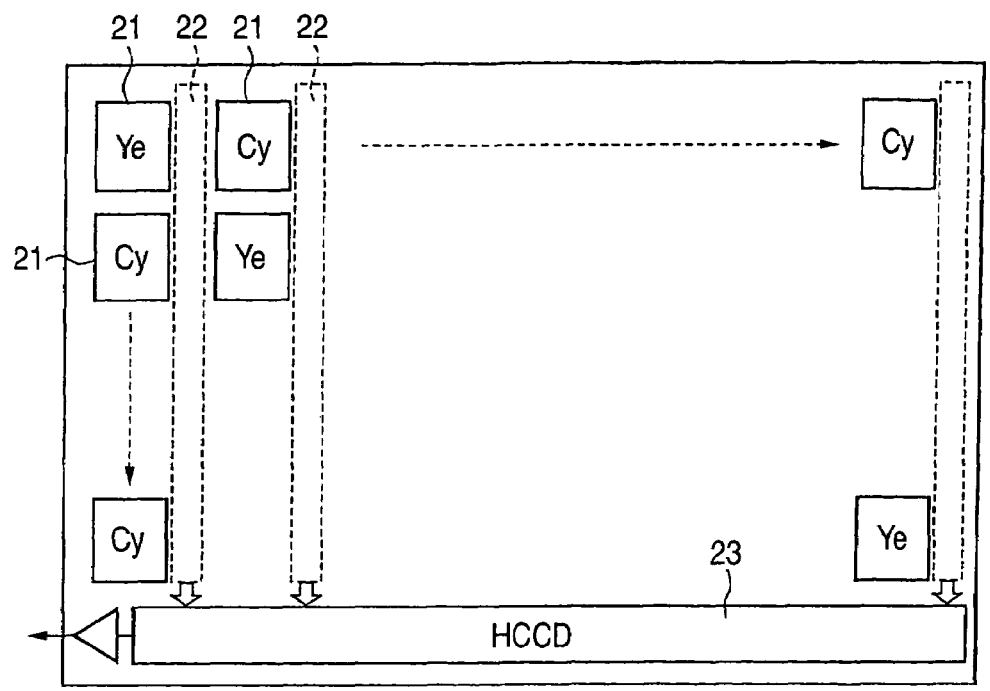
FIG. 10 is a schematic surface view of a CCD color solid-state image pickup device of single plate type according to a second embodiment of the invention.

FIG. 10 is a schematic surface view of a CCD color solid-state image pickup device of single plate type according to a second embodiment of the invention. In the following embodiment, unless otherwise specified, the dopant content of the N+ layer or the like and the depth of the storage layer are the same as those described in connection with the first embodiment.

In FIG. 10, a light-receiving section 21 is represented as a rectangle, and a plurality of light-receiving sections 21 are arranged in an array pattern. In this embodiment, the light-receiving sections 21 are arranged in a square grid pattern. A vertical transfer path 22 (signal reading unit) is formed between horizontally-adjacent light-receiving sections 21. Signal charges read from the light-receiving section 21 to the vertical transfer path 22 are transferred to a horizontal transfer path 23 provided at a downward location.

Complementary color filters; that is, the Ye filter and the Cy filter, are stacked alternately on the light-receiving sections 21 of the present embodiment with respect to the vertical and horizontal directions.

Green (G) signal electric charges and red (R) signal electric charges are distinctively stored in the light-receiving sections 21 with the Ye filters stacked thereon. The G signal and the R signal are separately read to the vertical transfer path 22. Moreover, the green (G) signal electric charges and blue (B) signal electric charges are stored separately in the light-receiving sections 21 with the Cy filters stacked thereon. The G signal and the B signal are separately read to the vertical transfer path 22.

As mentioned above, according to the present embodiment, the G signals are produced by all the light-receiving sections 21, and the R and B signals are alternately produced by the light-receiving sections 21 that are arranged vertically and horizontally. More specifically, each of the light-receiving sections 21 is deficient of either the R color signal or the B color signal. However, the deficient color signal is determined as a mean value of peripheral pixel signals.

Figure 11:
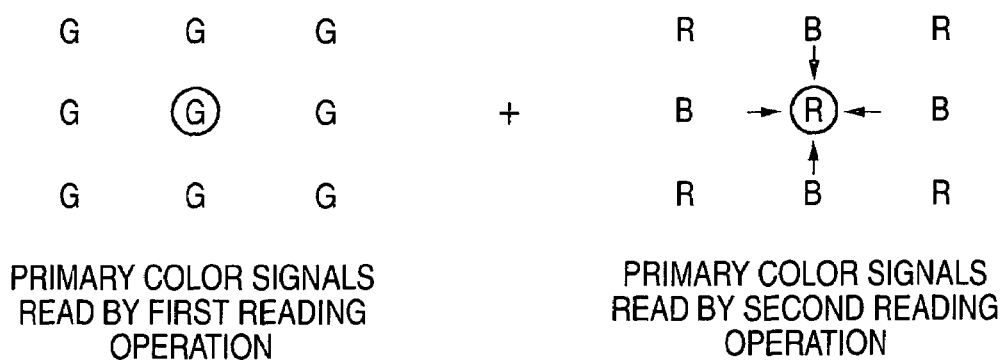
FIG. 11 is a descriptive view for reproducing colors from color signals read from the CCD color solid-state image pickup device shown in FIG. 10 by two reading operations.

As shown in FIG. 11, the G signal read through the first reading operation and the R signal read through the second reading operation are used for reproducing a color of the area enclosed by, e.g., a circle. A mean value of B signals of four peripheral signals from the adjacent pixels is used as a deficient B signal.

Figure 12:
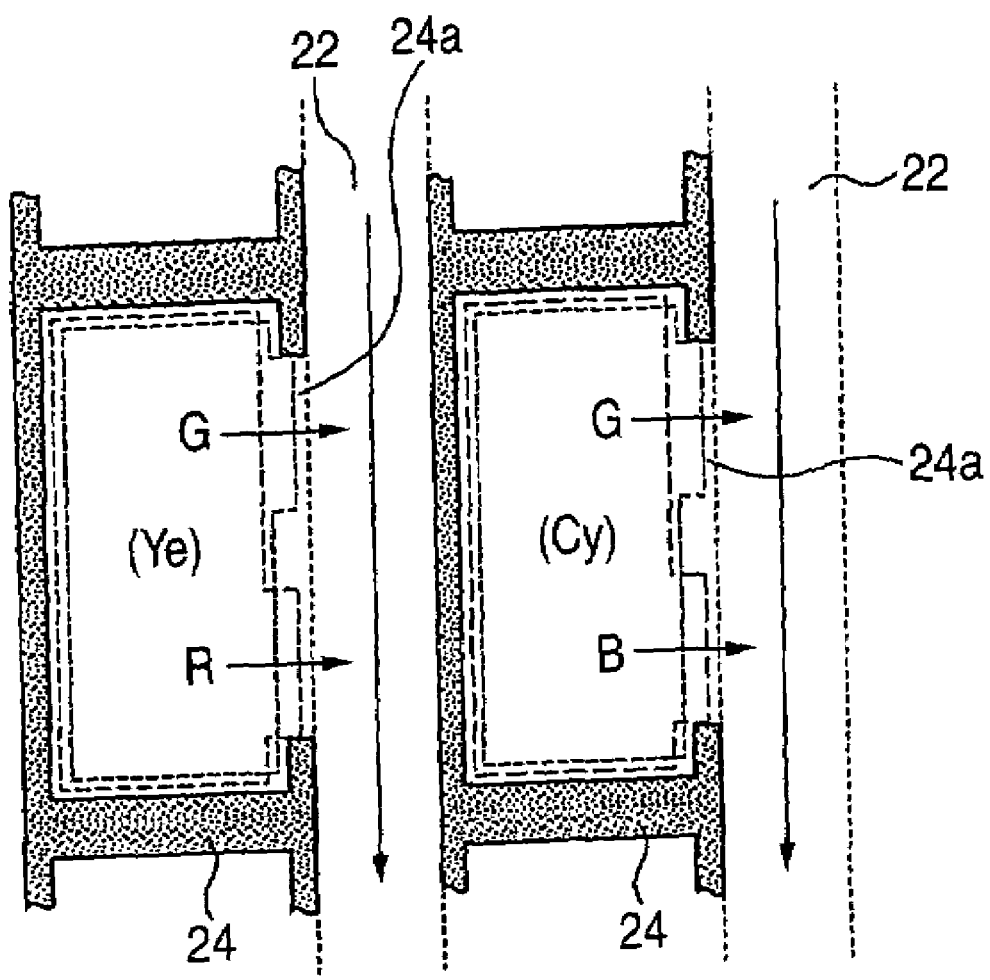
FIG. 12 is a plan view showing the pattern of an element isolation region corresponding to two horizontally-adjacent light-receiving sections (two pixels) of the CCD color solid-state image pickup device shown in FIG. 10.

FIG. 12 is a plan view showing two pixels of the light-receiving section 21 and a vertical transfer path laid between horizontally-adjacent light-receiving sections, both pertaining to the present embodiment. Each light-receiving section is surrounded by a C-shaped element isolation region 24. Signal electric charges are read to the vertical transfer path 22 from at gate section 24a where the element isolation region 24 is not present.

Figure 13:
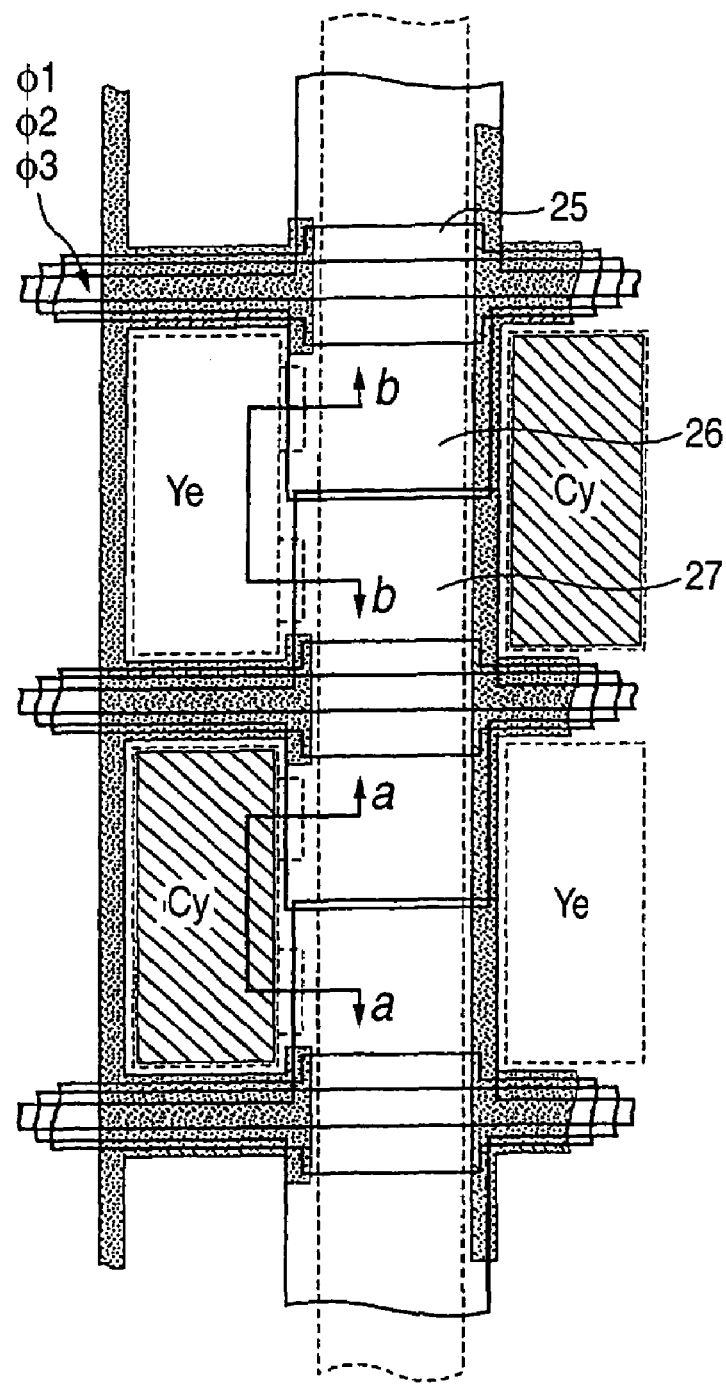
FIG. 13 is a plan view showing four light-receiving sections (four pixels) of the CCD color solid-state image pickup device shown in FIG. 10.

FIG. 13 is a view showing a transfer electrode of a color solid-state image pickup device of the embodiment. In the embodiment, transfer electrodes 25, 26, and 27 have a triple-layer polysilicon structure and are constituted of interline CCDs which can read all pixels. The second polysilicon electrode 26 and the third polysilicon electrode 27 constitute read gate electrodes. When a read voltage is applied to the respective read gate electrodes, a signal electric charge is read to the vertical transfer path 22 from the corresponding signal electric charge storage section.

Figure 14A:
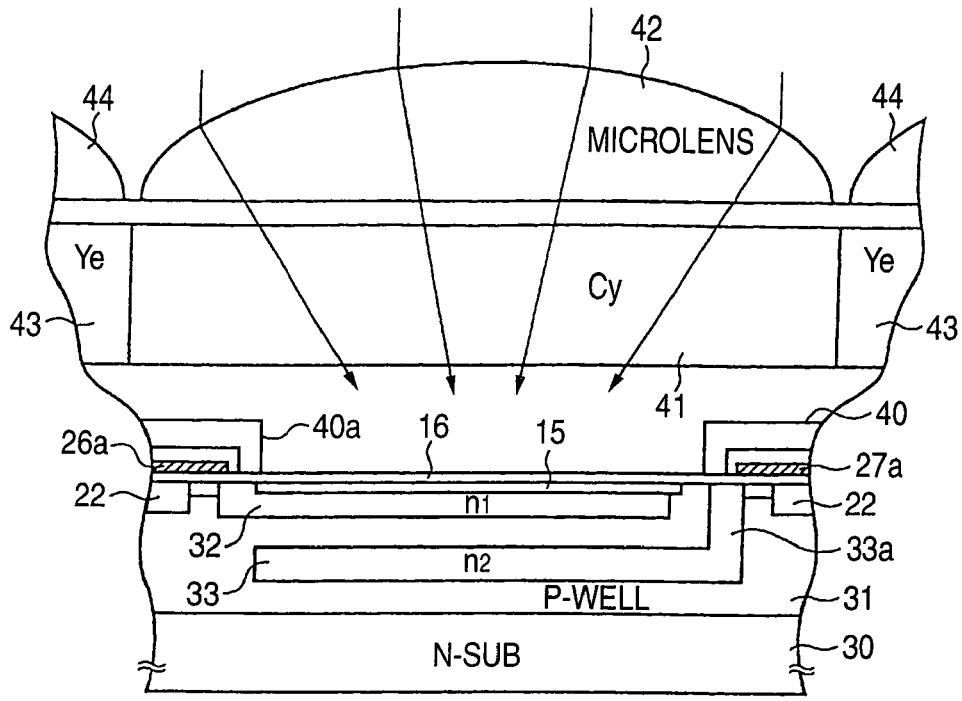
FIG. 14A is a cross-sectional view taken along line a-a shown in FIG. 13.
Figure 14B:
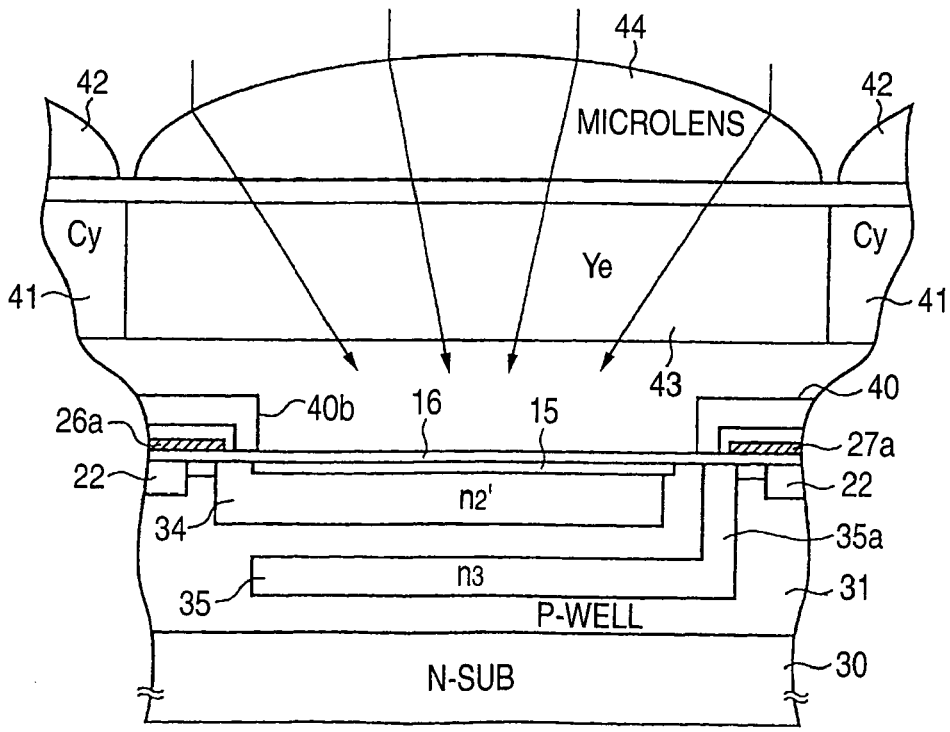
FIG. 14B is a cross-sectional view take along line b-b shown in FIG. 13.

FIG. 14A is a cross-sectional view taken along line a-a shown in FIG. 13; that is, a cross-sectional view of a light-receiving section with the Cy filter stacked thereon; and FIG. 14B is a cross-sectional view taken along line b-b shown in FIG. 13; that is, a cross-sectional view of a light-receiving section with a Ye filter stacked thereon.

In FIG. 14A, a P well layer 31 is formed on the surface of an n-type semiconductor substrate 30 of the color solid-state image pickup device of the embodiment. Signal electric charge storage layers 32, 33 (color signal detecting layers) are formed from a two-layer N+ structure within the P well layer 31 so as to be separated from each other in a depthwise direction.

A storage layer (n1) 32 provided in a surface section extends up to a position below the read gate electrode 26a formed from a portion of the transfer electrode. The signal electric charges primarily produced from an incident light component of short wavelength (e.g., B) are stored in the storage layer 32 provided at the most shallow position with respect to the depthwise direction of the semiconductor substrate 30. In this structure, only the electric charges stored in the storage layer 32; that is, the electric charges produced primarily from light of short wavelength, are read to the vertical transfer path 22.

The second storage layer (n2) 33 has, at an end section thereof, an N+ region (i.e., a charge path) 33a which extends up to the surface of the semiconductor substrate 30. This N+ region 33a extends up to a position below a read gate electrode 27a formed from a portion of the transfer electrode. The signal electric charges formed from light of intermediate wavelength (e.g., G) are stored in the this storage layer 33. In this structure, the electric charges stored in the storage layer 33; that is, the electric charges produced primarily from the light of intermediate wavelength (G), are read to the vertical transfer path 22.

A light-shielding film 40 having openings to oppose a light-receiving surface of the light-receiving section is placed on top of the light-receiving section in which the storage layers 32, 33 of such a configuration are formed. A Cy filter 41 and a microlens 42 are stacked on the light-shielding film 40. Light is gathered by the microlens 42, and the incident light— for which light of a red (R) wavelength is blocked by the Cy filter—41 enters the light-receiving section by way of an opening 40a of the light-shielding film 40.

As in the case of the first embodiment, the P+ layer 15 and the $SiO_2$ film 16 are provided on the top surface of the semiconductor substrate 30.

In FIG. 14B, signal electric charge storage layers 34, 35 (color signal detecting layers) are formed from an N+ layer of two-layer structure within the P well layer 31, which is formed on the surface of the n-type semiconductor substrate 30, so as to be separated from each other in the depthwise direction.

The storage layer (n2') 34 of the surface section is formed up to about the same depth as that of the storage layer 33 shown in FIG. 14A. The end section of the storage layer 34 extends up to a position below the read gate electrode 26a formed from a portion of the transfer electrode 26. The signal electric charges primarily produced from an incident light component of intermediate wavelength (e.g., G) are stored in the end section of the storage layer 34. In this structure, only the electric charges stored in the storage layer 34; that is, the electric charges produced primarily from light of intermediate wavelength, are read to the vertical transfer path 22.

The storage layer (n3) 35 formed at a deep position of the P well layer 31 has, at an end section thereof, an N+ region (i.e., a charge path) 35a which extends up to the surface of the semiconductor substrate 30. This N+ region 35a extends up to a position below the read gate electrode 27a formed from a portion of the transfer electrode 27. The signal electric charges formed from light of long wavelength (e.g., R) are stored in the this storage layer 35. In this structure, only the electric charges stored in the storage layer 35 are read to the vertical transfer path 22.

An opening 40b of the light-shielding film 40 is also placed also on the light-receiving section in which the storage layers 34, 35 of such a configuration are formed. A Ye filter 43 and a microlens 44 are stacked on the opening 40b. Light is gathered by the microlens 44, and the incident light—for which light of a blue (B) wavelength is blocked by the Ye filter 43—enters the light-receiving section by way of the opening 40b of the light-shielding film 40. Similarly, a P+ layer 15 and a $SiO_2$ film 16 are formed on the top surface of the semiconductor substrate 30.

The storage layer 34 of the embodiment is distributed up to the surface of the substrate. However, light corresponding to B light of short wavelength is blocked by the Ye filter. Hence, the storage layer 34 has no sensitivity against incident B light. Therefore, no particular restrictions are imposed on the distribution of the storage layer 34 in a depth direction. The storage layer 34 may be formed in the same structure as that of the storage layer 33 shown in FIG. 14A (i.e., a structure in which the storage layer is not distributed up to the neighborhood of the surface of the semiconductor substrate).

Figure 15A:
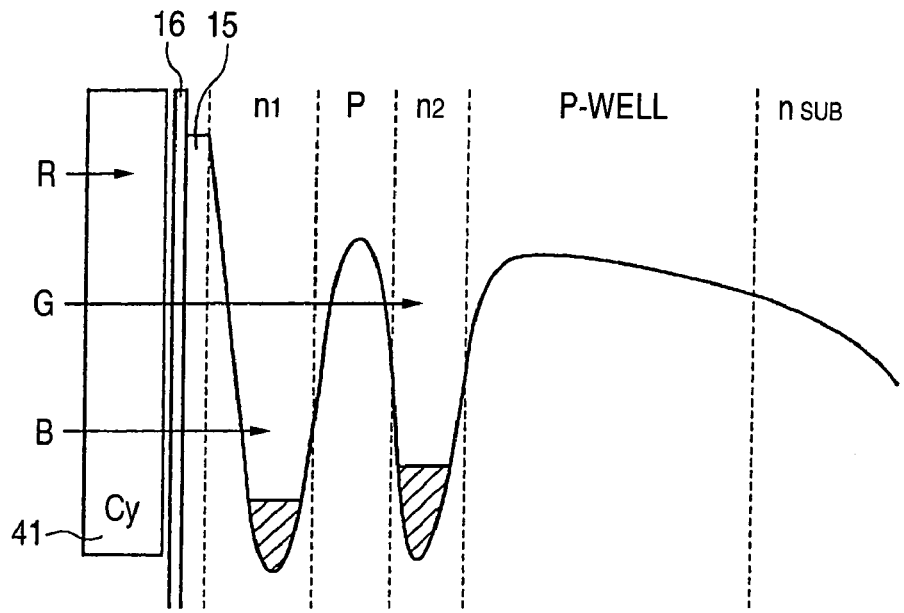
FIG. 15A is a view showing a relationship between a distance over which light has entered and traveled through a cyan filter Cy in a silicon substrate and a storage layer of the second embodiment.
Figure 15B:
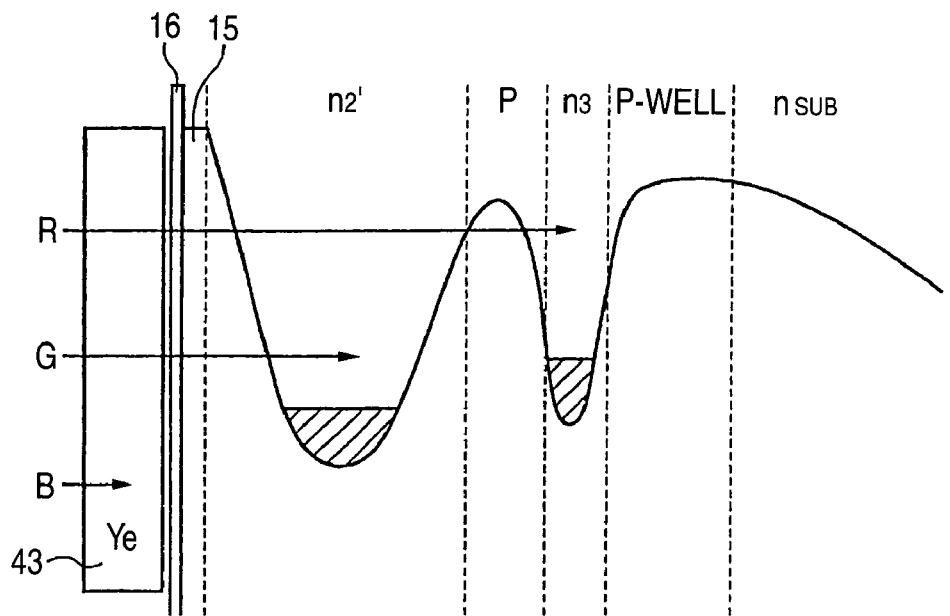
FIG. 15B is a view showing a relationship between a distance over which light has entered traveled through a yellow filter Ye in a silicon substrate and a storage layer of the second embodiment.

FIGS. 15A and 15B are conceptual renderings for the phenomenon that, in the solid-state image pickup device of the embodiment, distances over which the light signals having passed through the Cy filter 41 and the Ye filter 43 travel in the depthwise direction of the silicon substrate change according to wavelengths of the light signals.

As shown in FIG. 15A, in the light-receiving section on which the Cy filter 41 for blocking red (R) light is stacked, blue (B) light having the shortest wavelength is absorbed in the most shallow region of the silicon substrate, whereby electric charges corresponding to the quantity of B light are generated and then stored in the first storage layer n1. The green (G) light of an intermediate wavelength reaches a position deeper than that at which the blue (B) light arrives, and hence large portions of produced electric charges are stored in the storage layer n2.

As shown in FIG. 15B, in the light-receiving section on which the Ye filter 43 for blocking the blue (B) light is stacked, green (G) light of intermediate wavelength is stored in the storage layer n2'. Similarly, electric charges produced from the R light of longest wavelength are stored in the storage layer n3 located at the deepest location of the silicon substrate.

In this way, even the CCD color solid-state image pickup device of the embodiment can realize an attempt to enhance sensitivity by increasing the utilization efficiency of incident light through use of the Cy and Ye filters of the filters of complementary color system. Moreover, the respective light-receiving sections can read primary color signals in a distinguishable manner, there by obviating a necessity for color signal separation computation processing. Therefore, an attempt can be made to realize faithful color reproduction and enhance image quality. Further, all the light-receiving sections can produce a green signal, and hence a high-resolution image can be obtained while the green signal is used as luminance information.

The embodiment has described a solid-state image pickup device having the light-receiving sections 21 arranged in a square grid pattern. The embodiment can be readily applied to a solid-state image pickup device having the light-receiving sections 21 arranged in a so-called honeycomb pattern.

THIRD EMBODIMENT

Figure 16:
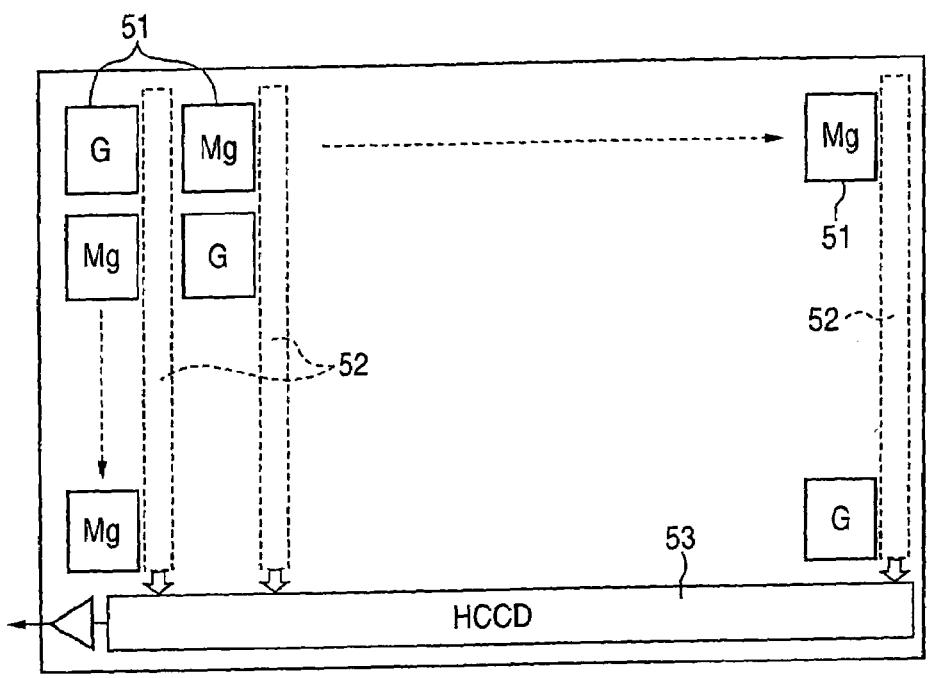
FIG. 16 is a schematic surface view of a CCD color solid-state image pickup device of single plate type according to a third embodiment of the invention.

FIG. 16 is a schematic surface view of a CCD color solid-state image pickup device of single plate type according to a third embodiment of the invention. In the drawing, a light-receiving section 51 is represented by a rectangle, and a plurality of light-receiving sections 51 are arranged in an array. In the embodiment, the light-receiving sections 51 are arranged in a square grid pattern. A vertical transfer path 52 (signal reading unit) is formed between horizontally-adjacent light-receiving sections 51. Signal electric charges read from the light-receiving section 51 to the vertical transfer path 52 are transferred to a horizontally transfer path 53 placed at a downward position.

A green (G) filter, which is one of the filters of primary colors, and a magenta (Mg) filter, which is one of the filters of the complementary color system, are alternately stacked on the light-receiving sections 51 of the present embodiment in both the vertical and horizontal directions. In the embodiment, incident light components which have not been blocked by the color filters (G, Mg) are read independently as signal components of the primary color system (R, G, B).

Specifically, B and R signals are output from the light-receiving section 51 with the Mg filter stacked thereon. Therefore, the primary color signal component of one color (G) is output from the light-receiving sections 51 having the G filter by twice performing operations for receiving electric charges from the light-receiving sections and transferring the thus-read electric charges to the VCCD and HCCD. Further, two primary color signal components of two colors (R, B) are output from the light-receiving section having the Mg filter.

Figure 17:
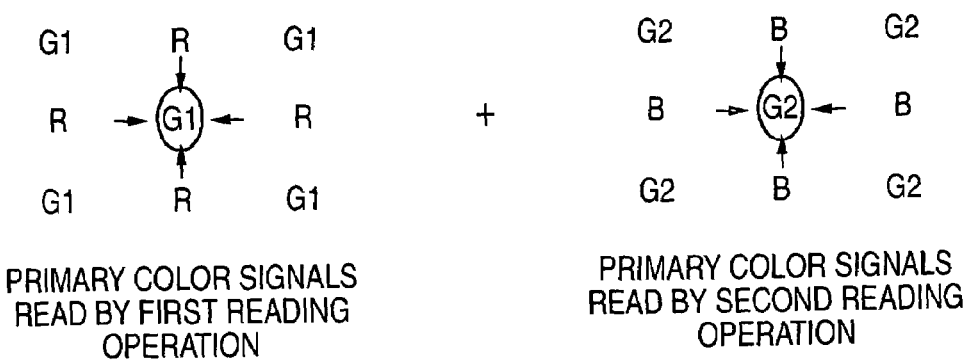
FIG. 17 is a descriptive view for reproducing colors from color signals read from the CCD color solid-state image pickup device shown in FIG. 16 by two reading operations.

Of the three primary colors, only one color (G) component is output from the light-receiving section 51 with the G filter stacked thereon. As shown in FIG. 17, G signals (a first signal is G1, and a second signal is G2) read through two reading operations are used at this light-receiving position while being added together. A remaining R color is obtained by averaging peripheral R signals, and a remaining B color is obtained by averaging peripheral B signals.

Of the three primary colors, two colors (R, B) are obtained from the light-receiving sections with the Mg filter stacked thereon. Four peripheral G1 signals and four peripheral G2 signals are used for determining the remaining G signal.

Figure 18:
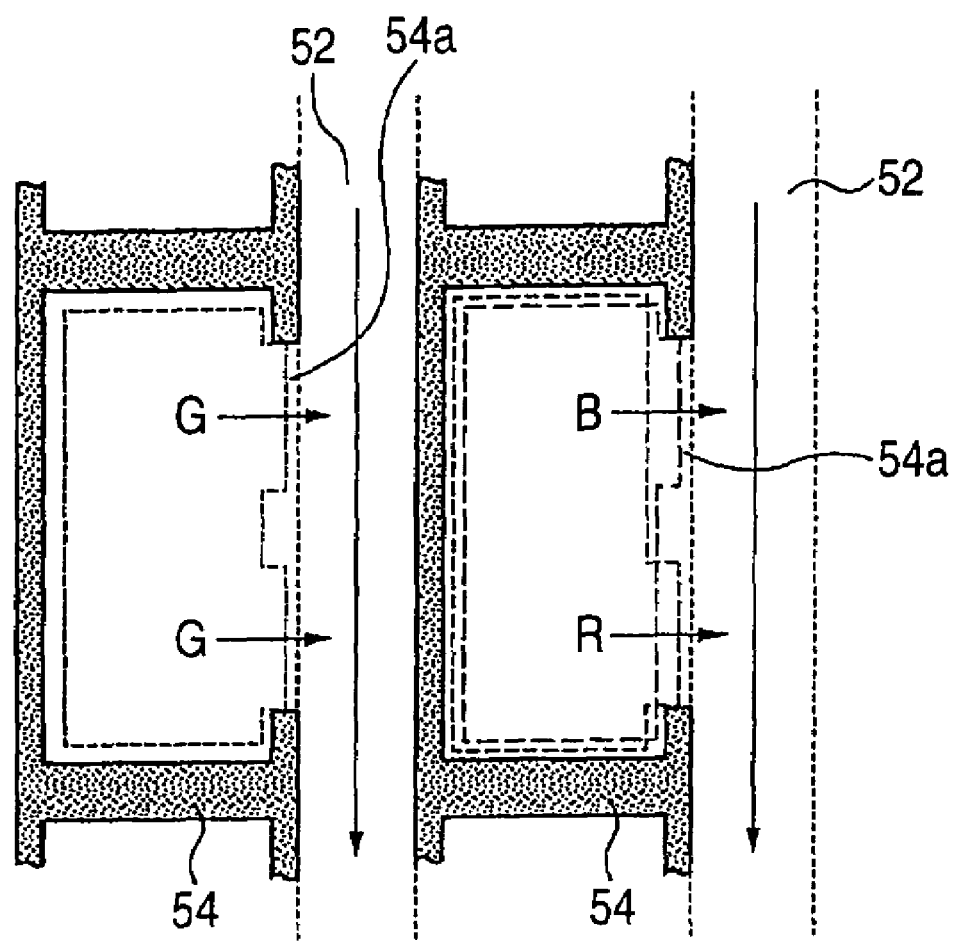
FIG. 18 is a plan view showing a pattern of element isolation regions corresponding to two horizontally-adjacent light-receiving sections (two pixels) of the CCD color solid-state image pickup device shown in FIG. 16.

FIG. 18 is a plan view showing two pixels of the light-receiving section 51 and the vertical transfer path laid between the horizontally-adjacent light-receiving sections, both pertaining to the present embodiment. Each light-receiving section is surrounded by a C-shaped element isolation region 54. Signal electric charges are read to the vertical transfer path 52 from a gate section 54a where the element isolation region 54 is not present.

Figure 19:
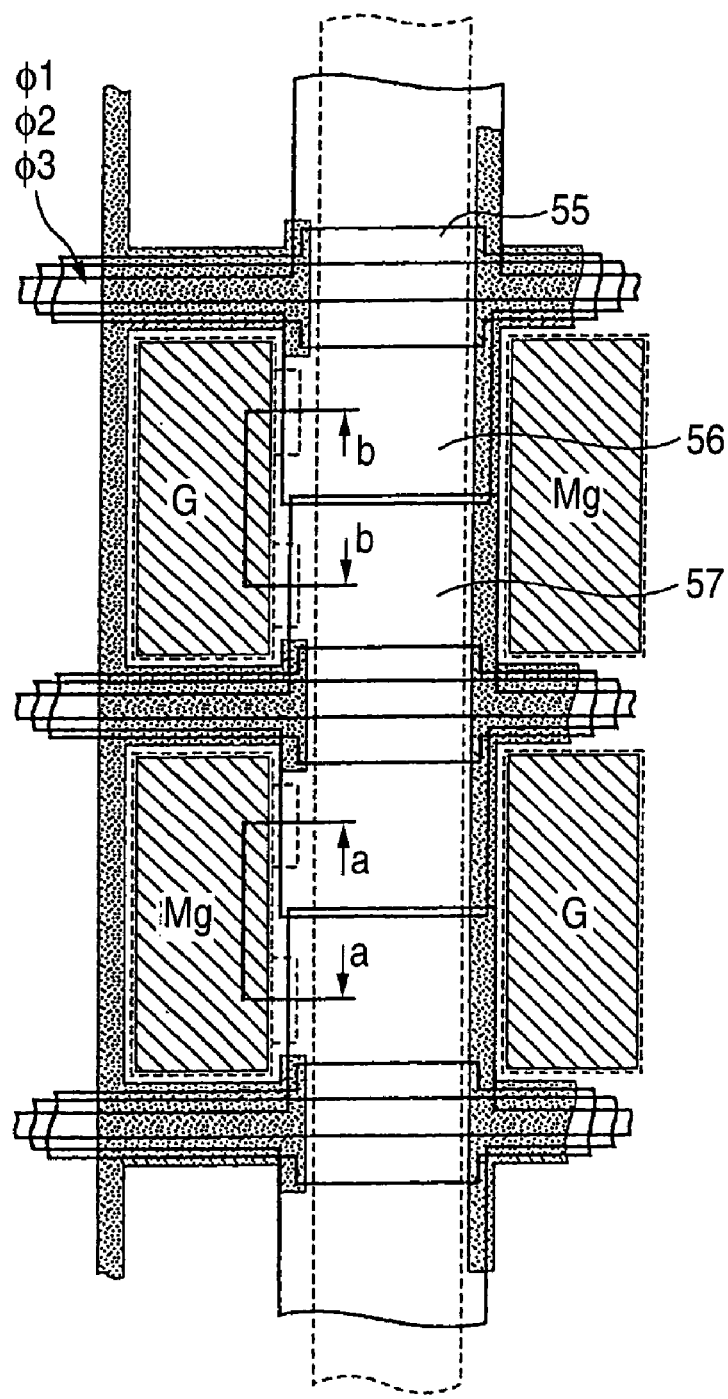
FIG. 19 is a plan view showing four light-receiving sections (four pixels) of the CCD color solid-state image pickup device shown in FIG. 16.

FIG. 19 is a view showing a transfer electrode of a color solid-state image pickup device of the embodiment. In the embodiment, transfer electrodes 55, 56, and 57 have a triple-layer polysilicon structure and constitute interline CCDs which can read all pixels. The second polysilicon electrode 56 and the third polysilicon electrode 57 constitute read gate electrodes. When a read voltage is applied to the respective read gate electrodes, a signal electric charge is read to the vertical transfer path 52 from the corresponding signal electric charge storage section.

Figure 20A:
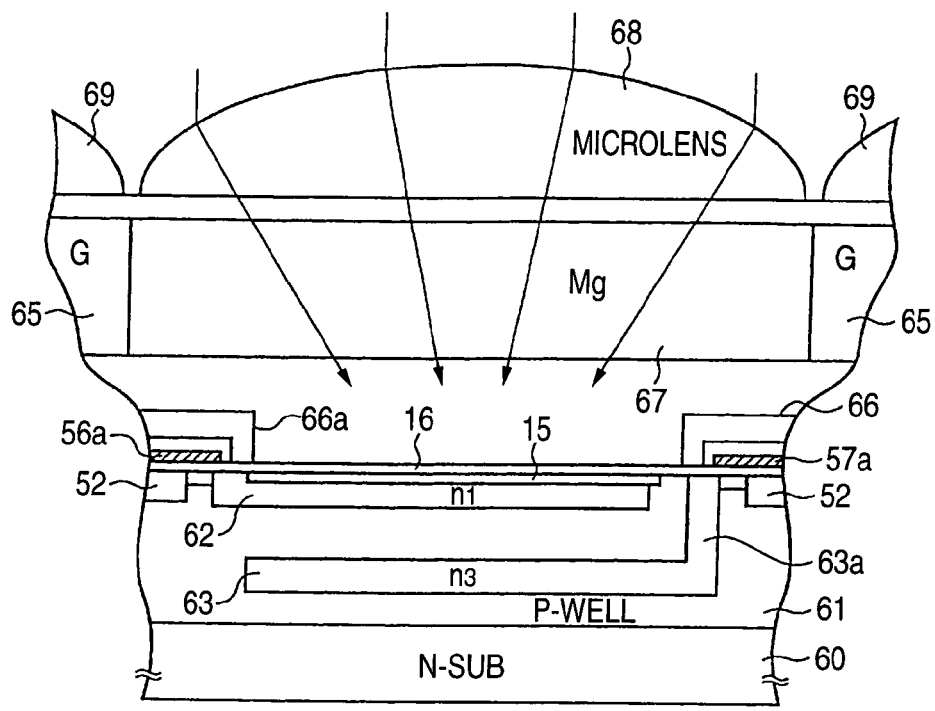
FIG. 20A is a cross-sectional view taken along line a-a shown in FIG. 19.
Figure 20B:
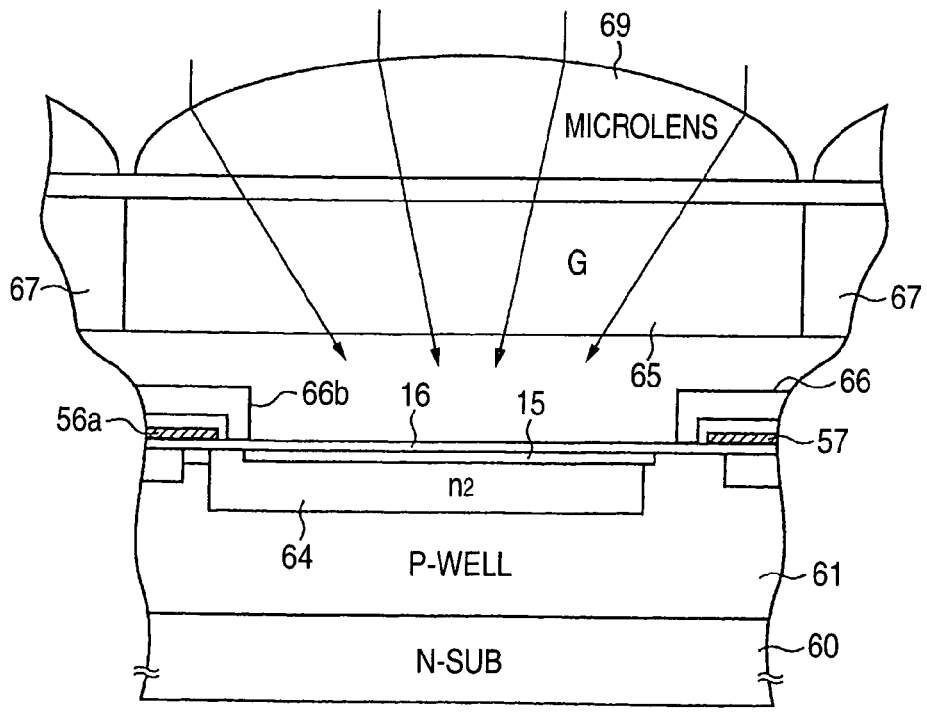
FIG. 20B is a cross-sectional view take along line b-b shown in FIG. 19.

FIG. 20A is a cross-sectional view taken along line a-a shown in FIG. 19; that is, a cross-sectional view of a light-receiving section with the Mg filter stacked thereon; and FIG. 20B is a cross-sectional view taken along line b-b shown in FIG. 19; that is, a cross-sectional view of a light-receiving section with a G filter stacked thereon.

In FIG. 20A, a P well layer 61 is formed on the surface of an n-type semiconductor substrate 60 of the color solid-state image pickup device of the embodiment. Signal electric charge storage layers 62, 63 (color signal detecting layers) are formed from a two-layer N$^+$ structure within the P well layer 61 so as to be separated from each other in a depthwise direction.

The storage layer (n1) 62 provided in a surface section extends up to a position below the read gate electrode 56a formed from a portion of the transfer electrode. The signal electric charges primarily produced from an incident light component of short wavelength (e.g., B) are stored in the storage layer 62 provided at the most shallow position with respect to the depthwise direction of the semiconductor substrate 60. In this structure, only the electric charges stored in the storage layer 62; that is, the electric charges produced primarily from light of short wavelength, are read to the vertical transfer path 52.

The second storage layer (n3) 63 has formed at a deep location, at an end section thereof, an N$^+$ region (i.e., a charge path) 63a which extends up to the surface of the semiconductor substrate 60. This N$^+$ region 63a extends up to a position below a read gate electrode 57a formed from a portion of the transfer electrode. The signal electric charges formed from light of long wavelength (e.g., R) are stored in the this storage layer 63. In this structure, the electric charges stored in the storage layer 63; that is, the electric charges produced primarily from the light of long wavelength (R), are read to the vertical transfer path 52.

A light-shielding film 66 having openings 66a to oppose a light-receiving surface of the light-receiving section is placed on top of the light-receiving section in which the storage layers 62, 63 of such a configuration are formed. A Mg filter 67 and a microlens 68 are stacked on the light-shielding film 66. Light is gathered by the microlens 68, and the incident light—for which light of a green (G) wavelength is blocked by the Mg filter 67—enters the light-receiving section by way of the opening 66a of the light-shielding film 66.

In the present embodiment, the signal electric charges produced from the incident light component of the short wavelength B and that of the long wavelength R, which are spaced away from each other, are stored in the respective storage layers 62, 63. The storage layers 62, 63 can be formed at positions spaced apart from each other in the depthwise direction of the semiconductor substrate. The storage layers 62, 63 are readily formed separately.

As in the case of the first and second embodiments, the P$^+$ layer 15 and the SiO$_2$ film 16 are provided on the top surface of the semiconductor substrate 60.

In FIG. 20B, a signal electric charge storage layer (n2) 64 (color signal detecting layer) formed from an N$^+$ layer of single-layer structure is formed at a surface section within the P well layer 61 formed at a position close to the surface side of the n-type semiconductor substrate 60. The depth of the storage layer 64 is an intermediate depth between the depth of the storage layer 62 and that of the storage layer 63, both being shown in FIG. 20A.

The end section of the storage layer 64 extends up to a position below the read gate electrodes 56a, 57a formed from portions of the transfer electrodes 56, 57. The signal electric charges primarily produced from an incident light component of intermediate wavelength (e.g., G) are stored in the end section of the storage layer 64. In this structure, only the electric charges stored in the storage layer 64; that is, the electric charges produced primarily from light of intermediate wavelength, are read to the vertical transfer path 52 through two operations.

A light-shielding film 66 having openings 66b is also placed on top of the light-receiving section in which the storage layer 64 of such a configuration is formed. A G filter 65 and a micro lens 69 are stacked on the light-shielding film 66. Light is gathered by the microlens 69, and the incident light—for which light of a red (R) wavelength and light of a blue (B) wavelength are blocked by the G filter 41—enters the light-receiving section by way of the opening 66b of the light-shielding film 66.

In contrast with the first and second embodiments, the color solid-state image pickup device of the embodiment has one or two storage layers in the depthwise direction of the substrate. The storage layers n1(62), n2(64), and n3(63) are arranged in the sequence of increasing sequence. Depths of the storage layers are set in the sequence of increasing depth such that B light signal electric charges, G light signal electric charges, and R light signal electric charges are stored.

The storage layer (n2) 64 is distributed up to the vicinity of the surface of the substrate. However, the G filter is stacked on the storage layer, and hence the B signal does not reach the storage layer 64. Therefore, the storage layer does not have any sensitivity to B. Accordingly, no particular problem of a color mixture or the like arises.

As in the case of the first and second embodiments, the electric charges of the respective storage layers can be read to the vertical transfer path independently. Specifically, single ends of the respective storage layers located in the $N^+$ region extend up to the neighborhood of different read gate sections. The electric charges stored in the storage layers can be read to the vertical transfer path by application of a read pulse ($\Phi v$).

In the embodiment, the G signal is read from the same storage layer 64 through two reading operations. However, all the stored electric charges may be read from the storage layer 64 by the first reading operation.

Figure 21A:
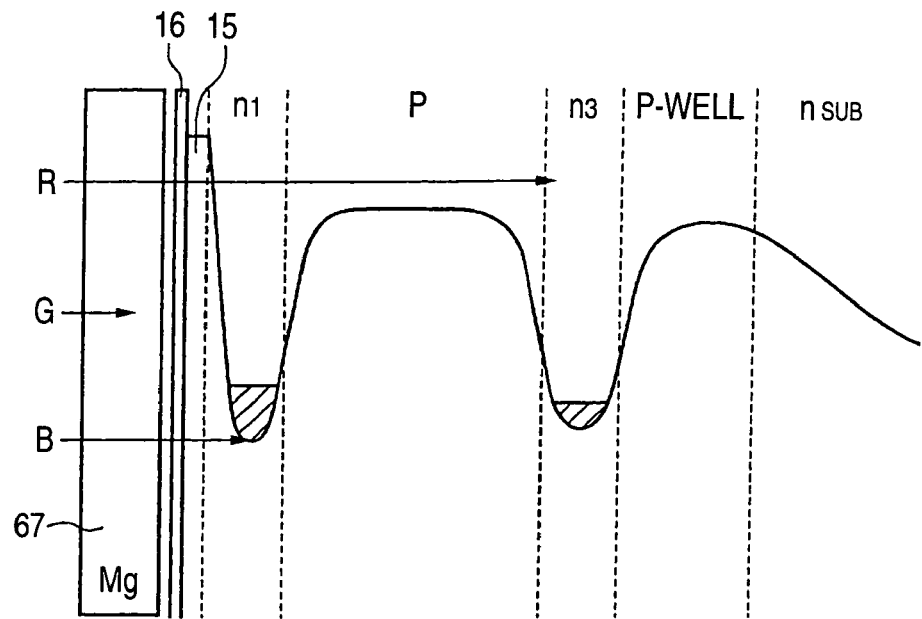
FIG. 21A is a view showing a relationship between a distance over which light has entered and traveled through a magenta filter Mg in a silicon substrate and a storage layer of the third embodiment.
Figure 21B:
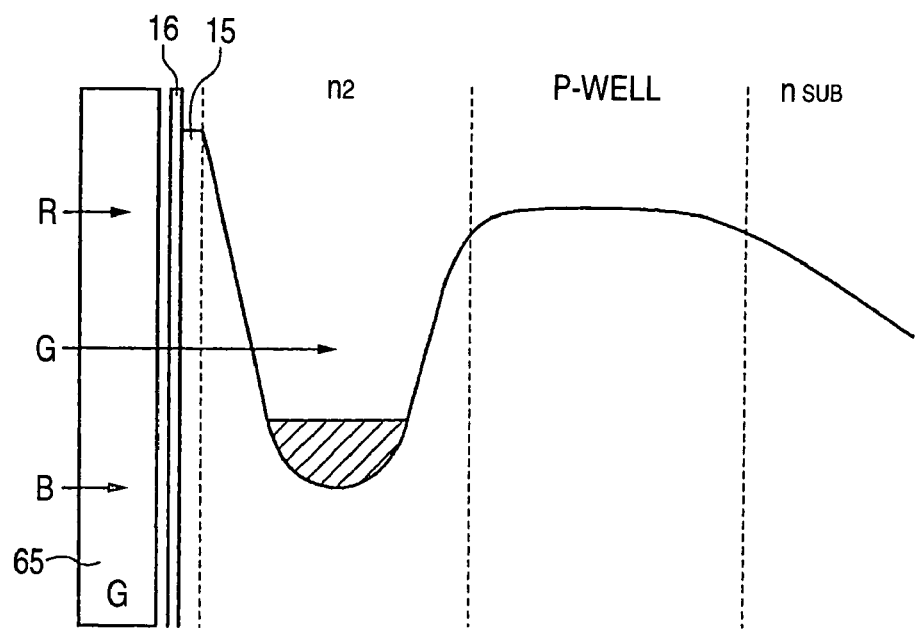
FIG. 21B is a view showing a relationship between a distance over which light has entered and traveled through a green filter G in a silicon substrate and a storage layer of the third embodiment.

FIGS. 21A, 21B are conceptual renderings for describing the solid-state image pickup device of the embodiment, wherein the light signals having passed through the Mg filter 67 and the G filter 65 travel over different distances in the silicon substrate in the depthwise direction thereof for reasons of the wavelengths of the light signals.

The B light, which is of the shortest wavelength, is absorbed at the most shallow region of the silicon substrate, thereby producing electric charges. The thus-produced electric charges are stored in the first storage layer n1. The G light, formed from an intermediate wavelength, reaches the position which is deeper than that achieved by the light B. Hence, the majority of the produced electric charges is stored in the storage layer n2. Similarly, the electric charges produced by the R light of the longest wavelength are stored in the storage layer n3 located at the deepest location of the silicon substrate.

Figure 22:
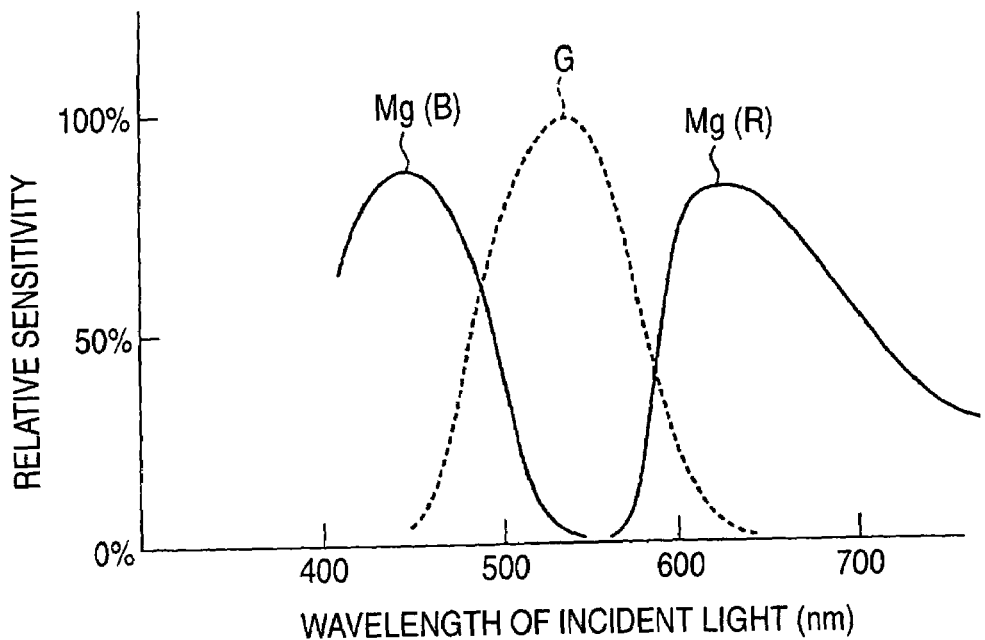
FIG. 22 is a view showing a spectral sensitivity spectra of the primary color signals produced by the color solid-state image pickup device of the third embodiment of the invention.

FIG. 22 is a plot showing that a spectral sensitivity spectrum of the G signal output from the light-receiving section having the green filter stacked thereof is superimposed on spectral sensitivity spectra of the B and R signals output from the light-receiving sections having the magenta filter of the embodiment stacked thereon.

In the solid-state image pickup device using the filters of complementary color system and the green filter, the green filter is embodied by superimposing two color filters; that is, a cyan filter and a yellow filter, one on top of the other for manufacturing reasons. Because, use of a plurality of kinds of color filters is not usually desired. Therefore, the spectrum of the green signal produced by such filters fails to be ideal.

However, since the filter of complementary color system of the embodiment is only magenta, there is no necessity for superimposing cyan and yellow filters one on top of the other in order to implement a green filter. Only one green filter of primary color system can be provided. Further, the magenta filter permits passage of the B and R signals whose wavelengths are separated from each other. Hence, as shown in FIG. 22, the spectral sensitivity spectra of the R, G, and B signals obtained in the embodiment become close to the ideal spectral sensitivity spectra which involves a smaller overlap and effects superior color separation. Therefore, color reproduction more faithful than that achieved in the first and second embodiments can be realized by means of subjecting the color signals produced by the solid-state image pickup device of the embodiment to image processing.

As mentioned above, even in the present embodiment, an attempt can be made to enhance sensitivity by means of increasing the utilization factor of incident light through use of the Mg filter from among the filters of complementary color system. Moreover, each light-receiving section can directly read the primary color signal by means of making a distinction between color signals. A necessity for color signal separation processing operation is obviates, thereby enabling faithful reproduction of colors and rendering image quality high.

Although the present embodiment has described the solid-state image pickup device having the light-receiving sections 21 arranged in a square grid pattern, the present embodiment can also be applied to a solid-state image pickup having the light-receiving sections 21 arranged in a so-called honeycomb pattern.

FOURTH EMBODIMENT

Figure 23:
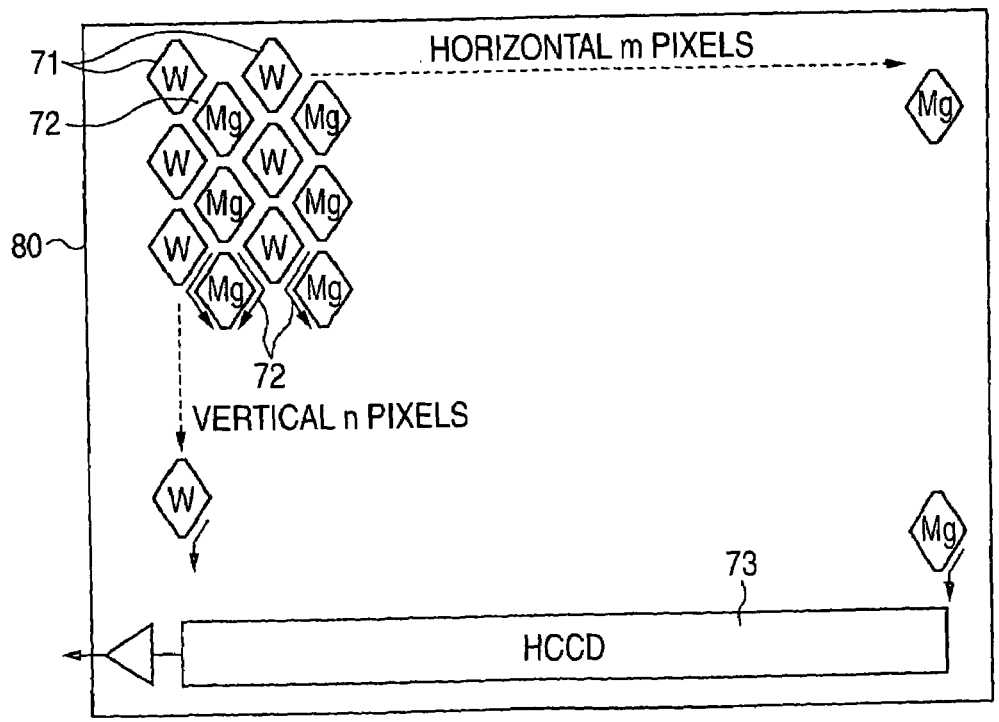
FIG. 23 is a schematic surface view of a CCD color solid-state image pickup device of single plate type according to a fourth embodiment of the invention.

FIG. 23 is a schematic surface view of a CCD color solid-state image pickup device of single plate type according to a fourth embodiment of the invention. In this CCD color solid-state image pickup device, a plurality of light-receiving sections 71 are formed in the form of an array on the surface of a semiconductor substrate 80. In an illustrate embodiment, each light-receiving section 71 is represented by a rhombus.

The arrangement of pixels of the present embodiment is identical with that described in connection with the first embodiment; that is, a so-called honeycomb pixel arrangement formed by offsetting the light-receiving sections 71 by half pitches in both the vertical and horizontal directions. A vertical transfer path 72 (signal reading unit) is formed between adjacent light-receiving sections 71, and signal electric charges read from the respective light-receiving sections 71 to the vertical transfer path 72 are transferred in a meandering manner to a horizontal transfer path 73 located at a downward position.

In the embodiment, Mg filters are stacked on the respective light-receiving sections 71 provided in even columns, and instead of the color filters, mere transparent planarized films (also called "white filters") are stacked on the respective light-receiving sections 71 provided in odd columns. R signal electric charges formed from incident light components R which are not blocked by the Mg filter and B signal electric charges formed from incident light components B which are not blocked by the Mg filter are stored in a distinguished manner in the light-receiving sections 71 with the Mg filter stacked thereon. The R, B signal electric charges are read independently, and the light-receiving sections 71 having the W filter stacked thereon have sensitivity to all visible rays.

Specifically, the light-receiving sections having the Mg filters output R and B signals, and signals output from the light-receiving sections having the W filters are formed by adding all the R, G, and B signal components. W1 and W2 signals output by two reading operations are added together and used as the W signals to be output from the light-receiving sections having the W filters.

Figure 24:
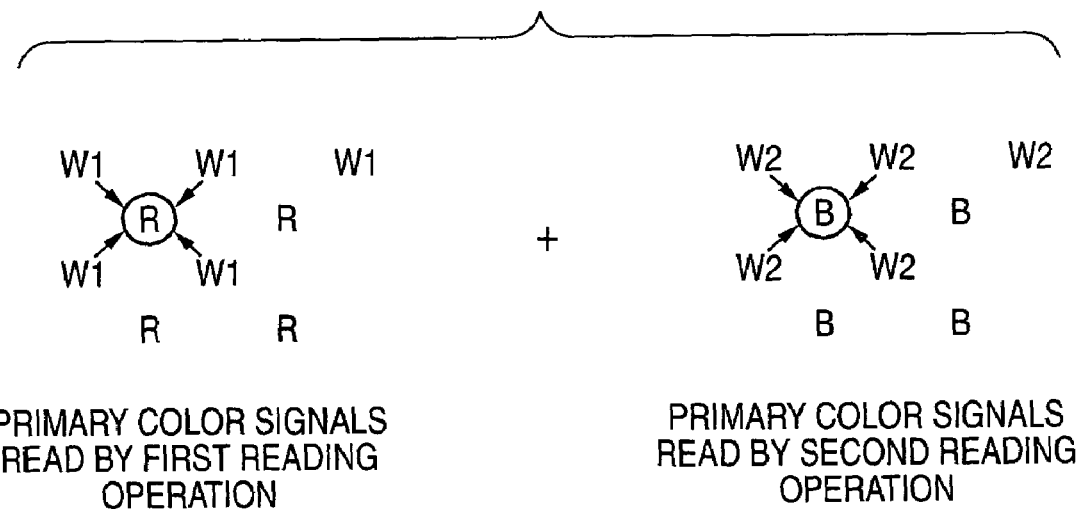
FIG. 24 is a descriptive view for reproducing colors from color signals read from the CCD color solid-state image pickup device shown in FIG. 23 by two reading operations.

Consequently, as a result of two operations for reading electric charges from the respective light-receiving sections and transferring the electric charges over the VCCD and HCCD, the light-receiving sections having the Mg filters stacked thereon output two primary color signal components R, B in such a manner as shown in FIG. 24. The light-receiving sections having the W filters stacked thereon output (R+G+B) signals formed by mixing R, G, and B.

Specifically, the magnitude of the R signal and that of the B signal are subtracted from the two primary color signals R, B, and a mean value (R+G+B) of four or eight peripheral W signals, thereby determining the G signal as color information pertaining to the location of the light-receiving section having the Mg filter.

The R signal is determined from a mean value of four peripheral R signals as color information pertaining the position of the light-receiving section having the W filter. The B signal is determined from a mean value of four peripheral B signals. The G signal is determined by subtracting the magnitude of the R signal and that of the B signal from the magnitude of the directly obtained W signal.

Figure 25:
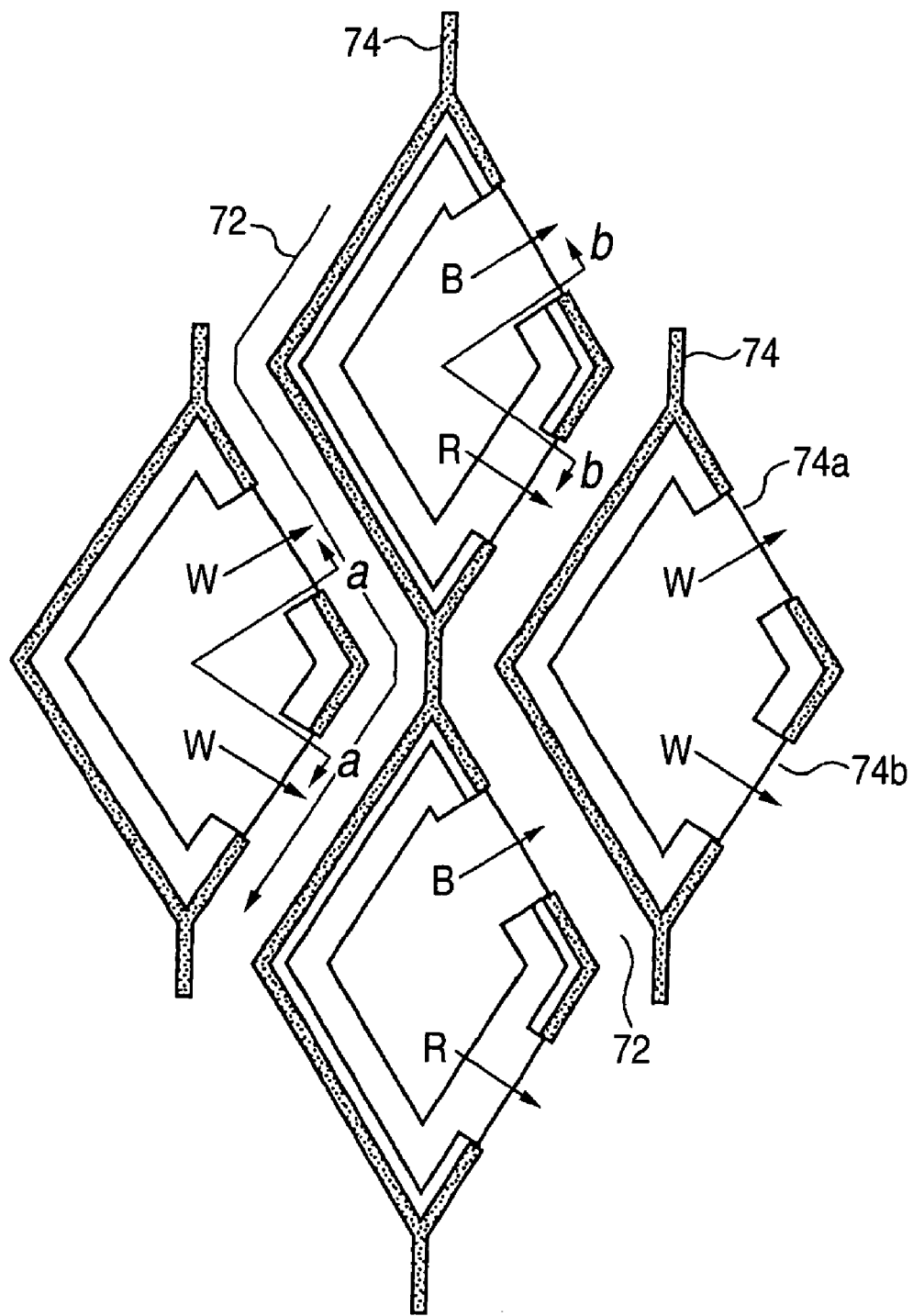
FIG. 25 is a plan view showing four light-receiving sections (four pixels) of the CCD color solid-state image pickup device shown in FIG. 23.

FIG. 25 is a plan view showing a pattern of four pixels of the light-receiving section 71 shown in FIG. 23 and a pattern of the vertical transfer path 72 laid between the light-receiving sections 71. The light-receiving sections 71 are partitioned from each other by means of rhombus element isolation regions 74. Of four sides of the rhombus, gate sections 74a, 74b are formed in two right sides where the element isolation region 74 is broken. When the B signal is read from the light-receiving section 71 having the Mg filter, the signal is read from the gate section 74a. When the R signal is read, the signal is read from the gate section 74b. The first W signal is read from the light-receiving section 71 having the W filter, by way of the gate section 74a. A second W signal is read by way of the gate section 74b. All the W signals of the light-receiving section 71 may be read by one W signal reading operation.

The transfer electrode structure provided on the vertical transfer path 72 is the same as that employed in the first embodiment; that is, two-layer polysilicon.

Figure 26A:
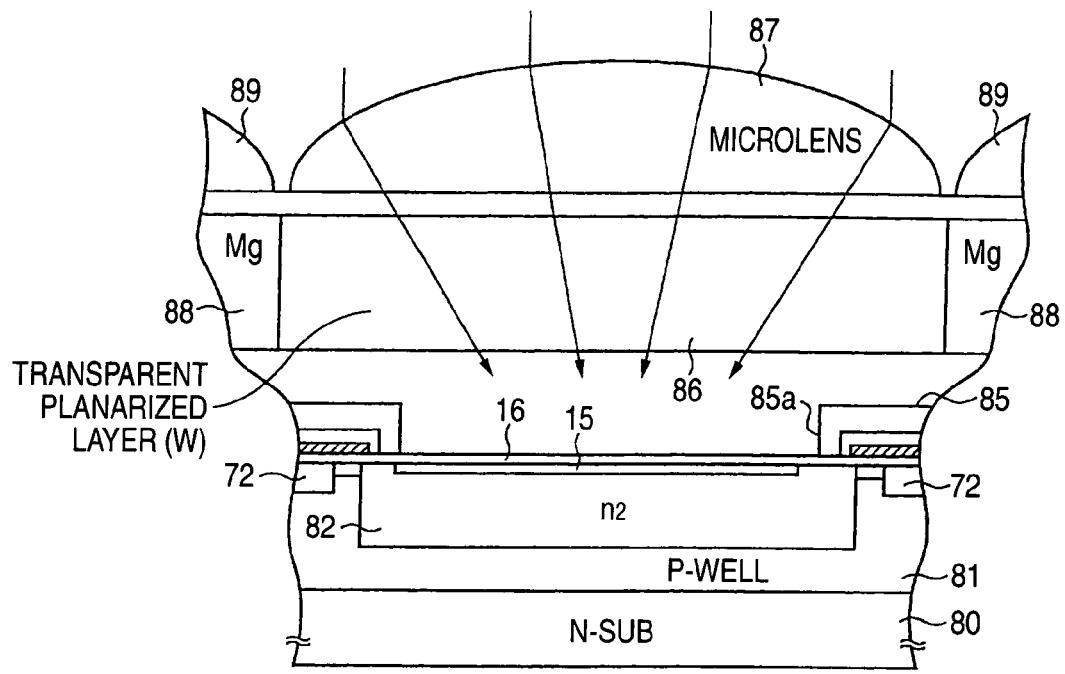
FIG. 26A is a cross-sectional view taken along line a-a shown in FIG. 25.

FIG. 26A is a cross-sectional view of the light-receiving section having a W filter taken along line a-a shown in FIG. 25. A P well layer 81 is formed on the surface of an n-type semiconductor substrate 80. A signal electric charge storage layer (n2) 82 (color signal detecting layer) which is as deep as 0.2 to 2.5 µm and formed from an $N^+$ layer is formed in the surface of the P well layer 81. As in the case of the first through third embodiments, the $P^+$ layer 15 and the $SiO_2$ film 16 are provided on the top surface of the light receiving section.

An opening 85a of a light-shielding film 85 is provided on a light-receiving surface of the light-receiving section. A transparent planarized film 86; that is, a W filter, is provided on the opening 85a. Further, a microlens 87 is provided at a position above the planarized film 86. The incident light gathered by the microlens 87 passes through the transparent planarized film 86, thereby entering the storage layer 82 with a small loss.

Figure 26B:
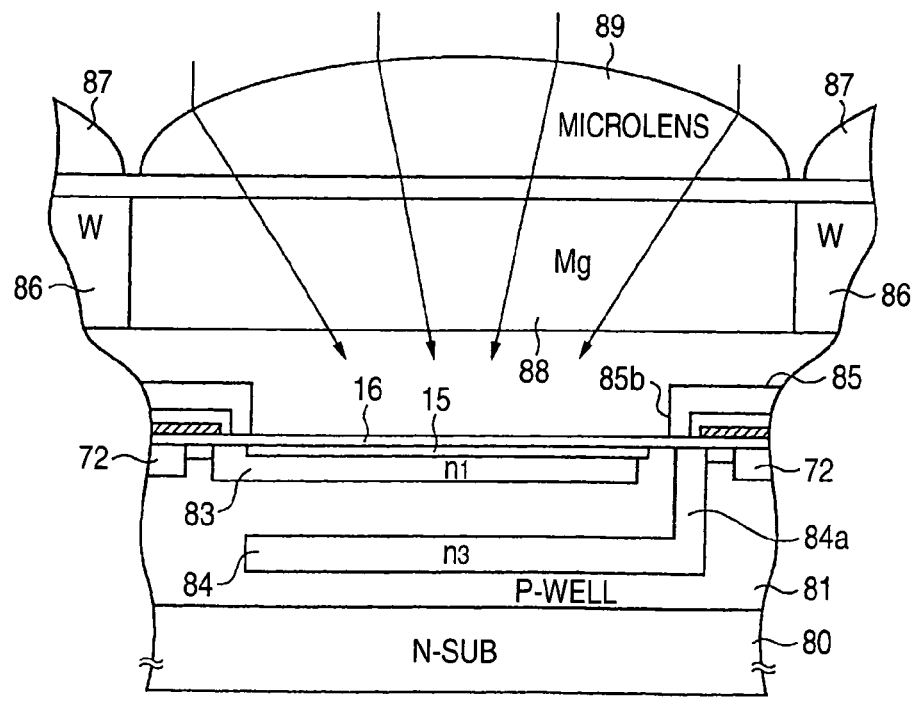
FIG. 26B is a cross-sectional view take along line b-b shown in FIG. 25.

FIG. 26B is a cross-sectional view taken along line b-b shown in FIG. 25; that is, a cross-sectional view of a light-receiving section having a Mg filter. Signal electric charge storage layers 83, 84 (color signal detecting layers), both being formed from an $N^+$ layer of two-layer structure, are formed separately in the P well layer 81 formed on the n-type semiconductor substrate 80. As mentioned above, the $P^+$ layer 15 and the $SiO_2$ film 16 are formed on top of the light-receiving section.

The storage layer (n1) 83 provided at the surface section extends up to a position below the read gate electrode formed from a portion of the transfer electrode. Signal-electric charges formed primarily from incident light components of short wavelength light (e.g., B) are stored in the storage layer 83 provided at the position most shallow with respect to the thicknesswise direction of the semiconductor substrate 80. In this structure, the electric charges stored in the storage layer 83; that is, only the electric charges produced primarily from light of short wavelength, are read to the vertical transfer path 72.

The storage layer (n3) 84 formed at a deep location has, at an end section thereof, an $N^+$ region (i.e., a charge path) 84a which extends up to the surface of the semiconductor substrate 80. This $N^+$ region 84a extends up to a position below the read gate electrode formed from a portion of the transfer electrode. The signal electric charges formed from light of long wavelength (e.g., R) are stored in the storage layer 84. In this structure, the electric charges stored in the storage layer 84; that is, electric charges produced primarily from the light (R) of long wavelength, are read to the vertical transfer path 72.

An opening 85b of a light-shielding film 85 is provided on the light-receiving section having the storage layers 83, 84 of such a structure in alignment with the light-receiving surface of the light-receiving section. Moreover, a Mg filter 88 and a microlens 89 are stacked on the openings 85b, and the microlens 89 gathers light. The incident light whose green (G) wavelength light is blocked by the Mg filter 88 enters the light-receiving section by way of the opening section 85b of the light-shielding film 85.

In relation to the storage layers n1 (83), n2 (82), and n3 (84), the storage layer n1 is the most shallow, and the storage layers n2, n3 are located at essentially the same depth. The storage layer n3 is localized at a spaced location so as not to contact the storage layer n1 located above the storage layer n3. In short, the storage layer n3 is selectively set to a depth such that the highest sensitivity is achieved by the wavelength component of R light. The storage layer n2 is distributed up to the neighborhood of the surface and to the same depth as that of the storage layer n3. The reason for this is that the incident light wavelength components in a visible range which can be perceived by the human eye are subjected to photoelectric conversion most efficiently and that the colorless (W) filter is stacked on the light-receiving section.

Figure 27A:
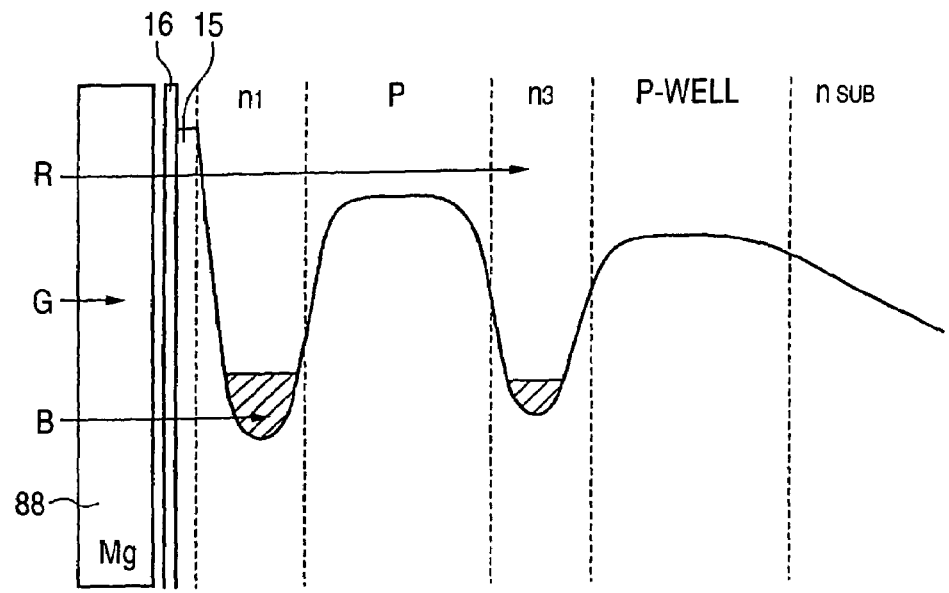
FIG. 27A is a view showing a relationship between a distance over which light has entered and traveled through a magenta filter Mg in a silicon substrate and a storage layer of the fourth embodiment.
Figure 27B:
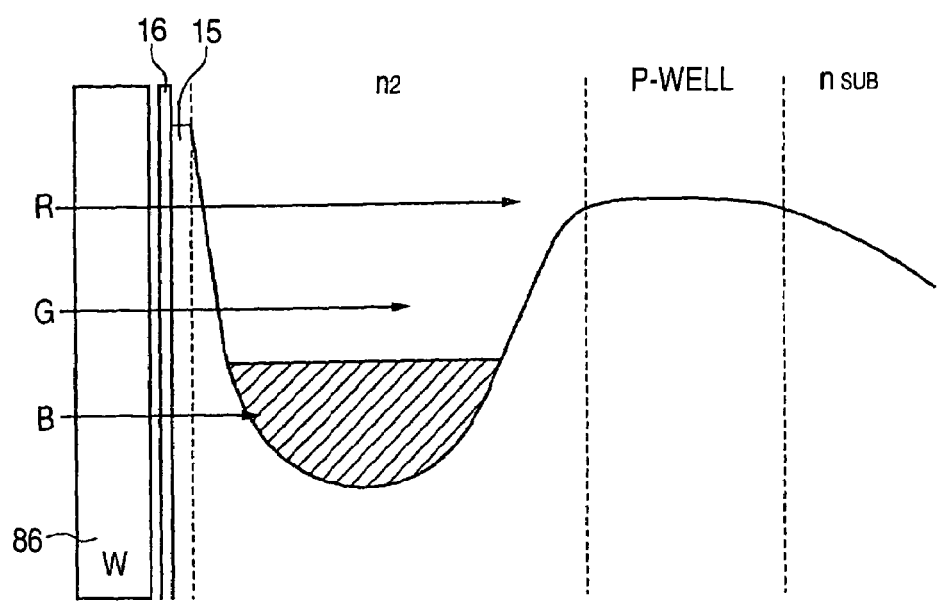
FIG. 27B is a view showing a relationship between a distance over which light has entered and traveled through a white filter W in a silicon substrate and a storage layer of the fourth embodiment.

FIGS. 27A and 27B are conceptual renderings for describing a difference in distances over which the light signals having passed through the Mg and W filters travel in the depthwise direction of the silicon substrate for reasons of their wavelengths. Specifically, the B light, which is of shortest wavelength, is absorbed by the most shallow region of the silicon substrate, thereby producing electric charges. The thus-produced electric charges are stored in the first storage layer n1. Similarly, the electric charges produced by the R light, which is of longest wavelength, are stored in the storage layer n3 located at the deepest position in the silicon substrate. The light-receiving sections, each having the W filter 86, must subject all the R, G, and B light beams to photoelectric conversion. Hence, the storage layer n2 is distributed widely from a shallow portion to a deep portion of the substrate.

Figure 28:
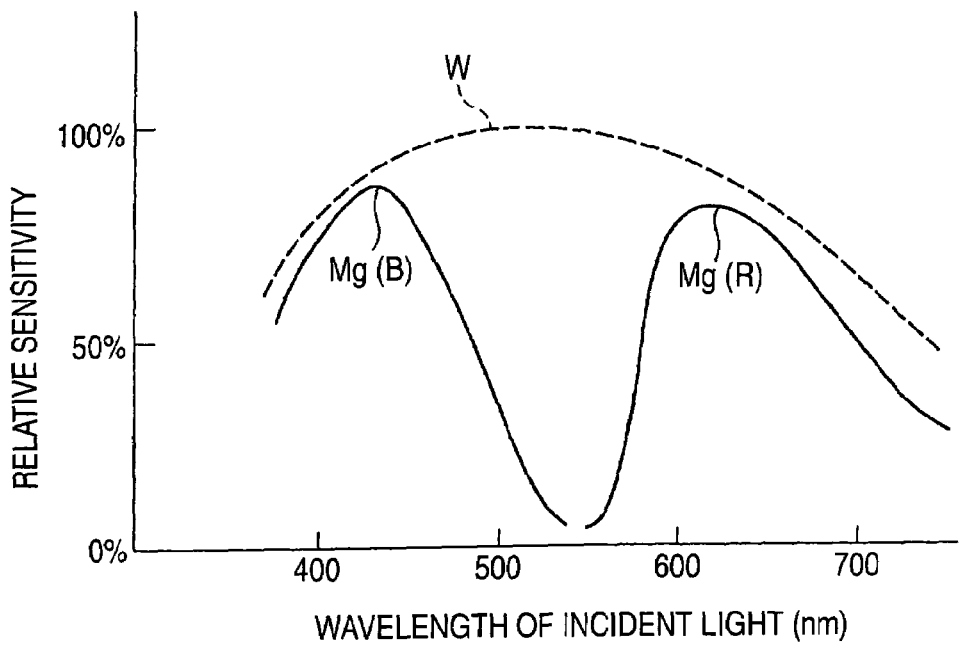
FIG. 28 is a view showing a spectral sensitivity spectra of the primary color signals produced by the color solid-state image pickup device of the fourth embodiment.

FIG. 28 is a view showing a spectral sensitivity spectrum of the color solid-state image pickup device of the embodiment. The B and R signals having passed through the magenta Mg filter are separated from each other without an overlap. The signal (W) of light (B+G+R) having passed through the W filter includes all visible light wavelength ranges and assumes a spectrum whose peak appears at the wavelength of the G signal (i.e., the neighborhood of a wavelength of 540 nm).

In the embodiment, particularly the light-receiving sections assigned the white (W) filters can utilize wavelength components of all visible ranges, and hence no substantial loss arises in the incident light component. When compared with a case where the complementary color filters are stacked on all the light-receiving sections as in the first case, an attempt can be made to enhance sensitivity to a much greater extent. Moreover, the present embodiment is also characterized in that a high-sensitivity luminance signal (R+G+B) is obtained directly without involvement of any particularly complicate signal processing operation. Since only the Mg filter is used as a color filter, a process for stacking color filters becomes easy.

The present embodiment has described a solid-state image pickup device having the respective light-receiving sections 71 arranged in a so-called honeycomb pattern. However, the present embodiment can also be applied to a solid-state image pickup device having the light-receiving sections 71 arranged in a square grid pattern.

FIFTH EMBODIMENT

Figure 29:
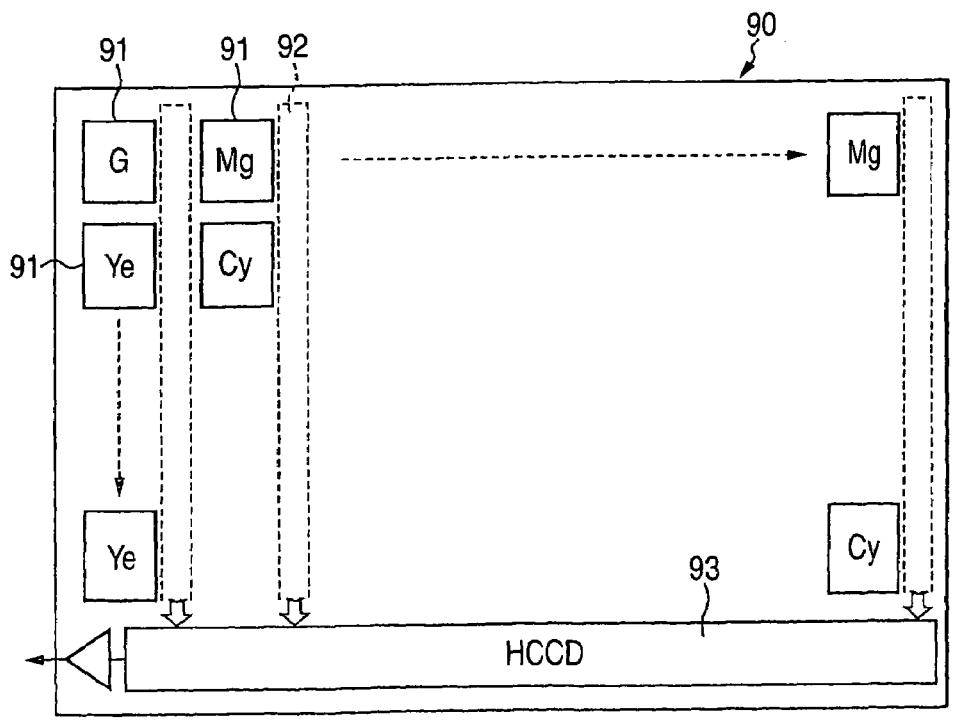
FIG. 29 is a schematic surface view of a CCD color solid-state image pickup device of single plate type according to a fifth embodiment of the invention.

FIG. 29 is a schematic surface view of a CCD color solid-state image pickup device according to a fifth embodiment of the invention. The present embodiment differs from the second embodiment only in that a green (G) filter, a magenta (Mg) filter, a yellow (Ye) filter, and a cyan (Cy) filter are stacked on respective light-receiving sections 91 arranged on a semiconductor substrate 90 in a square grid pattern. Color signal electric charges read from the respective light-receiving sections 91 to a vertical transfer path 92 (signal reading unit) are transferred to a horizontal transfer path 93. The cross-sectional structure of each light-receiving section 91 is the same as that of the light-receiving section on which the same color filter as that employed in the previous embodiment is stacked.

The only difference of the solid-state image pickup device of the embodiment lies in color filters to be stacked on the respective light-receiving sections. In relation to a color difference line sequential signal output from a CCD, by means of arrangement of the color filter of the embodiment, signals of "n" ("n" is an integer of 1 or more) lines are formed from green (G), yellow (Ye), cyan (Cy), and magenta (Mg), and a signal of n+1 lines is formed from magenta (Mg), yellow (Ye), cyan (Cy), and green (G). These signals are repeated.

Therefore, even when interlace reading (interlaced scanning) is performed, according to the embodiment R, G, and B color components are read independently. Hence, a color separation circuit is not required. Therefore, photographing of a high-quality image with low noise and superior color reproducibility becomes feasible, and an attempt can be made to simplify high-speed signal processing and a signal processing circuit.

SIXTH EMBODIMENT

Figure 30:
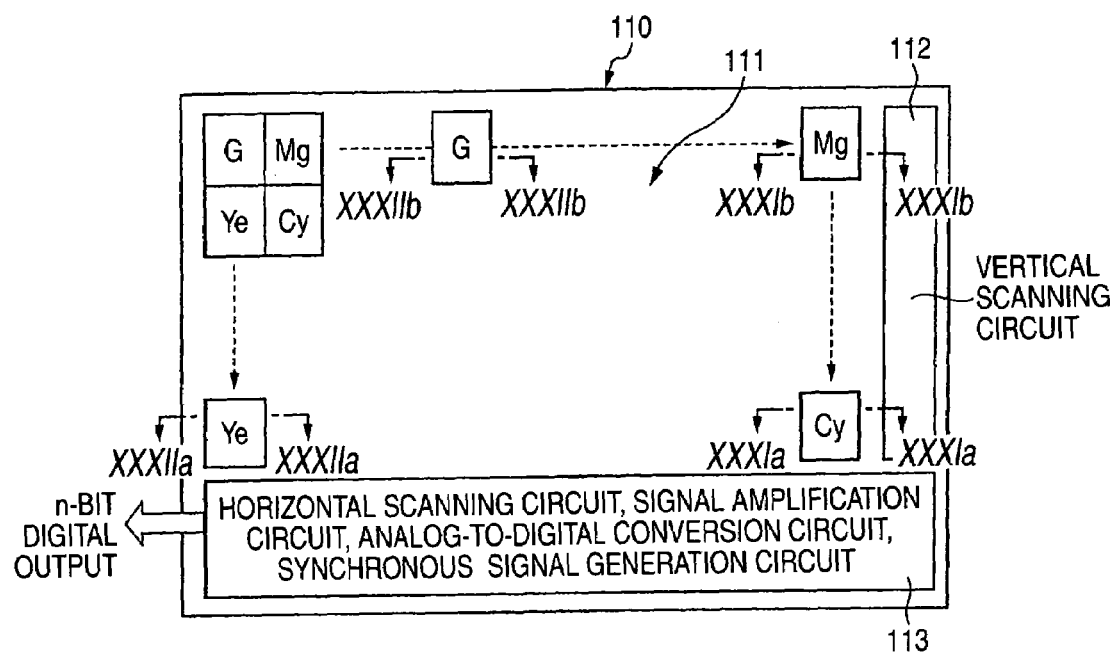
FIG. 30 is a schematic surface view of a CMOS color solid-state image pickup of single plate type according to a sixth embodiment of the invention.

FIG. 30 is a schematic surface view of a CMOS color solid-state image pickup device according to a sixth embodiment of the invention. This CMOS color solid-state image pickup device is fabricated on the surface of an n-type semiconductor substrate 110 and comprises a light-receiving area 111; a vertical scanning circuit 112 formed beside the light-receiving area 111; and a horizontal scanning circuit or the like (e.g., a signal amplifier circuit, an analog-to-digital conversion circuit, a synchronous signal generation circuit, or the like) 113 formed at a position close to the bottom side of the semiconductor substrate 110.

In this embodiment, a plurality of light-receiving sections, which will be described later, are arranged and formed in a two-dimensional array or a square grid pattern within the light-receiving area 111, and mono color filters are stacked on top of the respective light-receiving sections. Color filters of a complementary color system; that is, cyan (Cy), yellow (Ye), magenta (Mg), and green (G) color filters, are used as the color filters. The G filters and the Mg filters are alternately arranged in odd rows, and the Ye filter and the Cy filter are alternately arranged in even rows. This color filter arrangement is generally called a color difference sequential arrangement. The arrangement can also be embodied by combination of three color filters Ye, Cy, and Mg which do not include the G filters. The case of four color filters will now be described.

Figure 31A:
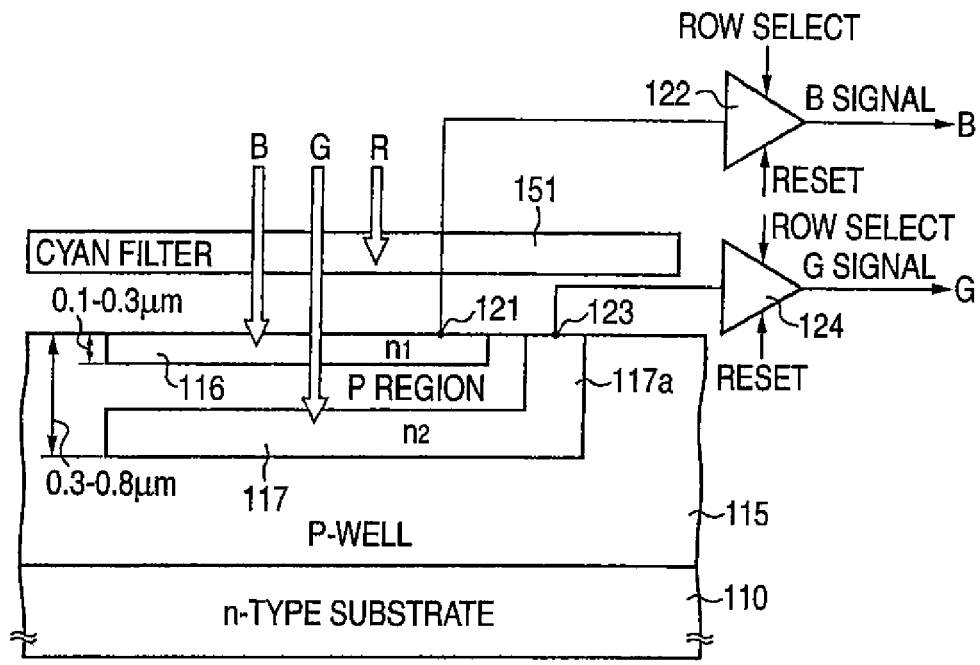
FIG. 31A is a cross-sectional view taken along line XXXIa-XXXIa shown in FIG. 30.
Figure 31B:
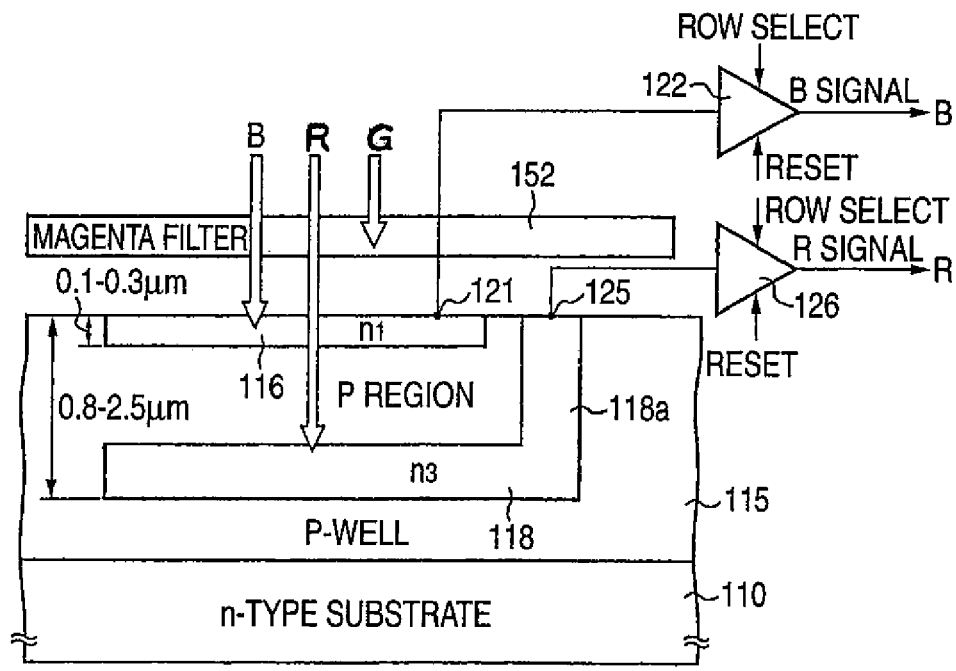
FIG. 31B is a cross-sectional view take along line XXXIb-XXXIb shown in FIG. 30.
Figure 32A:
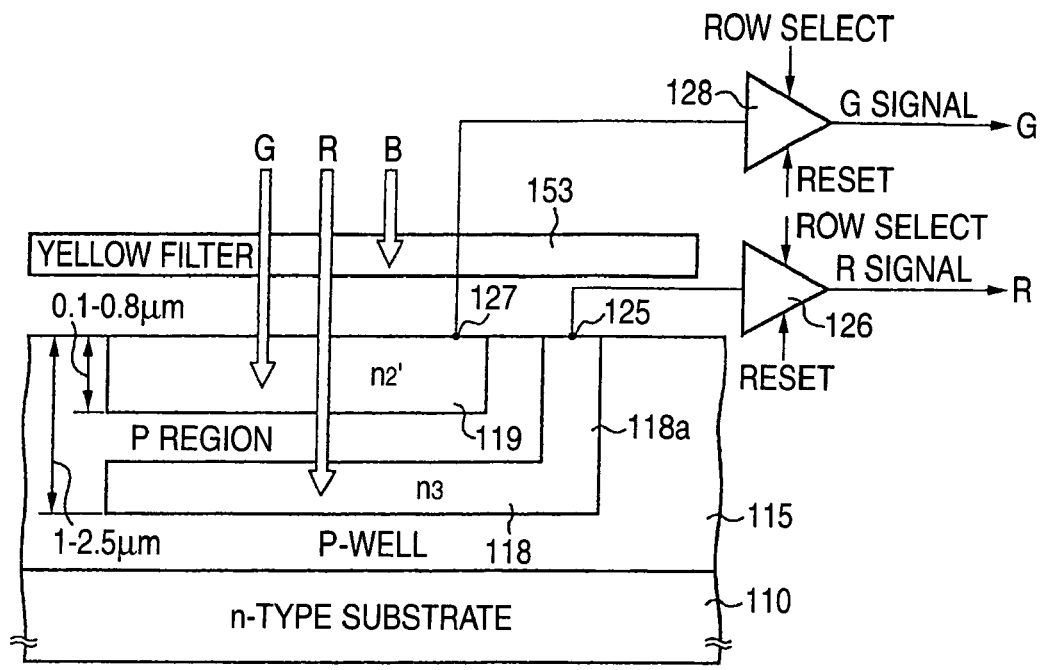
FIG. 32A is a cross-sectional view taken along line XXXIIa-XXXIIa a shown in FIG. 30.
Figure 32B:
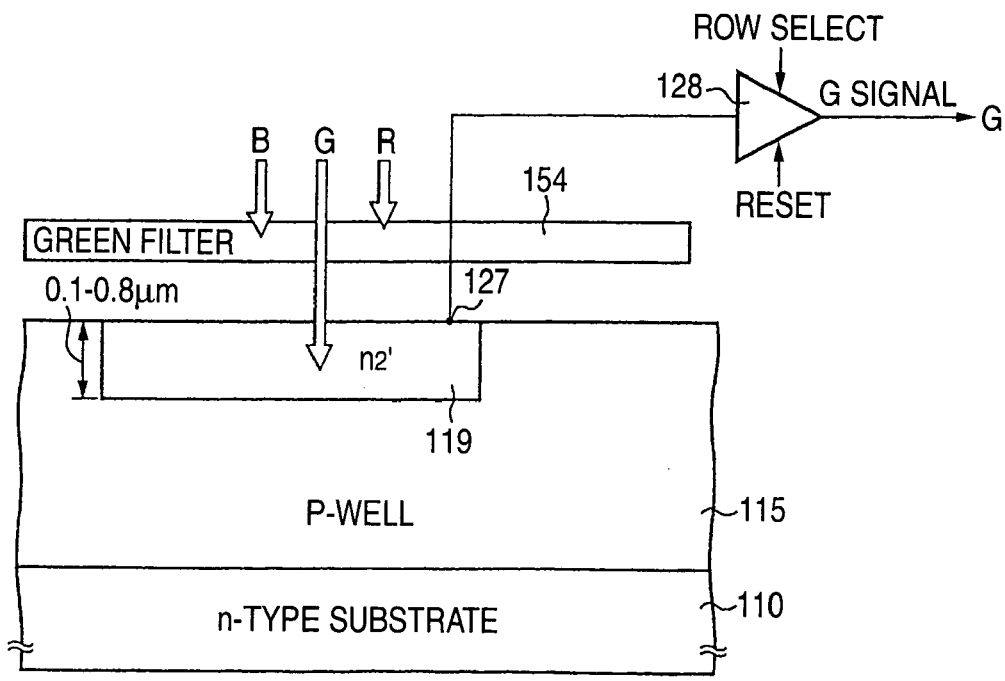
FIG. 32B is a cross-sectional view take along line XXXIIb-XXXIIb shown in FIG. 30.

FIG. 31A is a cross-sectional block diagram taken along ///line XXXIa-XXXIa shown in FIG. 30, i.e., a cross-sectional block diagram of a light-receiving section with a Cy filter 151 stacked thereon; and FIG. 31B is a cross-sectional block diagram taken along line XXXIb-XXXIb shown in FIG. 30, i.e., a cross-sectional block diagram of a light-receiving section with an Mg filter 152 stacked thereon. Similarly, FIG. 32A is a cross-sectional block diagram taken along line XXXIIa-XXXIIa shown in FIG. 30, i.e., a cross-sectional block diagram of a light-receiving section with a Ye filter 153 stacked thereon; and FIG. 32B is a cross-sectional block diagram taken along line XXXIIb-XXXIIb shown in FIG. 30, i.e., a cross-sectional block diagram of a light-receiving section with a G filter 154 stacked thereon.

As shown in FIG. 31A, the light-receiving section with the Cy (cyan) filter 151 stacked thereon blocks only a red (R) light component of the incident light, whereupon B (blue) and G (green) light components reach the light-receiving section. In this light-receiving section, a P well layer 115 is formed on the surface of an n-type semiconductor substrate 110, and an $N^+$ layer (n1) 116 (color signal detecting layer) having a depth of 0.1 to 0.3 µm is formed in the surface within the P well layer 115. An $N^+$ layer (n2) 117 (color signal detecting layer) having a depth of 0.3 to 0.8 µm is formed at a slightly deep position within the P well layer 115 so as to be separated from the $N^+$ layer 116. An electric charge path 117a extending up to the surface of the light-receiving section is provided at an end section of the $N^+$ layer 117.

In this embodiment, dopant [phosphorous or arsenic (P or As)] content of the $N^+$ layers 116, 117, and. 117a is set to about $5\times10^{16-17}/cm^3$. The depths of the $N^+$ layers 116, 117 are also dependent on this dopant content.

A P region which is to act as a potential barrier is interposed between the $N^+$ layers 116, 117. The P region is maintained at the same potential as that of the P well layer 115. In order to change the thickness of the potential barrier, the dopant (boron) content ($1\times10^{15-16}/cm^3$) of the P region existing between the $N^+$ layers 116, 117 may be set so as to differ from that ($7\times10^{14-15}/cm^3$) of the P well layer 115.

The $N^+$ layer 116 is connected to a B signal detection amplifier 122 by way of an ohmic contact 121. The electric charge path 117a of the $N^+$ layer 117 is connected to a G signal detection amplifier 124 by way of an ohmic contact 123. In order to establish the superior ohmic contacts 121, 123, the dopant content of contact portions of the $N^+$ layers 116, 117a is set to $1\times10^{19}/cm^3$ or higher.

By means of the cross-sectional structure of this light-receiving section, a reset transistor is activated before photographing a color image. A predetermined amount of electric charges are stored in PN junction sections of the respective $N^+$ layers 116, 117. The electric charges stored in the PN junction section of the $N^+$ layer 116 are discharged by an amount corresponding to the photocarriers produced in correspondence to the quantity of B (blue) incident light of the incident light arrived at the light-receiving section. The electric charges stored in the PN junction section of the $N^+$ layer 117 are discharged by an amount corresponding to the photocarriers produced in correspondence to the quantity of G (green) incident light. The amount of changes in the electric charges stored in the respective PN junctions of the respective $N^+$ layers 116, 117 are independently read by amplifiers 122, 124 as B and C signals.

As shown in FIG. 31B, the light-receiving section with the Mg (magenta) filter 152 stacked thereon blocks only a green (G) light component of the incident light, whereupon B (blue) and R (red) light components reach the light-receiving section. In this light-receiving section, the $N^+$ layer (n1) 116 that is the same as that described by reference to FIG. 31A is formed in the P well layer 115 formed in the surface of the n-type semiconductor substrate 110. An $N^+$ layer (n3) 118 (color signal detecting layer) having a depth of 0.8 to 2.5 μm is formed at a deeper position within the P well layer 115 so as to be separated from the $N^+$ layer 116. An electric charge path 118a extending up to the surface of the light-receiving section is provided at an end section of the $N^+$ layer 118.

The $N^+$ layer 116 is connected to the amplifier 122 by way of the ohmic contact 121. The electric charge path 118a is connected to an R signal detection amplifier 126 by way of an ohmic contact 125. The dopant content of the P region located between the $N^+$ layers 116, 118 may be set so as to differ from that of the P well layer 115 in the same manner as that described by reference to FIG. 31A. The dopant content of the $N^+$ layers 116, 118, and 118a and the dopant content of the ohmic contact sections are the same as those described by reference to FIG. 31A. The dopant content also applies to the following descriptions.

By means of the cross-sectional structure of this light-receiving section, the reset transistor is activated before photographing a color image, whereby a predetermined amount of electric charges are stored in PN junction sections of the respective $N^+$ layers 116, 118. The electric charges stored in the PN junction section of the $N^+$ layer 116 are discharged by an amount corresponding to the photocarriers produced in correspondence to the quantity of B (blue) incident light of the incident light having arrived at the light-receiving section. The electric charges stored in the PN junction section of the $N^+$ layer 118 are discharged by an amount corresponding to the photocarriers produced in correspondence to the quantity of R (red) incident light. The amounts of changes in the electric charges are independently read by amplifiers 122, 126 as B and R signals.

As shown in FIG. 32A, the light-receiving section with the Ye (yellow) filter 153 stacked thereon blocks only the B (blue) light component of the incident light, whereupon the G (green) and R (red) light components arrive at the light-receiving section. In this light-receiving section, the $N^+$ layer (n3) 118 that is the same as that described by reference to FIG. 31B is formed within the P well layer 115 formed on the surface of the n-type semiconductor substrate 110. An $N^+$ layer (n2') 119 (color signal detecting layer) having a depth of 0.1 to 0.8 μm is formed in the surface so as to be separated from the $N^+$ layer 118. A G signal detection amplifier 128 is connected to the $N^+$ layer 119 by way of an ohmic contact 127.

By means of the cross-sectional structure of this light-receiving section, the reset transistor is activated before photographing a color image, whereby a predetermined amount of electric charges are stored in PN junction sections of the respective $N^+$ layers 118, 119. The electric charges stored in the $N^+$ layer 119 are discharged by an amount corresponding to the photocarriers produced in correspondence to the quantity of G (green) incident light of the incident light having arrived at the light-receiving section. The electric charges stored in the $N^+$ layer 118 are discharged by an amount corresponding to the photocarriers produced in correspondence to the quantity of R (red) incident light. Changes in the amounts of electric charges of the respective $N^+$ layers 118, 119 are independently read by amplifiers 126, 128 as R and G signals.

In the embodiment, the $N^+$ layer 119 for detecting a G signal is set to a depth of 0.1 to 0.8 μm. However, as in the case of the $N^+$ layer 117 shown in FIG. 31A; the $N^+$ layer 119 may be formed to a depth ranging from 0.3 to 0.8 μm. However, even in the case of the structure of the $N^+$ layer 119, B (blue) light of the incident light is blocked by the Ye filter. Hence, a change in the amount of electric charges corresponding to the amount of incident light G (green) arises in the $N^+$ layer 119, and hence mixing of B and G colors does not arise.

As shown in FIG. 32B, the light-receiving section with the G (green) filter 154 stacked thereon permits transmission of only the G (green) light component of the incident light, thereby blocking the B (blue) and R (red) light components from arriving at the light-receiving section. In this light-receiving section, the $N^+$ layer (n2') 119 having the same depth as that described by reference to FIG. 32A; that is, a depth of 0.1 to 0.8 μm, is formed in the surface of the P well layer 115 formed on the n-type semiconductor substrate 110. The amplifier 128 for detecting a G signal is connected to the $N^+$ layer 119 by means of the ohmic contact 127.

By means of the cross-sectional structure of such a light-receiving section, the reset transistor is activated before photographing a color image, whereupon a predetermined amount of electric charges are stored in the PN junctions of the respective $N^+$ layers 119. The thus-stored electric charges are discharged by an amount corresponding to the photocarriers produced in correspondence to the quantity of G (green) incident light of the incident light having passed through the G filter. A signal corresponding to the amount of change in electric charges is read as a G signal by the amplifier 128.

Since the light-receiving section reads only the G signal, only one channel consisting of an ohmic contact and peripheral circuits is needed to be provided for the $N^+$ layer 119. Thus, the configuration of the light-receiving section is simplified. The G filter may be formed as a primary color filter. Alternatively, the G filter may be imparted with a filtering characteristic of permitting transmission of only G light superimposing the yellow filter and the cyan filter, both being filters of a complementary color system, one on top of the other.

Figure 33:
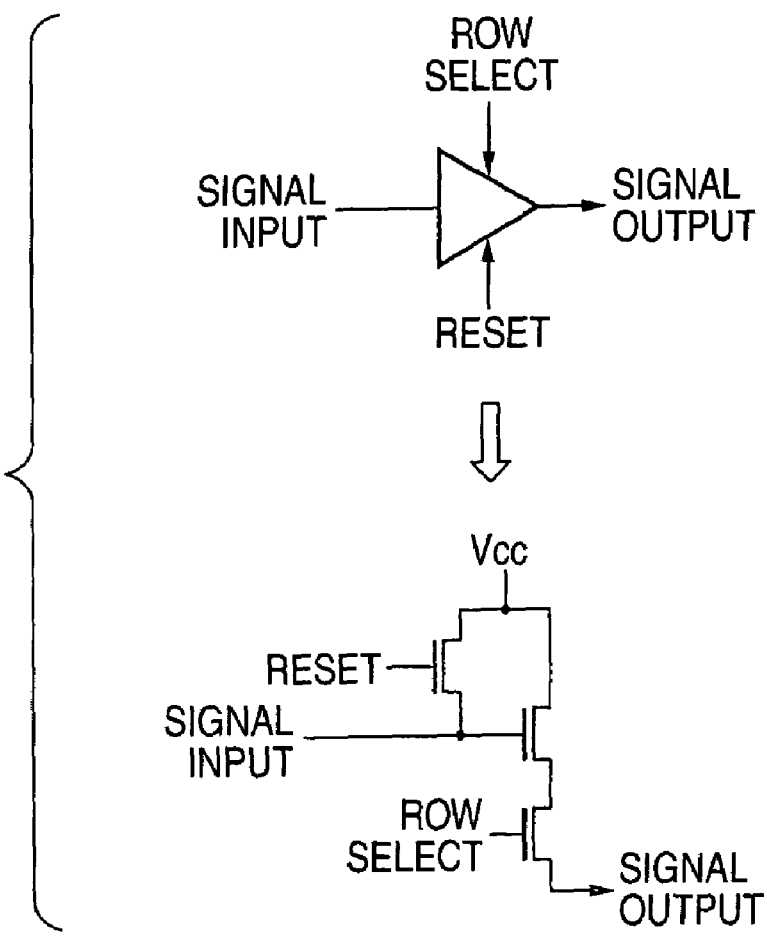
FIG. 33 is an equivalent circuit diagram of amplifiers shown in FIGS. 31A, 31B, 32A, and 32B [i.e., amplifier circuits (source follower amplifiers)]
Figure 34A:
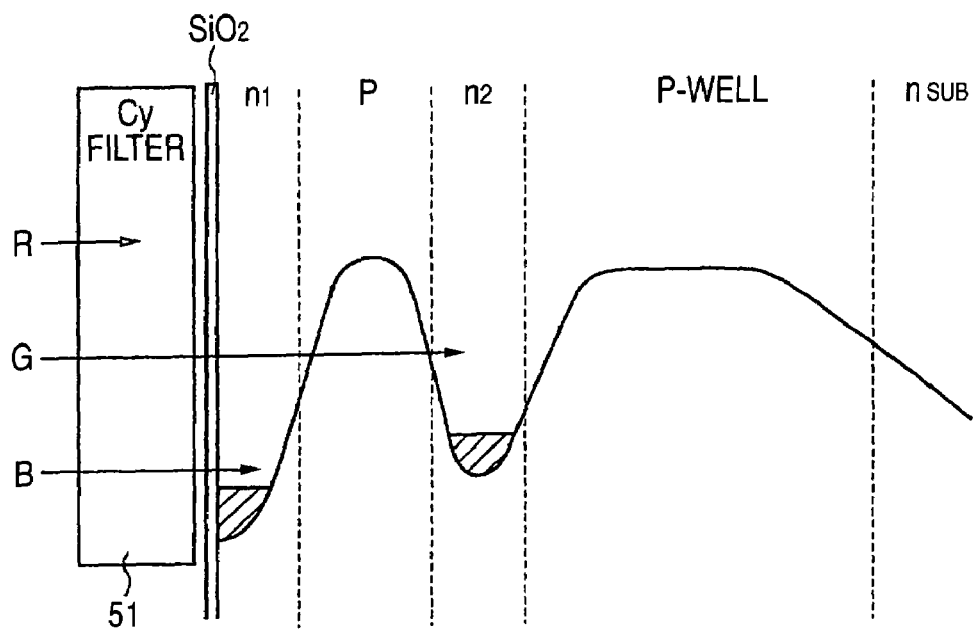
FIG. 34A is a graph showing the potential profile of a light-receiving section with a Cy filter stacked thereon shown in FIG. 30.
Figure 34B:
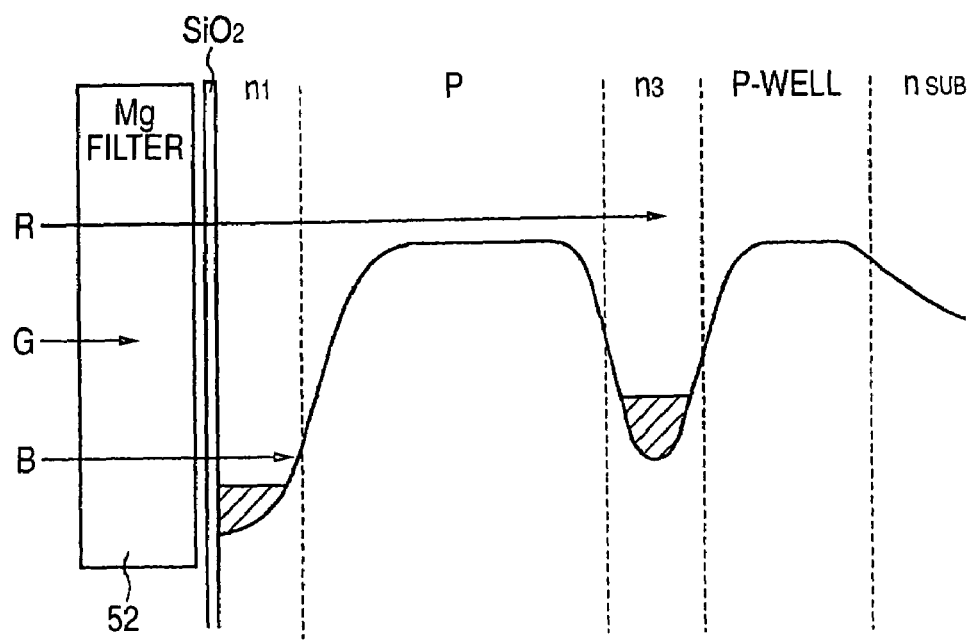
FIG. 34B is a graph showing the potential profile of a light-receiving section with a Mg filter stacked thereon shown in FIG. 30.
Figure 35A:
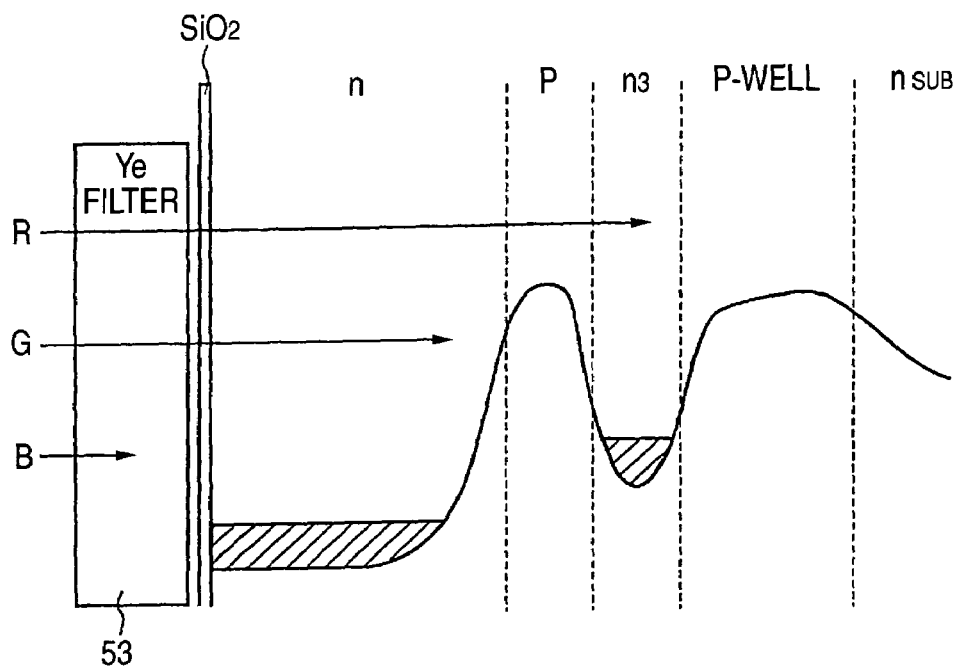
FIG. 35A is a graph showing the potential profile of a light-receiving section with a Ye filter stacked thereon shown in FIG. 30.
Figure 35B:
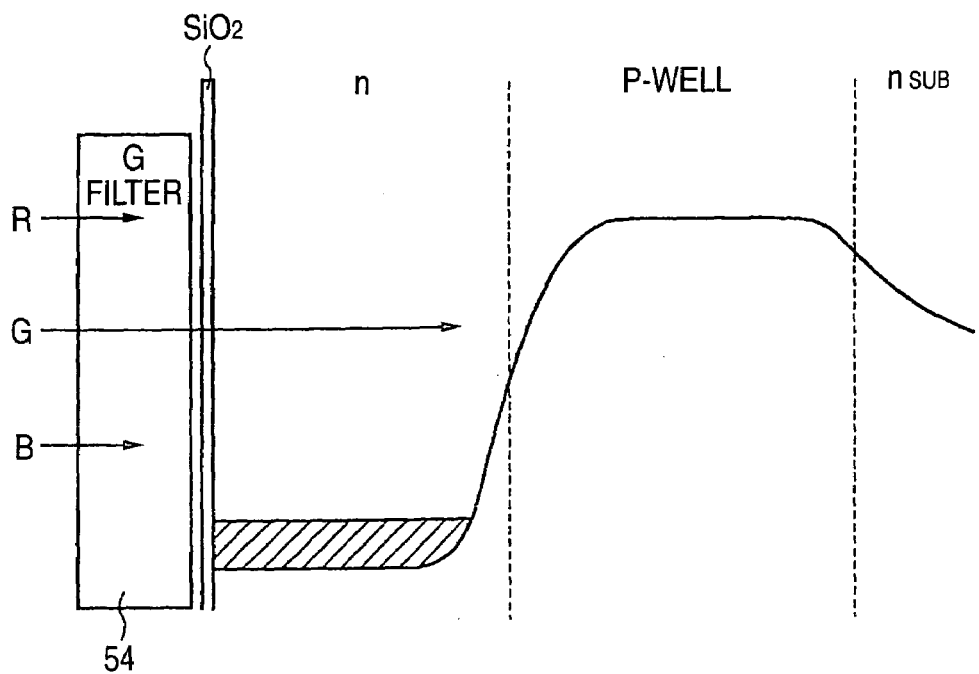
FIG. 35B is a graph showing the potential profile of a light-receiving section with a G filter stacked thereon shown in FIG. 30.
Figure 36A:
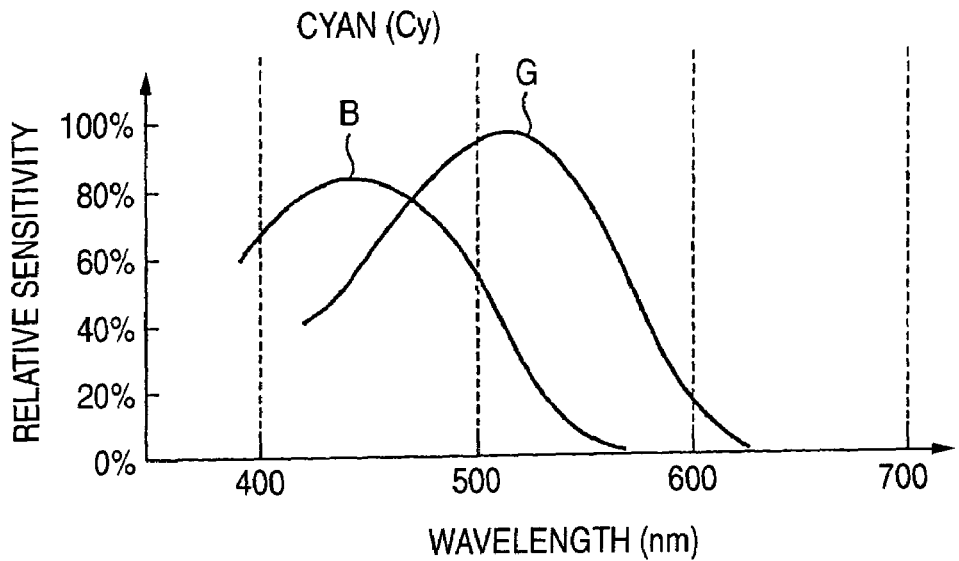
FIG. 36A is a graph showing a spectral characteristic of the light-receiving section with a Cy filter stacked thereon shown in FIG. 30.
Figure 36B:
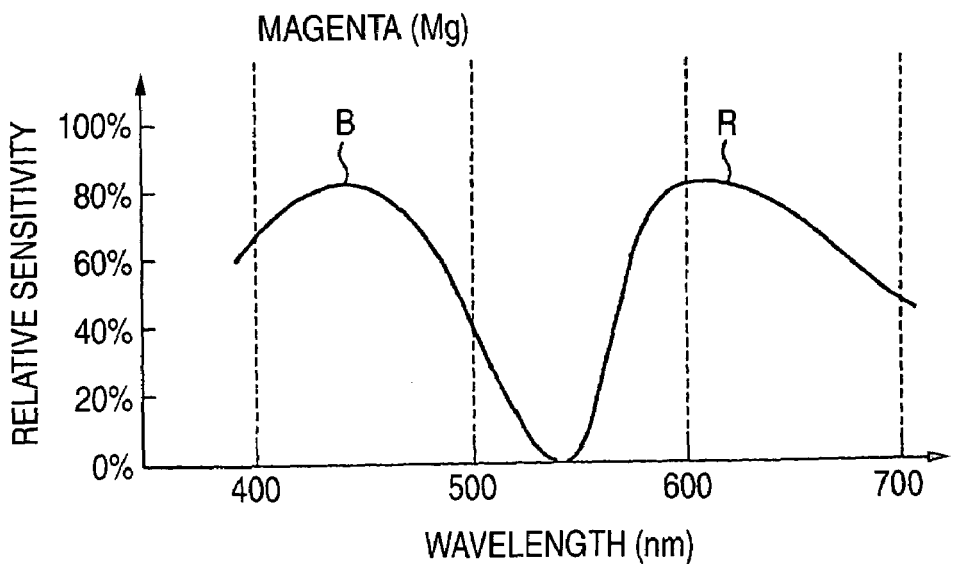
FIG. 36B is a graph showing a spectral characteristic of the light-receiving section with a Mg filter stacked thereon shown in FIG. 30.
Figure 37A:
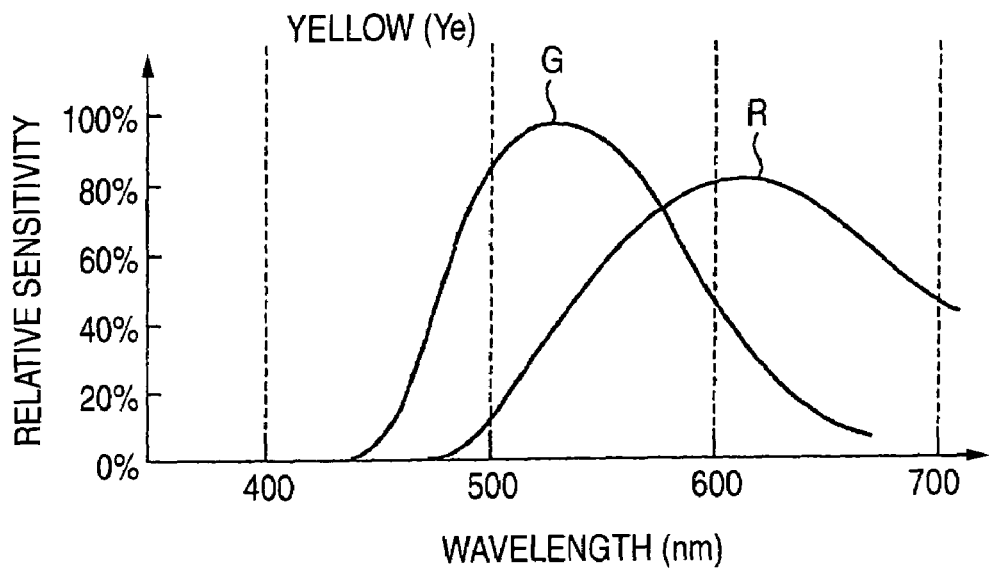
FIG. 37A is a graph showing a spectral characteristic of the light-receiving section with a Ye filter stacked thereon shown in FIG. 30.
Figure 37B:
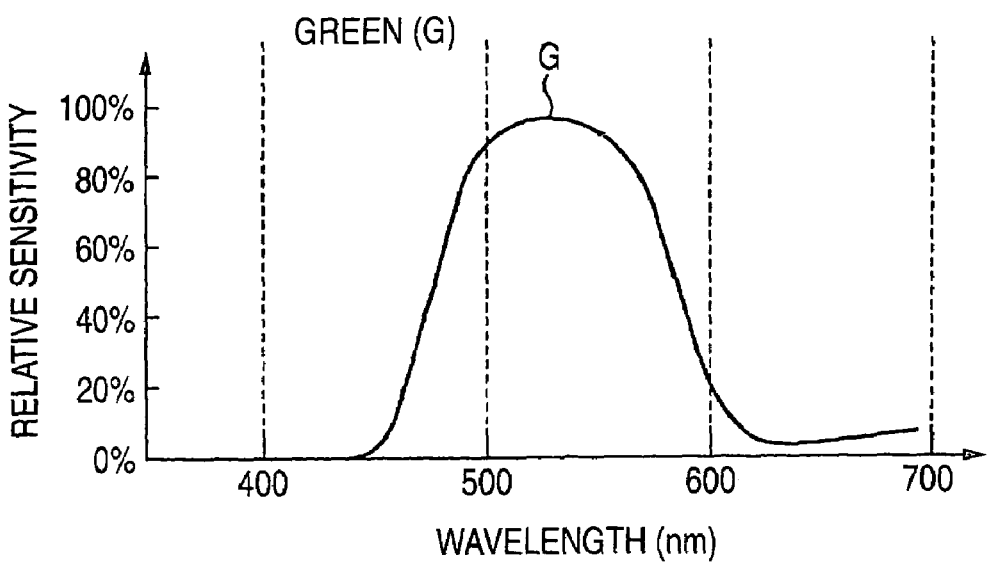
FIG. 37B is a graph showing a spectral characteristic of the light-receiving section with a G filter stacked thereon shown in FIG. 30.

The configurations of the amplifiers 122, 124, 126, and 128 include the equivalent circuits shown in FIG. 33. Although omitted from FIGS. 31 and 32, the topmost surface of the semiconductor substrate other than those occupied by the contact sections is covered with a protective $SiO_2$ film.

FIGS. 34A, 34B and FIGS. 35A, 35B are views showing the relationship between the potential profile of the light-receiving sections of the color solid-state image pickup device of the embodiment—the Cy filter, the Mg filter, the Ye filter, and the G filter are stacked on the light-receiving sections—in the depthwise direction of the substrate and the depth to which incident light enters. In contrast with the related-art CMOS sensor, the light-receiving section of the embodiment with the filters of a complementary color system stacked thereon is characterized by comprising two-stages; that is, an $N^+$ region and a P region interposed between the $N^+$ regions, in the depthwise direction of the substrate. The depths of the respective $N^+$ regions (n1, n2, and n3) change dependent on the stacked filters of a complementary color system.

Specifically, signals of incident light wavelengths which have not been blocked by the filters of a complementary color system and subjected to photoelectric conversion must be read independently. The depths of the impurity layers are determined such that the incident light is subjected to photoelectric conversion most efficiently, whereby a read circuit is connected. The B light having the shortest wavelength is absorbed by the most shallow area of the silicon substrate. Hence, photocarriers are produced in the vicinity of the n1 layer ($N^+$ layer 116). The G light formed from an intermediate wavelength reaches a position deeper than that achieved by the B light. Hence, photocarriers are induced in the vicinity of the n2 layer (N⁺ layer 117) located at an intermediate depth. Similarly, photocarriers are produced by the R light having the shortest wavelength in the vicinity of the n3 layer (N⁺ layer 118) located at the deepest location of the silicon substrate.

In the case of the G light, the B light is blocked by the G filter or the Ye filter. Hence, there is no necessity for dividing the N layer into the n1 layer and the n2 layer. There is set an N⁺ region 119 which is substantially identical in depth with the n2 layer and indicated by n2' layer. In this embodiment, the n1 layer, the n2 layer (n2' layer), and the n3 layer are set in an increasing sequence of depth. The depths of the respective N⁺ layers are set for such that the photoelectric conversion efficiency of the B light, that of the G light, and that of the R light become highest.

FIGS. 36A, 36B and FIGS. 37A, 37B are views showing spectral sensitivity spectra of signals obtained by the light-receiving sections with the Cy filter, the Mg filter, the Ye filter, and the G filter stacked thereon. The horizontal axis shows the wavelength of incident light (nm), and the vertical axis shows relative sensitivity (%) of the output signal.

In each light-receiving section, the wavelength dependence of the output signal is dominated by the spectral transmission factor of the stacked color filter. In the light-receiving section of the color solid-state image pickup device of the embodiment, in which the filter of a complementary color system is stacked on the light-receiving section, there exists a P region, which is to act as a potential barrier existing between the N⁺ layers; that is, a P region sandwiched between the N⁺ layers. Signal charges (i.e., electrons) having developed in the P region are allocated to any of the adjacent N⁺ layers by means of the potential barrier, thereby yielding an advantage of a small overlap existing between spectra.

When compared with a case where electric charges (positive holes) developed in the P region are read directly from the surface of the P region as in the case of the related-art CMOS color solid-state image pickup device described in U.S. Pat. No. 5,965,875, the color solid-state image pickup device of the embodiment yields an advantage of an increase in the performance for separating color signals attributable to use of only signals output from only the two N⁺ layers.

In the light-receiving section with the cyan (Cy) filter stacked thereon, the majority of light of a wavelength corresponding to R is blocked by the Cy filter. Hence, the wavelength dependence of a signal output from the light-receiving section is sharply attenuated in this wavelength range. Accordingly, the B output signal and the G output signal are understood to be unaffected by the light of the R wavelength.

In the light-receiving section with the magenta (Mg) filter stacked thereon, the majority of light of a wavelength corresponding to G is blocked by the Mg filter. Hence, the wavelength dependence of a signal output from the light-receiving section is sharply attenuated in this wavelength range. Accordingly, the B output signal and the R output signal exhibit spectra having no essential overlaps therebetween.

In the light-receiving section with the yellow (Ye) filter stacked thereon, the majority of light of a wavelength corresponding to B is blocked by the Ye filter. Hence, the wavelength dependence of a signal output from the light-receiving section is sharply attenuated in this wavelength range. Accordingly, the G output signal and the R output signal are understood to be unaffected by the light of the B wavelength.

In the light-receiving section with the green (G) filter stacked thereon, the majority of light of wavelengths corresponding to B and R is blocked by the G filter. Hence, the wavelength dependence of a signal output from the light-receiving section is sharply attenuated in this wavelength range. Accordingly, the G output signal is understood to be unaffected by the light of B and R wavelengths and exhibit an ideal spectral characteristic.

Specifically, the light-receiving section with the Cy filter stacked thereon outputs the separated B and G signals involving a little color mixture; the light-receiving section with the Mg filter stacked thereon outputs the separated B and R signals involving a little color mixture; the light-receiving section with the Ye filter stacked there on outputs the separated G and R signals involving a little color mixture; and the light-receiving section with the G filter stacked thereon outputs only the G signal.

Figure 38:
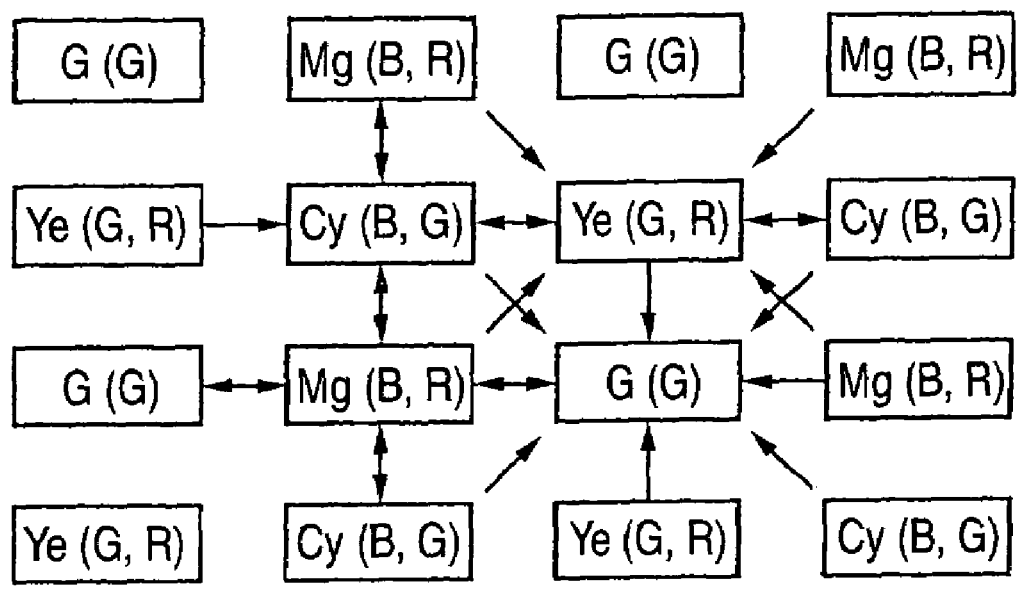
FIG. 38 is a descriptive view reproducing color information by means of obtaining three color signals R, G, and B at the positions of the light-receiving sections with the color filters (Cy, Mg, Ye, G) stacked thereon shown in FIG. 30.

FIG. 38 is a descriptive view for reproducing color information by acquisition of signals of three colors, R, G and B at the positions of the light-receiving sections. As mentioned previously, each light-receiving section of the embodiment is configured to read signals of two primary colors or a signal of one primary color directly from one light-receiving section. Specifically, the R signal component and the B signal component are deficient at the position of the light-receiving section with the G filter stacked thereon. The B signal component is deficient at the position of the light-receiving section with the Ye filter stacked thereon. The R signal component is deficient at the position of the light-receiving section with the Cy filter stacked thereon. The G signal component is deficient at the position of the light-receiving section with the Mg filter stacked thereon.

Therefore, as shown in FIG. 38, the color solid-state image pickup device of the embodiment determines the deficient signal component by subjecting signal components obtained by adjacent light-receiving sections to interpolation processing. A mean value determined by means of adding together four R signal components produced by the light-receiving sections—which are vertically and horizontally adjacent to the light-receiving section of interest—is used as the R signal component deficient at the position of the light-receiving section with the Cy filter stacked thereon.

Similarly, a mean value determined by means of adding together four G signal components produced by the light-receiving sections—which are vertically and horizontally adjacent to the light-receiving section of interest—is used as the G signal component deficient at the position of the light-receiving section with the Mg filter stacked thereon. A mean value determined by means of adding together B signal components produced by the light-receiving sections—which are horizontally or diagonally adjacent to the light-receiving section of interest—and averaging the resultant sum is used as the B signal component deficient at the position of the light-receiving section with the Ye filter stacked thereon. A mean value determined by means of adding together R signal components output from light-receiving sections vertically, horizontally, or diagonally adjacent to the light-receiving section of interest and averaging the resultant sum and a mean value determined by means of adding together B signal components output from light-receiving sections vertically, horizontally, or diagonally adjacent to the light-receiving section of interest and averaging the resultant sum are used as an R signal component and a B signal component, which are deficient at the position of the light-receiving section with the G filter stacked thereon.

The three primary color signals R, G, and B obtained in this manner at the positions of the respective light-receiving sections are processed by an external color signal processing circuit, whereby the color solid-state image pickup device of the embodiment can reproduce colors faithfully.

Figure 39:
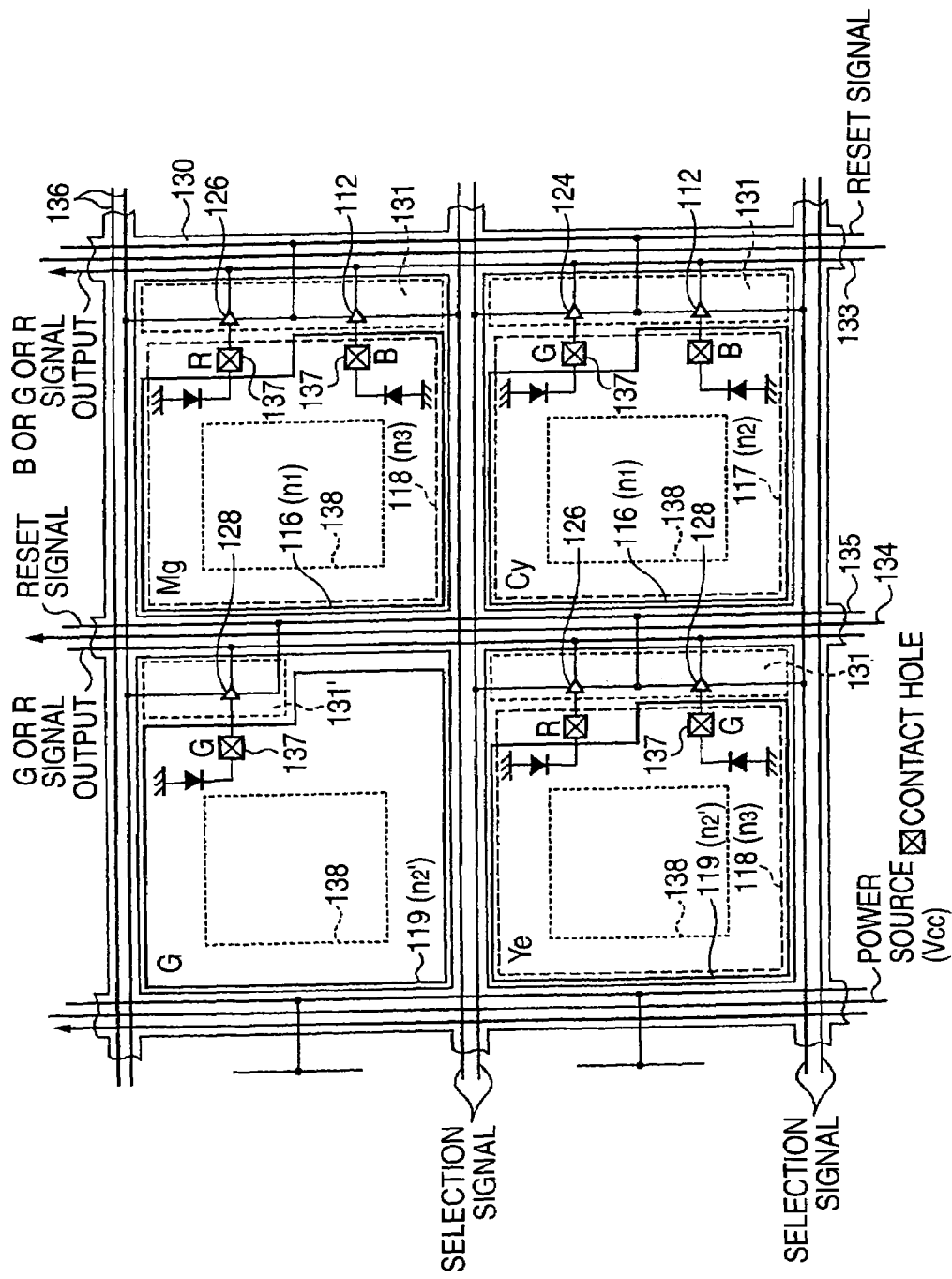
FIG. 39 is a two-dimensional plan view corresponding to four pixels of the light-receiving sections with Cy, Mg, Ye, G filters stacked thereon of the color solid-state image pickup device shown in FIG. 30.

FIG. 39 is a two-dimensional plan view of four pixels of the color solid-state image pickup device of the embodiment (Mg, Cy, Ye, and G). The respective light-receiving sections on the surface of the semiconductor substrate are isolated from each other in a lattice pattern by means of element isolation regions 30 which extends in a crisscrossing manner and is formed by LOCOS processes. In the illustrated embodiment, each light-receiving section assumes the shape of an essential square.

The $N^+$ layers 116, 117, 118, and 119 are formed in the majority of areas of the light-receiving sections. A stripshaped peripheral circuit 131 is provided on the right end of each of the light-receiving sections with the Mg, Ye, and Cy filters of a complementary color system stacked thereon. A peripheral circuit section 131' is provided at only an upper portion of the right end of the light-receiving section with the filter G of a primary color system stacked thereon. The peripheral circuit sections 131, 131' are provided with the previously-described amplifiers (source follower amplifiers) 122 to 128. Color signals are read from the $N^+$ layers connected to the amplifiers via the contact holes 137 formed in the respective light-receiving sections.

In the drawing, a signal output line 133 (signal reading unit), a power line 134, and a reset line 135 are laid on the element isolation regions 130 provided in the vertical direction. Select signal lines 136 are laid on the element isolation regions 130 provided the horizontal direction. The signal output lines 133 are connected to output terminals of the respective amplifiers 122 to 128. A source voltage is applied to the power line 134, and a reset signal is applied to the reset line 133.

The select signal and the reset signal are controlled by the vertical scanning circuit 112 and the horizontal scanning circuit 113 shown in FIG. 30. A rectangular frame 138 which is provided in each light-receiving section and denoted by dotted lines indicates the position of an opening section of the light-shielding film. Light passes through only the inside of the frame, thereby shielding, from light, the peripheral circuit sections 131, 131' and the contact hole 137 located outside the frame. As illustrated, the number of signal lines and peripheral circuits which must be provided in one light-receiving section becomes smaller than that required by the related-art color solid-state image pickup device. Hence, the color solid-state image pickup device of the embodiment enables broadening of the area of the light-receiving sections thereby enabling photographing a bright image.

Figure 40A:
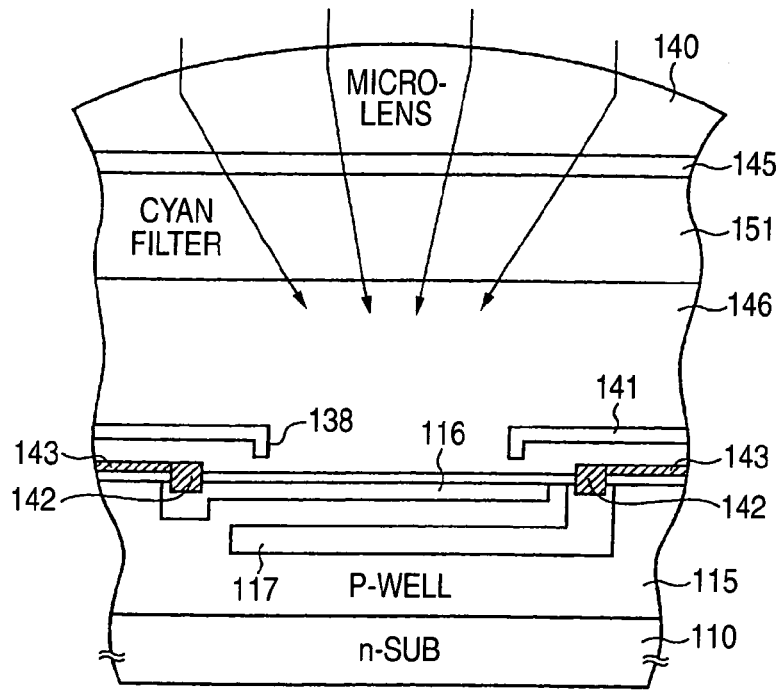
FIG. 40A is a cross-sectional view of the CMOS color solid-state image pickup shown in FIG. 31A on which a microlens, a light-shielding film, or the like are stacked.
Figure 40B:
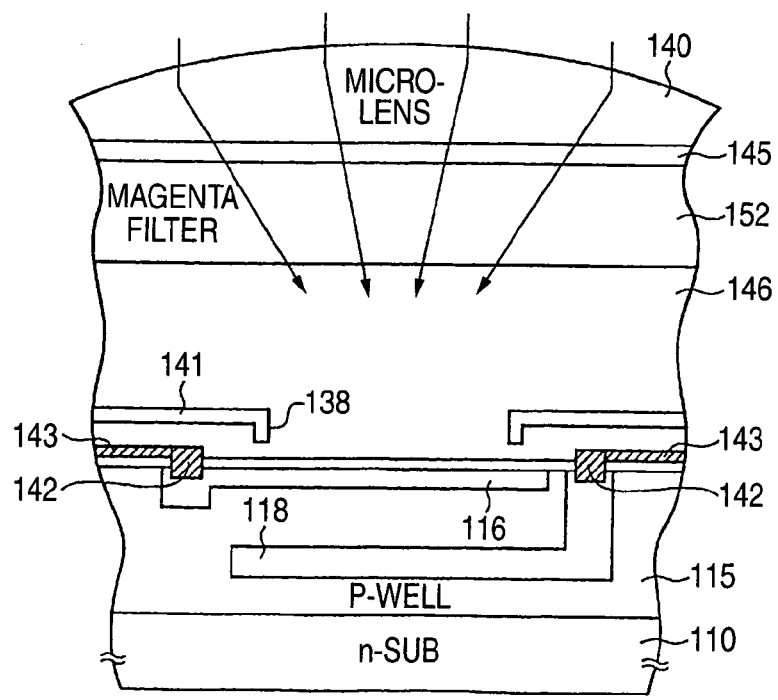
FIG. 40B is a cross-sectional view of the CMOS color solid-state image pickup shown in FIG. 31B on which a microlens, a light-shielding film, or the like are stacked.
Figure 41A:
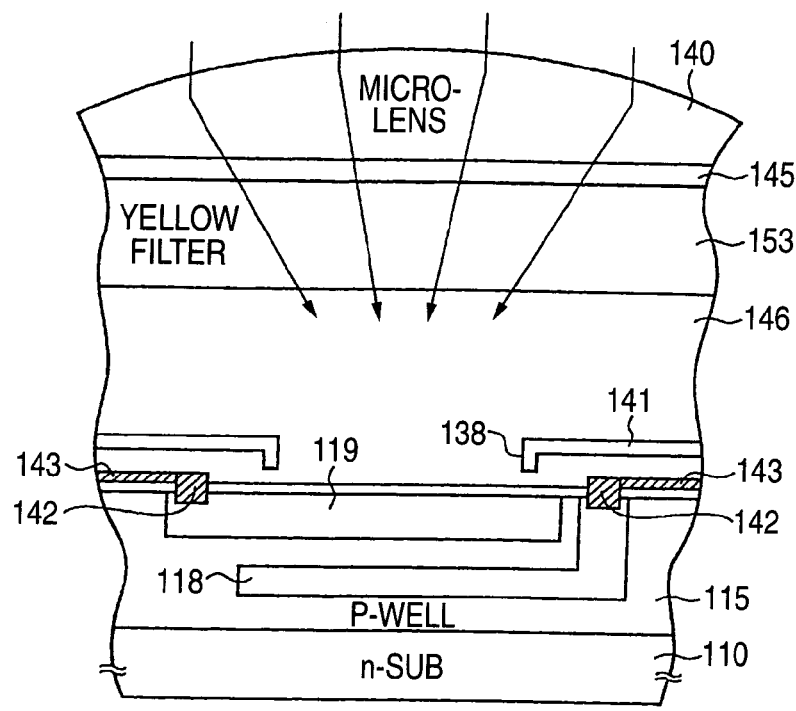
FIG. 41A is a cross-sectional view of the CMOS color solid-state image pickup shown in FIG. 32A on which a microlens, a light-shielding film, or the like are stacked.
Figure 41B:
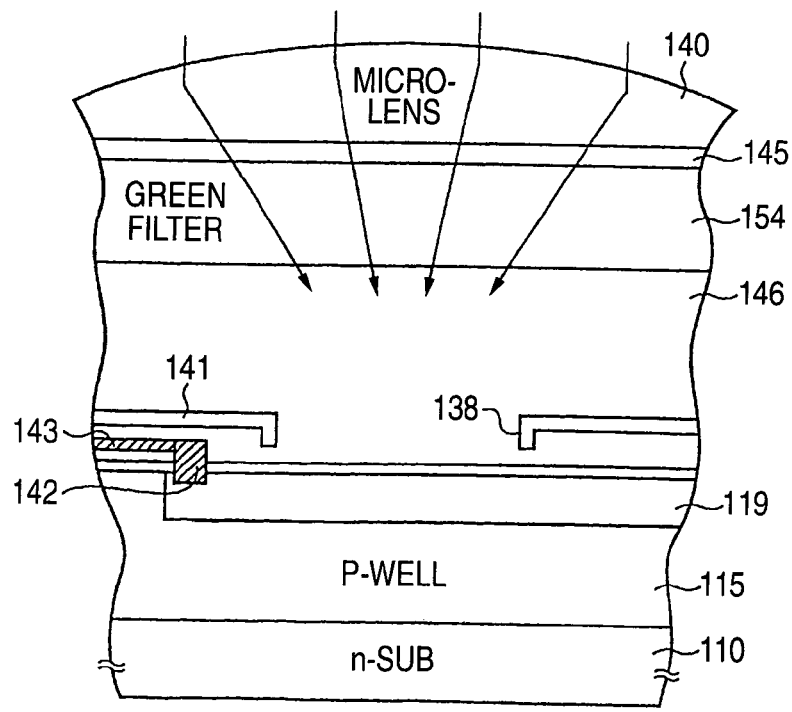
FIG. 41B is a cross-sectional view of the CMOS color solid-state image pickup shown in FIG. 32B on which a microlens, a light-shielding film, or the like are stacked.

FIGS. 40A, 40B are cross-sectional views prepared by adding, to the cross-sectional schematic views shown in FIGS. 31A, 31B, a microlens 140, a light-shielding film 141, a contact section 142 having the contact hole 137, and a metal wiring layer 143 to be connected to the contact section 142. FIGS. 41A, 41B are cross-sectional views prepared by adding, to the cross-sectional schematic views shown in FIGS. 32A, 32B, the microlens 140, the light-shielding film 141, the contact section 142 having the contact hole 137, and the metal wiring layer 143 to be connected to the contact section 142.

The microlenses 140 are formed on the respective color filters 151, 152, 153, and 154 via the transparent planarized film 145. A transparent planarized film layer 146 is provided between the color filters 151 to 154 and the light-shielding film 141. The transparent planarized film layer 146 also acts as a signal line layer and is provided in a so-called triple-layer structure such that the signal lines 133, 134, 135, and 136 do not come into contact with each other via the interlayer dielectric film (not shown).

The opening section 138 of the light-shielding film 141 is located at substantially the center of the PN junction region serving as a photoelectric conversion section. Peripheral circuit sections, such as the amplifiers 122 to 128, are arranged below the light-shielding film 141. The depth of the most shallow $N^+$ layer 116 is made greater only at the position below the contact section 142. The reason for this is to prevent rupture of the PN junction, which would otherwise be caused by penetration of metal or formation of an alloy between the metal electrode of the contact section 142 and silicon of the substrate. Since this portion is shielded by the light-shielding film 141, no influence is exerted on the wavelength dependence (a spectral characteristic) of the photoelectric conversion characteristic.

SEVENTH EMBODIMENT

Figure 42:
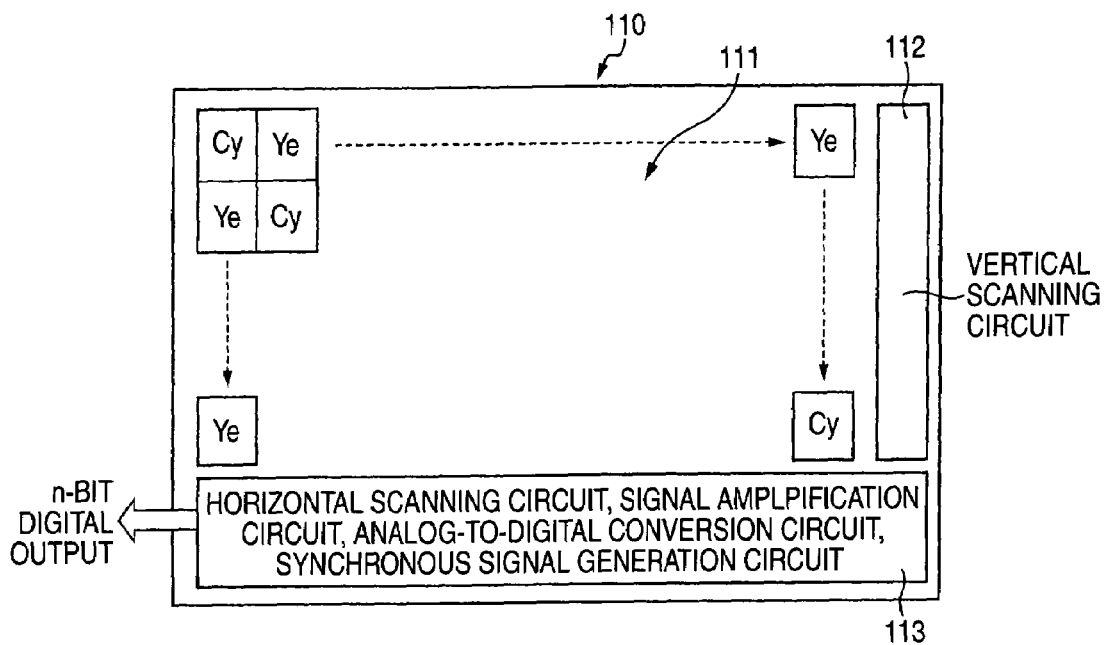
FIG. 42 is a schematic surface view of a CMOS color solid-state image pickup of single plate type according to a seventh embodiment of the invention.

FIG. 42 is a schematic surface view of a CMOS color solid-state image pickup of single plate type according to a seventh embodiment of the invention. A difference between the sixth and seventh embodiments lies only in the arrangement of filters of a complementary color system to be stacked on the light-receiving sections. Only the cyan (Cy) filter and the yellow (Ye) filters are used in this embodiment, and the Cy and Ye filters are alternately arranged in both vertical and horizontal directions.

The cross-sectional structure of the light-receiving section with the Cy filter stacked thereon is identical with that shown in FIG. 31A (or FIG. 40A). The potential profile of the light-receiving section is identical with that shown in FIG. 34A, and the spectrum of the light-receiving section is identical with that shown in FIG. 36A. Of the incident light, the B signal component and the G signal component are output from the light-receiving section with the Cy filter stacked thereon.

The cross section of the light-receiving section with the Ye filter stacked thereon is identical with that shown in FIG. 32A (or FIG. 41A). Further, the potential profile of the light-receiving section is identical with that shown in FIG. 35A, and the spectrum of the light-receiving section is identical with that shown in FIG. 37A. More specifically, of the incident light, the G signal component and the R signal component are output from the light-receiving section with the Ye filter stacked thereon.

Accordingly, in the CMOS color solid-state image pickup device of the embodiment, all the light-receiving sections output the G signal component. The R signal component becomes deficient at the position of the light-receiving section with the Cy filter stacked thereon. The B signal component becomes deficient at the position of the light-receiving section with the Ye filter stacked thereon.

Figure 43:
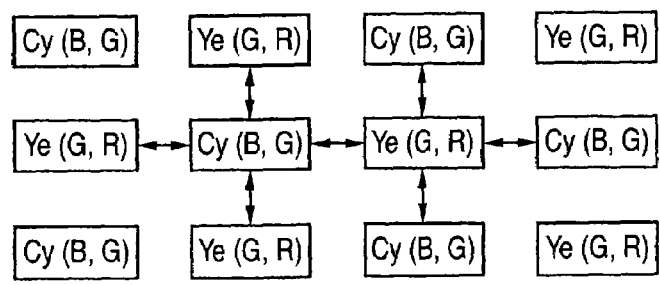
FIG. 43 is a descriptive view reproducing color information by means of obtaining three color signals R, G, and B at the positions of the light-receiving sections with the color filters (Cy, Ye) stacked thereon shown in FIG. 42.

Reading of a color signal from each light-receiving section is performed twice, and primary color components of two colors are independently obtained from one light-receiving section. Subsequently, as shown in FIG. 43, one deficient signal component is determined by means of adding together four signal components output from vertically and horizontally adjacent four light-receiving components and averaging the resultant sum. As a result, faithful color reproduction can be performed by means of an external color signal processing circuit.

Figure 44:
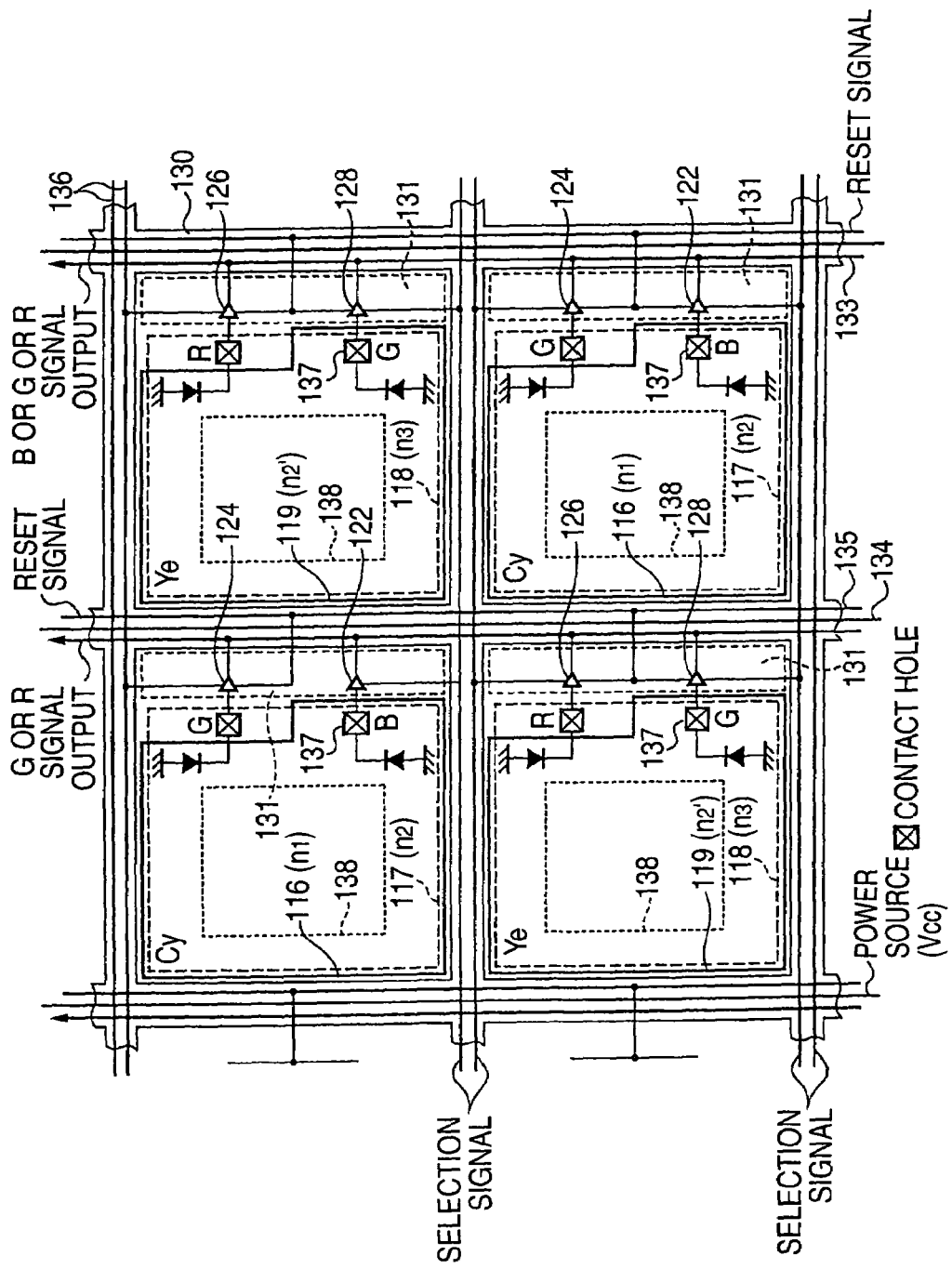
FIG. 44 is a two-dimensional plan view corresponding to four pixels of the light-receiving sections with Cy, Ye filters stacked thereon of the color solid-state image pickup device shown in FIG. 42.

FIG. 44 is analogous to FIG. 39; that is, a two-dimensional plan view corresponding to four pixels (Ye×2, Cy×2) of a CMOS color solid-state image pickup device according to a seventh embodiment of the invention. Primary color signals of two colors can be read from all the pixels (light-receiving sections) with the complementary color filters Ye or Cy stacked thereon. Hence, two channels of read signal amplification circuits (i.e., 122, 124 and 126, 128) are provided.

The present embodiment requires only two types of color filters. When compared with the conventional case where three or four types of color filter are used, the number of color filters used is reduced, thereby yielding an advantage of easy manufacture. Since the G signal can be obtained directly from all the light-receiving sections, the G signal is subjected to signal processing as a luminance signal. As a result, the resolution of a photographed image can enhanced.

EIGHTH EMBODIMENT

Figure 45:
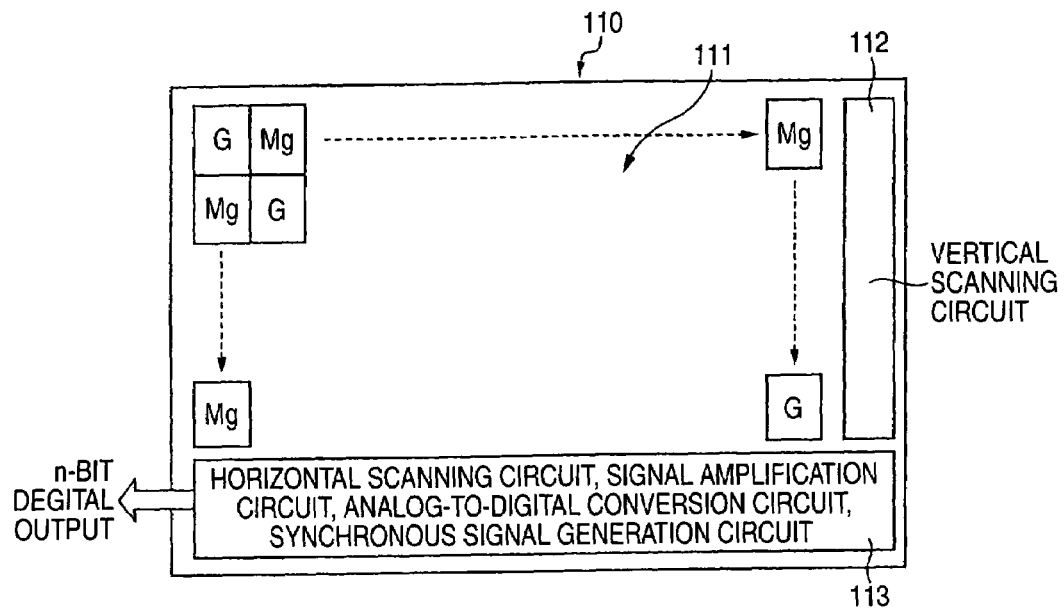
FIG. 45 is a schematic surface view of a CMOS color solid-state image pickup of single plate type according to an eighth embodiment of the invention.

FIG. 45 is a schematic surface view of a CMOS color solid-state image pickup of single plate type according to an eight embodiment of the invention. A difference between the eight embodiment and the sixth and seventh embodiments lies only in the arrangement of color filters to be stacked on the light-receiving sections. Only the magenta (Mg) filter of a complementary color system and the green (G) filter of a primary color system are used in this embodiment, and the Mg and G filters are alternately arranged in both vertical and horizontal directions.

The cross-sectional structure of the light-receiving section with the Mg filter stacked thereon is identical with that shown in FIG. 31B (or FIG. 40B). The potential profile of the light-receiving section is identical with that shown in FIG. 34B, and the spectrum of the light-receiving section is identical with that shown in FIG. 36B. Of the incident light, the B signal component and the R signal component are output from the light-receiving section with the Mg filter stacked thereon.

The cross-sectional structure of the light-receiving section with the Ye filter stacked thereon is identical with that shown in FIG. 32B (or FIG. 41B). Further, the potential profile of the light-receiving section is identical with that shown in FIG. 35B, and the spectrum of the light-receiving section is identical with that shown in FIG. 37B. More specifically, of the incident light, only the G signal component is output from the light-receiving section with the G filter stacked thereon. In the embodiment, a G signal component which is unaffected by the B and R light beams is obtained through use of the G filter of a primary color system.

Specifically, in the CMOS color solid-state image pickup device of the embodiment, the light-receiving section with the Mg filter stacked thereon is deficient of the G signal component, and the light-receiving section with the G filter stacked thereon is deficient of the B and R signal components.

Figure 46:
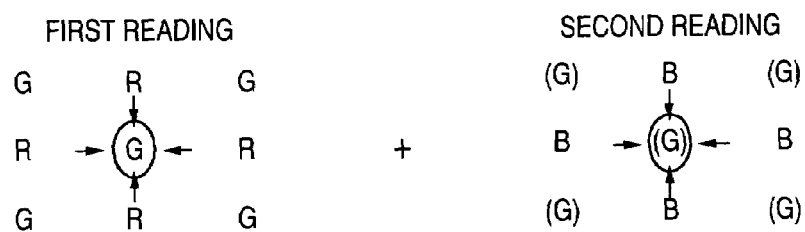
FIG. 46 is a descriptive view reproducing color information by means of obtaining three color signals R, G, and B at the positions of the light-receiving sections with the color filters (Mg, G) stacked thereon shown in FIG. 45.

As shown in FIG. 46, at the position of the light-receiving section with the G filter stacked thereon, color information is reproduced by use of two values. One value is determined by adding together the G signal component directly obtained by means of a first color signal reading operation and the R signal components obtained from the vertically and horizontally adjacent light-receiving sections by the first color signal reading operation and averaging the resultant sum. The other value is determined by adding up the B signal components obtained from the vertically, horizontally adjacent light-receiving sections by means of a second color signal reading operation and averaging the resultant sum. At the position of the light-receiving section with the Mg filter stacked thereon, color information is reproduced through use of a value determined by adding together the directly-obtained B and R signal components and the G signal components obtained from the vertically, horizontally adjacent light-receiving sections.

Figure 47:
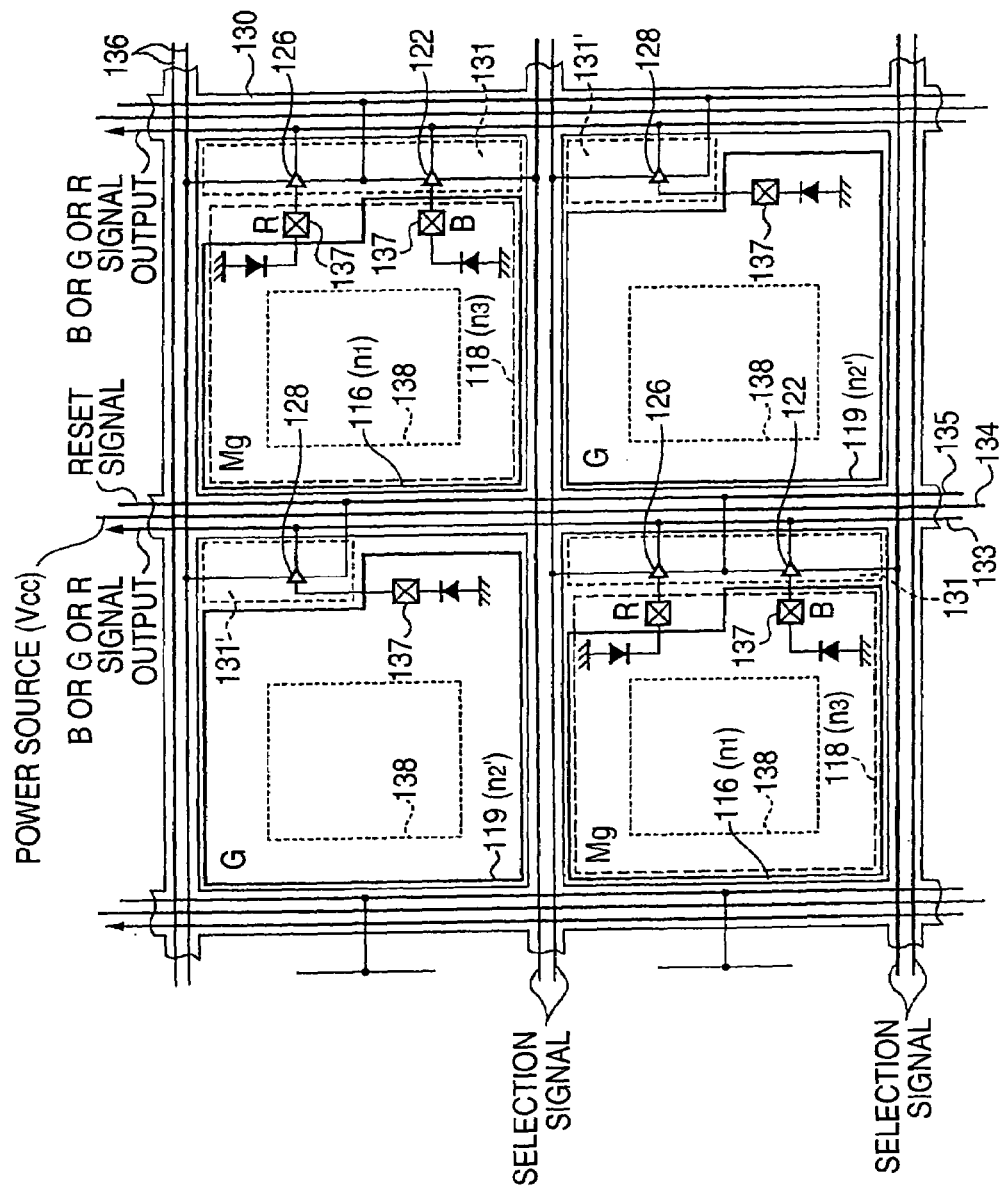
FIG. 47 is a two-dimensional plan view corresponding to four pixels of the light-receiving sections with Mg, G filters stacked thereon of the color solid-state image pickup device shown in FIG. 45.

FIG. 47 is analogous to FIGS. 39 and 44; that is, a two-dimensional plan view corresponding to four pixels (G×2, Mg×2) of a CMOS color solid-state image pickup device according to an eight embodiment of the invention. The internal configuration of the light-receiving section is identical with the light-receiving section having a corresponding color filter shown in FIG. 39.

Figure 48:
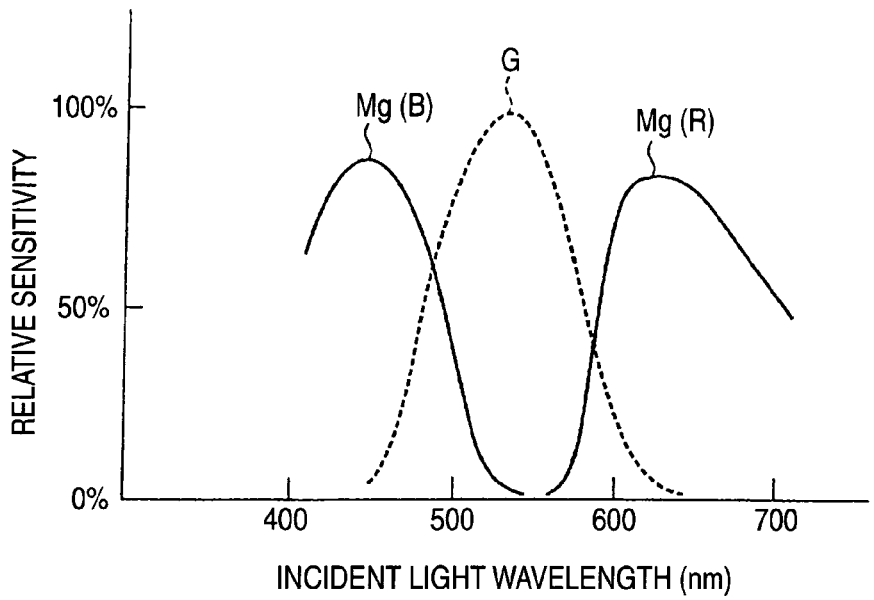
FIG. 48 is a graph showing a spectral characteristic of the color solid-state image pickup device shown in FIG. 45.

FIG. 48 shows spectra of the CMOS color solid-state image pickup device of the embodiment. Basically, the spectra is formed by combination of the spectra shown in FIG. 36B and that shown in FIG. 37B. Characteristics substantially identical with the spectral characteristics of the related-art image sensor using only the primary color filters; that is, faithful color reproduction, can be implemented.

NINTH EMBODIMENT

Figure 49:
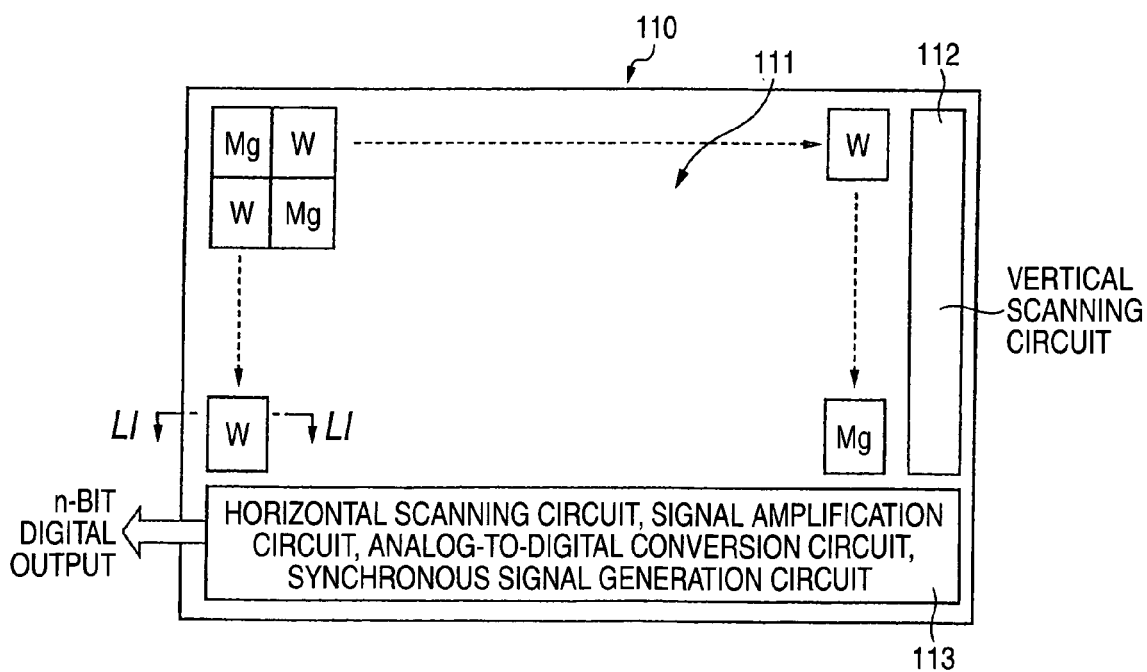
FIG. 49 is a schematic surface view of a CMOS color solid-state image pickup of single plate type according to a ninth embodiment of the invention.

FIG. 49 is a schematic surface view of a CMOS color solid-state image pickup of single plate type according to a ninth embodiment of the invention. A difference between the ninth embodiment and the sixth, seventh, and eighth embodiments lies only in the arrangement of color filters stacked on the light-receiving sections. In the embodiment, the light-receiving sections with the magenta (Mg) filter of a complementary color system stacked thereon and the light-receiving sections with a mere transparent planarized film [hereinafter also called "white filter" (W)] and without use of a color filter are alternately arranged in both the vertical and horizontal directions.

The cross section of the light-receiving section with the Mg filter stacked thereon is identical with that shown in FIG. 31B (or FIG. 40B). The potential profile of the light-receiving section is identical with that shown in FIG. 34B, and the spectrum of the light-receiving section is identical with that shown in FIG. 36B. Of the incident light, the B signal component and the R signal component are output from the light-receiving section with the Mg filter stacked thereon.

A signal including all the B, G, and R signals of the incident light; that is, the luminance signal (Y), is output from the light-receiving sections that do not use any color filters.

In the CMOS color solid-state image pickup device of the embodiment, the light-receiving section with the Mg filter stacked thereon is deficient of the G signal component, and the light-receiving section with the white filter (transparent planarized film) stacked thereon produces only a luminance signal.

Figure 50:
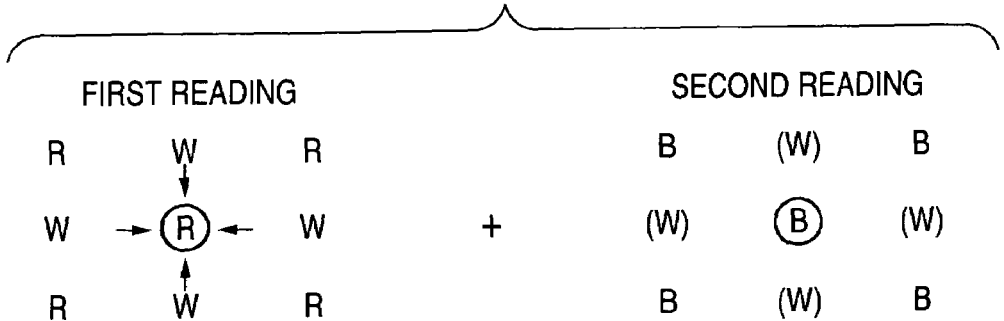
FIG. 50 is a descriptive view reproducing color information by means of obtaining three color signals R, G, and B at the positions of the light-receiving sections with the filters (Mg, W) stacked thereon shown in FIG. 49.

As shown in FIG. 50, at the position of the light-receiving section with the Mg filter stacked thereon, color information is reproduced as follows. Namely, the R signal component directly obtained by means of the first signal reading operation, the B signal component directly obtained by means of the second signal reading operation, and the luminance signal (B+G+R) obtained from the vertically, horizontally adjacent light-receiving sections by the first signal reading operation, and averaging the resultant sum. The directly-obtained R and B signal components are then subtracted from the average, thereby producing a G signal component.

The B signal components obtained from the vertically, horizontally adjacent light-receiving sections are added together, and the resultant sum is then averaged. Further, the R signal components obtained from the vertically, horizontally adjacent light-receiving sections are added together, and the resultant sum is then averaged. The thus-determined mean B and R signal components are subtracted from the directly-obtained luminance signal, thereby preparing a G signal component. At the position of the light-receiving section with the white filter stacked thereon, color information is reproduced through use of the G signal component.

Figure 51:
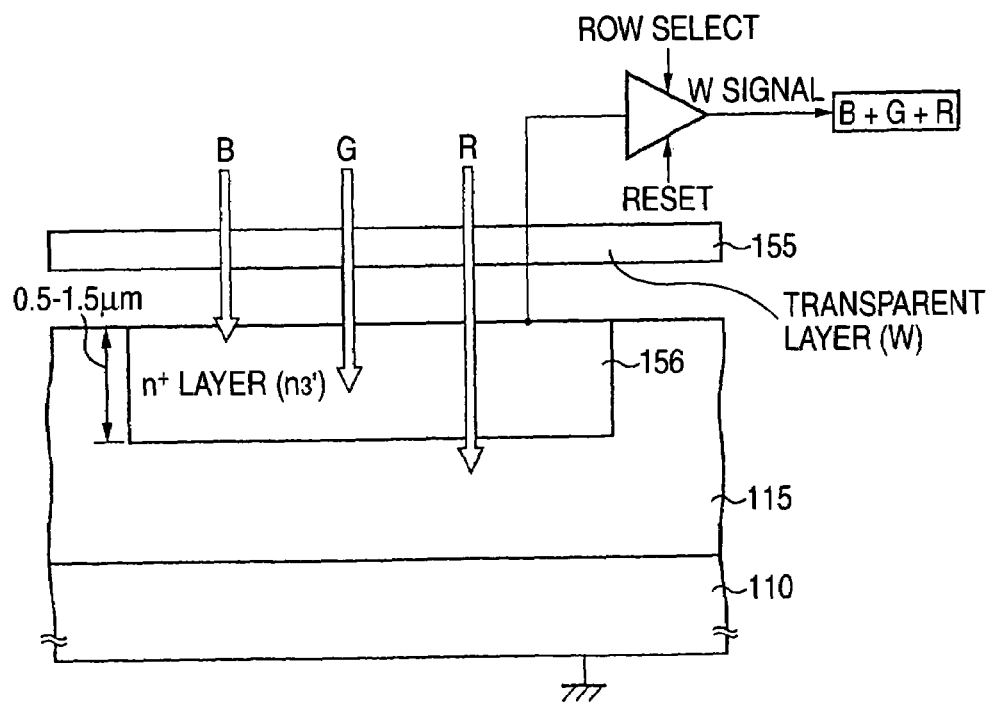
FIG. 51 is a cross-sectional schematic view taken along line LI-LI shown in FIG. 49.
Figure 52:
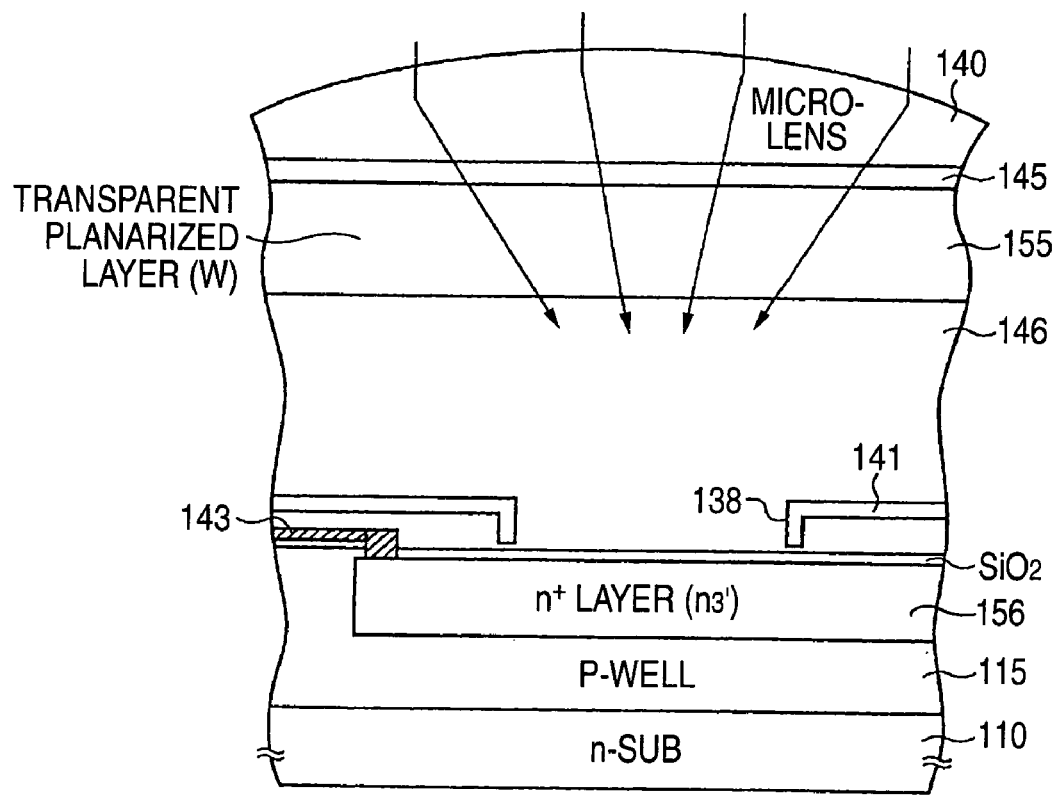
FIG. 52 is a cross-sectional view of the CMOS color solid-state image pickup shown in FIG. 51 on which a microlens, a light-shielding film, or the like are stacked.

FIG. 51 is a cross-sectional schematic view taken along line LI-LI shown in FIG. 49. FIG. 52 is a cross-sectional view showing that the microlens, the light-shielding film, and the transparent planarized film are stacked one on top of the other. Those elements which are the same as those of the sixth embodiment are assigned the same reference numerals, and hence their repeated explanations are omitted.

The $N^+$ layer (n3') 156 (color signal detecting layer) for storing signal electric charges corresponding to the amounts of all incident light beams, that is, the R, G and B light beams, having passed through the transparent planarized film (W) 155 is formed in the surface of the P well 115 provided at a surface portion of the semiconductor substrate 110 to a depth of 0.5 to 1.5 µm.

Figure 53:
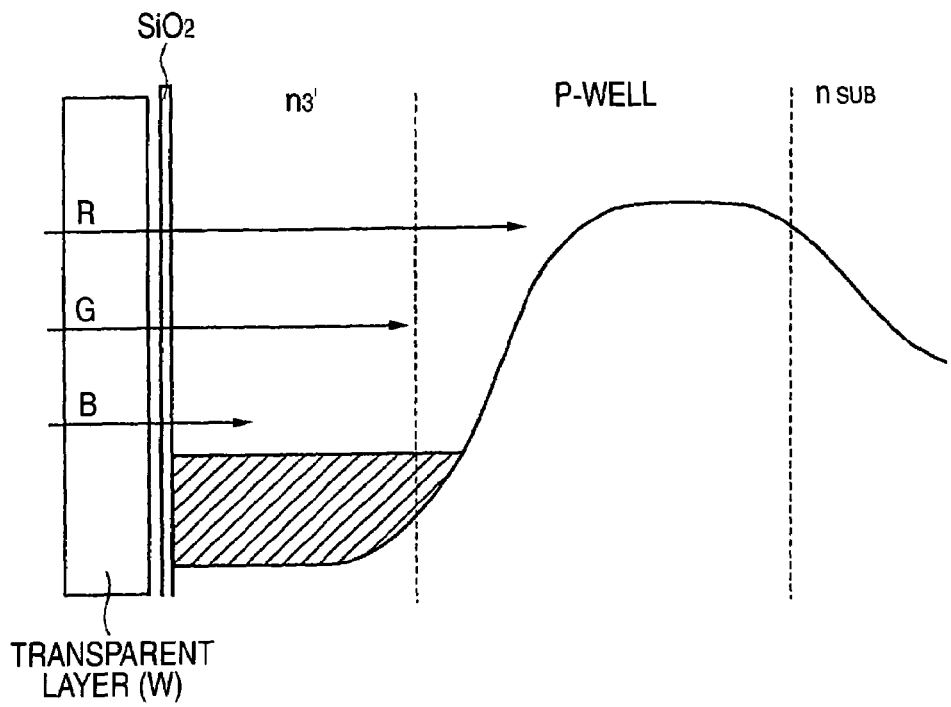
FIG. 53 is a view showing the potential profile of the light-receiving section on which a W filter shown in FIG. 49 is stacked.

FIG. 53 is a view showing a potential profile of the light-receiving section having no color filters. The electric charges produced by the red light that has penetrated to a position deeper than the $N^+$ layer (n3') 156 fall into a well along the potential profile. Hence, even when the depth of the $N^+$ layer (n3') 156 is set to a shallow position on the order of 0.5 µm, a luminance signal including the R signal component cannot be obtained. However, the depth of the $N^+$ layer (n3') 156 is preferably set such that spectral sensitivity close to human visual sensitivity is achieved in the respective R, G, and B wavelengths.

Figure 54:
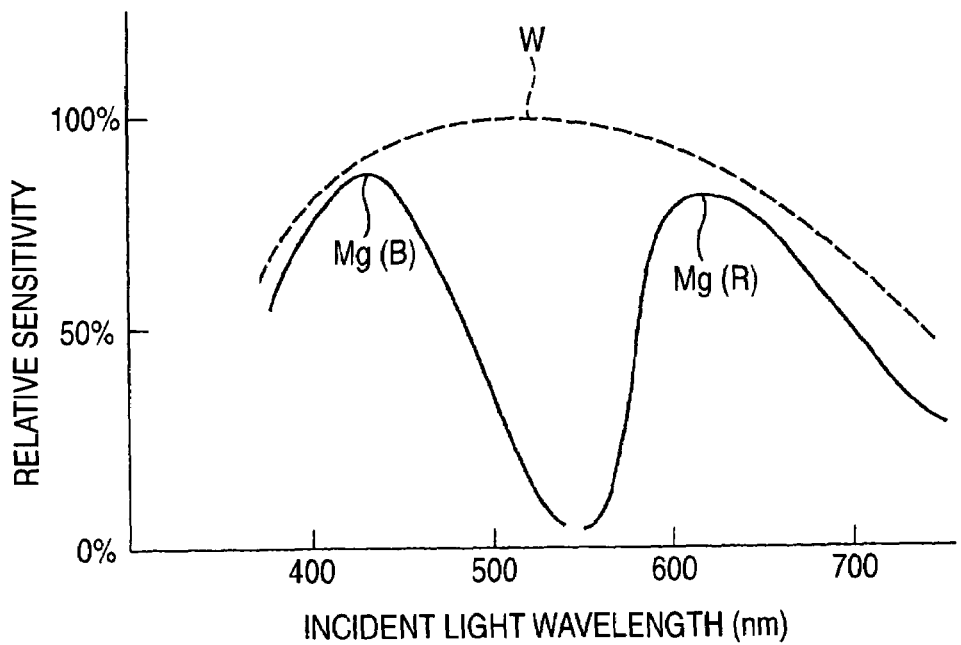
FIG. 54 is a graph showing a spectral characteristic of the CMOS color solid-state image pickup device shown in FIG. 49.
Figure 55:
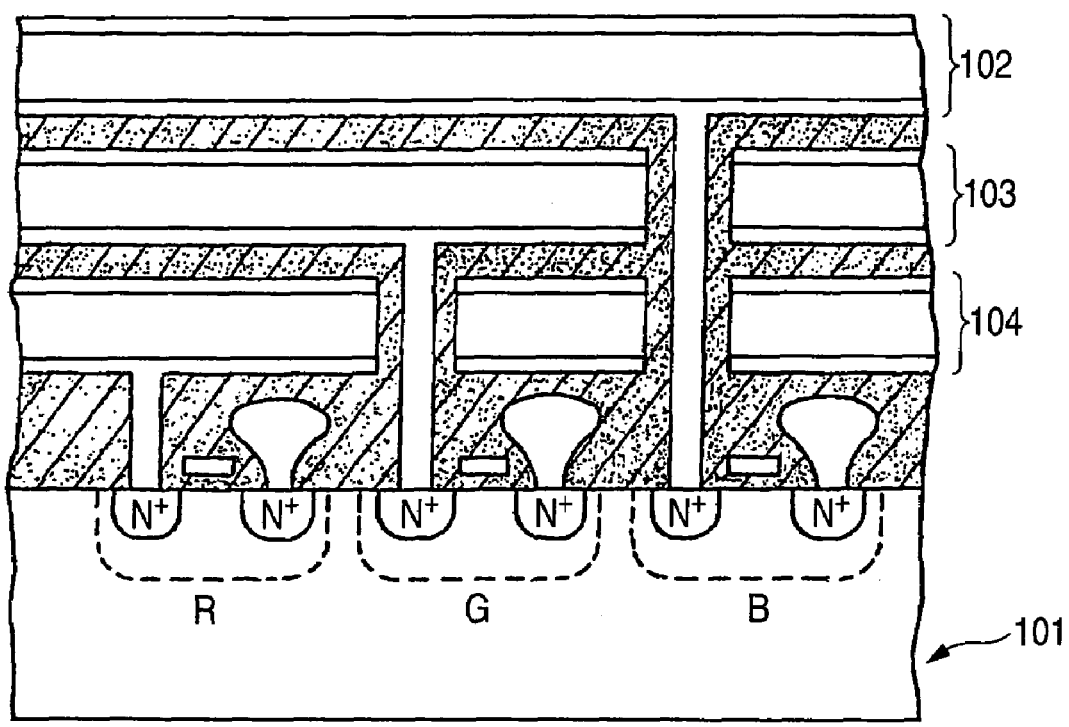
FIG. 55 is a descriptive view of a related-art color solid-state image pickup device.
Figure 56A:
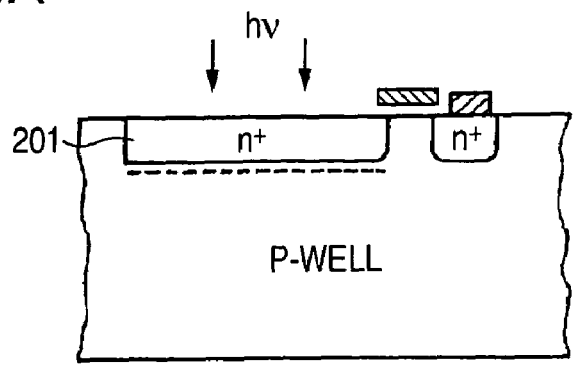
FIGS. 56A to 56C are descriptive views of a related-art color solid-state image pickup device.
Figure 56B:
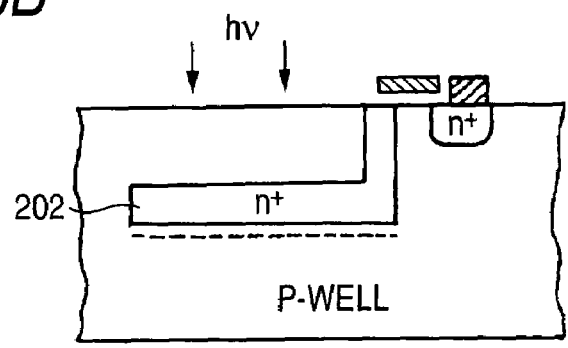
Figure 56C:
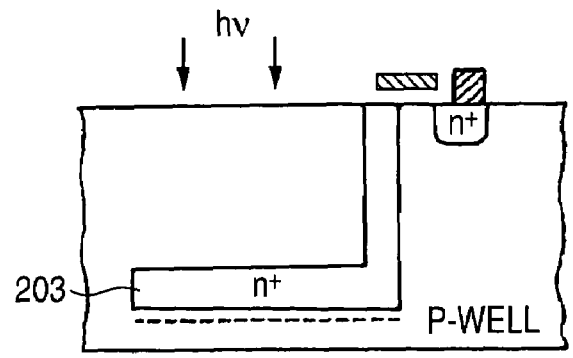

FIG. 54 is a view showing spectral sensitivity spectra of the CMOS color solid-state image pickup device of the embodiment. The B and R signals having passed through the magenta filter Mg are separated from each other without involvement of an overlap. The signal (W) of the light (B+G+R) having passed through the white filter has spectra whose peak appears at the wavelength of the G signal (in the vicinity of 540 nm) including all visible light wavelengths.

In the present embodiment, particularly the light-receiving section corresponding to white (W) can utilize wavelength components of all visible ranges. Hence, there is no substantial loss of the incident light component. When compared with the case where complementary color filters are stacked on all the light-receiving sections as in the case of the first embodiment, an attempt can be made to enhance sensitivity to a much greater extent. Moreover, there is also a characteristic of the ability to directly produce a high-sensitivity luminance signal (R+G+B). In addition, since only the Mg filter is used as a color filter, the process for laminating the color filter becomes easy.

The foregoing embodiments have been described by means of taking the CMOS color solid-state image pickup device as an example of the MOS color solid-state image pickup device. However, the present invention can also be applied to other types of color solid-state image pickup device, such as NMOS and PMOS color solid-state image pickup devices.

The present invention can yield the following advantages:

(1) Since color signal components of two colors can be independently detected from one light-receiving section (pixel), incident light can be effectively converted into an electric signal, and hence enhancement of sensitivity becomes possible.

(2) Since primary color signals can be taken directly out of a solid-state image pickup device using complementary color filters, and hence faithful color reproduction becomes feasible.

(3) Since color filters of a complementary color system are used along with utilization of spectral characteristics of the light-receiving sections in the depthwise direction of the substrate, the amount of an overlap existing between spectra (R, G, and B) becomes smaller. As a result, faithful color reproduction becomes feasible.

What is claimed is:

1. A color solid-state image pickup device comprising:

a plurality of light-receiving sections being arranged on the surface of a semiconductor substrate in a two-dimensional array;

a plurality of complementary color filters, with one complementary color filter stacked on each of at least half of the plurality of light-receiving sections, each complementary color filter blocking incident light of one color of three primary colors, to thereby permit transmission of incident light of remaining two colors of the three primary colors;

at least first and second color signal detecting layers which have the plurality of complementary color filters stacked thereon and are formed so as to be separated in a depthwise direction of the plurality of light-receiving sections, the first signal detecting layer detecting a color signal of one color of the light of two colors having passed through the plurality of complementary color filters, and the second signal detecting layer detecting a color signal of remaining one color of the light of two colors having passed through the plurality of complementary color filters; and a signal reading unit for reading the respective color signals in a distinguished manner, the signal reading unit being connected to the respective color signal detecting layers.

2. A color solid-state image pickup device comprising:

a plurality of light-receiving sections being arranged on the surface of a semiconductor substrate in a two-dimensional array;

complementary color filters which are stacked on all or portions of the plurality of light-receiving sections, each complementary color filter blocking incident light of one color of three primary colors, to thereby permit transmission of incident light of remaining two colors of the three primary colors;

at least first and second color signal detecting layers which have the complementary color filters stacked thereon and are formed so as to be separated in a depthwise direction of the plurality of light-receiving section, the first signal detecting layer detecting a color signal of one color of the light of two colors having passed through the complementary color filters, and the second signal detecting layer detecting a color signal of remaining one color of the light of two colors having passed through the complementary color filters; and a signal reading unit for reading the respective color signals in a distinguished manner, the signal reading unit being connected to the respective color signal detecting layers, wherein a color signal of one color being different from two colors of the three primary colors, the two colors being detected by a first light-receiving section with the complementary color filter stacked thereon, is determined by subjecting, to interpolation processing, at least one detection signal detected by at least one second light-receiving section which is provided around the first light-receiving section and, at least, detects the color signal of the one color being different from the two colors detected by the first light-receiving section.

3. The color solid-state image pickup device according to claim 1, wherein three types of the plurality of light-receiving sections are arranged on the surface of the semiconductor substrate, that is, the light-receiving section on which a yellow filter for blocking blue (B) light is stacked, the light-receiving section on which a cyan filter for blocking red (R) light is stacked, and the light-receiving section on which a magenta filter for blocking green (G) light is stacked.

4. The color solid-state image pickup device according to claim 1, wherein two types of the plurality of light-receiving sections are arranged on the surface of the semiconductor substrate, that is, the light-receiving section wit a yellow filter stacked thereon, and the light-receiving section with a cyan filter stacked thereon.

5. The color solid-state image pickup device according to claim 1, wherein two types of the plurality of light-receiving sections are arranged on the surface of the semiconductor substrate, that is, the light-receiving section with a magenta filter stacked thereon, and the light-receiving section on which a green filter for permitting passage of green (G) light is stacked.

6. The color solid-state image pickup device according to claim 1, wherein two types of the plurality of light-receiving sections are arranged on the surface of the semiconductor substrate, that is, the light-receiving section with a magenta filter stacked thereon, and the light-receiving section on which a transparent planarized film is stacked in place of a color filter.

7. The color solid-state image pickup device according to claim 1, wherein four types of the plurality of light-receiving sections are arranged on the surface of the semiconductor substrate, that is, the light-receiving section with a green filter stacked thereon, the light-receiving section with a yellow filter stacked thereon, the light-receiving section with a magenta filter stacked thereon, and the light-receiving section with a cyan filter stacked thereon.

8. The color solid-state image pickup device according to claim 1, wherein an electric charge path formed from a heavily-doped impurity region, the heavily-doped impurity region extending continuously up to the surface of the semiconductor substrate, is provided in a color signal detecting layer provided in the semiconductor substrate from among the color signal detecting layers.

9. The color solid-state image pickup device according to claim 8, wherein a concentration gradient is set such that a doping level of the color signal detecting layer formed as the heavily-doped impurity region and the doping level of the electric charge path continually connected to the color signal detecting layer increase as the color signal detecting layer and the electric charge path approach the signal reading unit.

10. The color solid-state image pickup device according to claim 1, wherein the depth of the first color signal detecting layer and the depth of the second color signal detecting layer arc set in accordance with respective wavelengths of the light of two colors having passed through the complementary color filters.

11. The color solid-state image pickup device according to claim 1, wherein on-chip light gathering optical systems are provided on upper portions of the respective light-receiving sections, and one opening of each light-shielding film corresponds to each of the plurality of light-receiving sections.

12. The color solid-state image pickup device according to claim 1, wherein the plurality of light-receiving sections are arranged in a square solid pattern on the surface of the semiconductor substrate.

13. The color solid-state image pickup device according to claim 1, wherein the plurality of light-receiving sections are arranged in a honeycomb pattern on the surface of the semiconductor substrate.

14. The color solid-state image pickup device according to claim 1,
wherein the signal reading unit is a vertical transfer path;
wherein the first color signal detecting layer is a first electric charge storage layer which reads, to the vertical transfer path, stored electric charges corresponding to the quantity of incident light from the plurality of light-receiving section, as a first color signal; and
wherein the second color signal detecting layer is a second electric charge storage layer which reads, to the vertical transfer path, stored electric charges corresponding to the quantity of incident light from the plurality of light-receiving section, as a second color signal.

15. The color solid-state image pickup device according to claim 14,
wherein the depth of the first electric charge storage layer and the depth of the second electric charge storage layer are set in accordance with respective wavelengths of the light of two colors having passed through the complementary color filters; and
wherein the depth of the electric charge storage layer for storing electric charges corresponding to the quantity of blue (B) incident light ranges from 0.2 to 0.4 µm; the depth of the electric charge storage layer for storing electric charges corresponding to the quantity of green (G) incident light ranges from 0.4 to 0.8 µm; and the depth of the electric charge storage layer for storing electric charges corresponding to the quantity of red (R) incident light ranges from 0.8 to 2.5 µm.

16. The color solid-state image pickup device according to claim 1, wherein the signal reading unit is a signal line.

17. The color solid-state image pickup device according to claim 16, wherein the plurality of light-receiving sections store electric charges in a PN junction section formed as a result of provision of heavily-doped impurity layers serving as the color signal detecting layers, in the semiconductor substrate; the electric charges are caused to discharge by means of photocarriers produced by the incident light; and the quantity of change in the electric charges, which varies by means of electric discharge, is read as the color signal.

18. The color solid-state image pickup device according to claim 17,
wherein the depth of the first heavily-doped impurity layer and the depth of the second heavily-doped impurity layer are set in accordance with respective wavelengths of the light of two colors having passed through the complementary color filters; and
wherein the depth of the heavily-doped impurity layer for detecting the blue (B) color signal ranges from 0.1 to 0.3 µm; the depth of said heavily-doped impurity layer for detecting the green (G) color signal ranges from 0.3 to 0.8 µm; and the depth of said heavily-doped impurity layer for detecting the red (R) color signal ranges from 0.8 to 2.5 µm.

19. The color solid-state image pickup device according to claim 17, wherein an impurity region which is superimposed on the heavily-doped impurity layer for detecting a blue (B) color signal and establishes ohmic contact between the heavily-doped impurity layer and the signal line is formed deeper than the heavily-doped impurity layer.

20. The color solid-state image pickup device according to claim 1, wherein
one of the plurality of complementary color filters is stacked on each of the plurality of light-receiving sections.

21. The color solid-state image pickup device according to claim 1, wherein
the plurality of light-receiving sections are arranged in square grids, and
the plurality of complementary color filters consist of two different color types of complementary color filters stacked alternatively on the plurality of light-receiving sections, with respect to vertical and horizontal directions.

22. The color solid-state image pickup device according to claim 1, wherein the plurality of complementary color filters consist of two different color types of complementary color filters stacked alternatively on the plurality of light-receiving sections, with respect to vertical and horizontal directions.

23. The color solid-state image pickup device according to claim 1, further comprising a plurality of one color type primary color filters, wherein
   the plurality of light-receiving sections are arranged in square grids,
   the plurality of complementary color filters consist of one color type of complementary color filter, and
   the plurality of one color type complementary color filters and the plurality of one color type primary color filters are stacked alternatively on the plurality of light-receiving sections, with respect to vertical and horizontal directions.

24. The color solid-state image pickup device according to claim 1, further comprising a plurality of one color type primary color filters, wherein
   the plurality of complementary color filters consist of one color type of complementary color filter, and
   the plurality of one color type complementary color filters and the plurality of one color type primary color filters are stacked alternatively on the plurality of light-receiving sections, with respect to vertical and horizontal directions.

25. The color solid-state image pickup device according to claim 1, further comprising a plurality of white filters, wherein
   the plurality of light-receiving sections are arranged in a honeycomb pixel arrangement,
   the plurality of complementary color filters consist of one color type of complementary color filter, and
   the plurality of one color type complementary color filters are stacked on of the plurality of light-receiving sections in even/odd columns and the plurality of white filters are stacked alternatively on the plurality of light-receiving sections in odd/even columns.

26. The color solid-state image pickup device according to claim 1, further comprising a plurality of white filters, wherein
   the plurality of complementary color filters consist of one color type of complementary color filter, and
   the plurality of one color type complementary color filters and the plurality of one color type primary color filters are stacked alternatively on the plurality of light-receiving sections, with respect to vertical and horizontal directions.

27. The color solid-state image pickup device according to claim 1, further comprising a plurality of one color type primary color filters, wherein
   the plurality of light-receiving sections are arranged in square grids,
   the plurality of complementary color filters comprise three different color types of complementary color filters, and
   each light receiving section of each square grid of the plurality of light-receiving sections has a different one of the tree different color types of complementary color filters and the one color type primary color filter stacked thereon.

28. The color solid-state image pickup device according to claim 1, further comprising a plurality of one color type primary color filters, wherein
   the plurality of light-receiving sections are arranged in square grids,
   the plurality of complementary color filters comprise three different color types of complementary color filters, and
   in each square grid, the one color type primary color filter and one color type of complementary color filter are arranged in odd/even rows and the other two color types of complementary color filters are arranged in even/odd rows.

* * * * *